(12) United States Patent
Ware et al.

(10) Patent No.: US 11,341,070 B2
(45) Date of Patent: May 24, 2022

(54) DYNAMIC RANDOM ACCESS MEMORY (DRAM) COMPONENT FOR HIGH-PERFORMANCE, HIGH-CAPACITY REGISTERED MEMORY MODULES

(71) Applicant: Rambus Inc., San Jose, CA (US)

(72) Inventors: Frederick A. Ware, Los Altos Hills, CA (US); Ely Tsern, Los Altos, CA (US); John Eric Linstadt, Palo Alto, CA (US); Thomas J. Giovannini, San Jose, CA (US); Kenneth L. Wright, Sunnyvale, CA (US)

(73) Assignee: Rambus, Inc., San Jose, CA (US)

( * ) Notice: Subject to any disclaimer, the term of this patent is extended or adjusted under 35 U.S.C. 154(b) by 0 days.

(21) Appl. No.: 17/100,560

(22) Filed: Nov. 20, 2020

(65) Prior Publication Data
US 2021/0173800 A1    Jun. 10, 2021

Related U.S. Application Data

(63) Continuation of application No. 16/290,375, filed on Mar. 1, 2019, now Pat. No. 10,846,252, which is a
(Continued)

(51) Int. Cl.
*G06F 13/28* (2006.01)
*G06F 13/16* (2006.01)
(Continued)

(52) U.S. Cl.
CPC ........... *G06F 13/287* (2013.01); *G06F 13/16* (2013.01); *G11C 5/04* (2013.01); *G11C 7/10* (2013.01);
(Continued)

(58) Field of Classification Search
CPC .................. G06F 3/00; G06F 12/00
See application file for complete search history.

(56) References Cited

U.S. PATENT DOCUMENTS 6,636,935 B1    10/2003    Ware et al.
6,742,098 B1    5/2004    Halbert et al.
(Continued)

FOREIGN PATENT DOCUMENTS

CN    101770439 A    7/2010
TW    201106373 A    2/2011

OTHER PUBLICATIONS

"Draft Standard for a High-Speed Memory Interface (SyncLink)," Draft 0.99 IEEE P1596.7-199X, pp. 1-56 (1996), Microprocessor and Microcomputer Standards Subcommittee of the IEEE Computer Society. 66 pages.
(Continued)

*Primary Examiner* — Getente A Yimer
(74) *Attorney, Agent, or Firm* — Lowenstein Sandler LLP

(57) ABSTRACT

The embodiments described herein describe technologies of dynamic random access memory (DRAM) components for high-performance, high-capacity registered memory modules, such as registered dual in-line memory modules (RDIMMs). One DRAM component may include a set of memory cells and steering logic. The steering logic may include a first data interface and a second data interface. The first and second data interfaces are selectively coupled to a controller component in a first mode and the first data interface is selectively coupled to the controller component in a second mode and the second data interface is selectively coupled to a second DRAM component in the second mode.

20 Claims, 33 Drawing Sheets

Related U.S. Application Data continuation of application No. 15/533,630, filed as application No. PCT/US2015/057822 on Oct. 28, 2015, now Pat. No. 10,233,309.

(60) Provisional application No. 62/234,409, filed on Sep. 29, 2015, provisional application No. 62/233,884, filed on Sep. 28, 2015, provisional application No. 62/220,101, filed on Sep. 17, 2015, provisional application No. 62/094,914, filed on Dec. 19, 2014.

(51) Int. Cl.

| | | |
|---|---|---|
| G11C 5/04 | (2006.01) | |
| G11C 7/10 | (2006.01) | |
| G11C 7/22 | (2006.01) | |
| G11C 29/02 | (2006.01) | |
| G11C 5/02 | (2006.01) | |

(52) U.S. Cl.
CPC ........ *G11C 7/1045* (2013.01); *G06F 2213/28* (2013.01)

(56) References Cited

U.S. PATENT DOCUMENTS

| | | |
|---|---|---|
| 6,769,050 B1 | 7/2004 | Ware et al. |
| 6,785,782 B1 | 8/2004 | Ware et al. |
| 6,889,304 B2 | 5/2005 | Perego et al. |
| 6,926,657 B1 | 8/2005 | Reed et al. |
| 7,200,021 B2 | 4/2007 | Raghuram |
| 7,472,220 B2 | 12/2008 | Rajan et al. |
| 7,539,812 B2 | 5/2009 | Tetrick |
| 7,577,789 B2 | 8/2009 | Perego et al. |
| 7,778,042 B2 | 8/2010 | Lee et al. |
| 8,069,379 B2 | 11/2011 | Perego et al. |
| 8,094,504 B2 | 1/2012 | Smolka |
| 8,102,688 B2 | 1/2012 | Chung et al. |
| 8,139,390 B2 | 3/2012 | Oh |
| 8,218,346 B2 | 7/2012 | Baek |
| 8,380,943 B2 | 2/2013 | Shaeffer |
| 8,407,395 B2 | 3/2013 | Kim et al. |
| 8,572,320 B1 | 10/2013 | Maheshwari |
| 8,582,382 B2 | 11/2013 | Oh |
| 8,742,597 B2 | 6/2014 | Nickerson et al. |
| 2004/0256638 A1 | 12/2004 | Perego et al. |
| 2006/0106956 A1 | 5/2006 | Hillier, III et al. |
| 2006/0126369 A1 | 6/2006 | Raghuram |
| 2007/0286078 A1 | 12/2007 | Coteus et al. |
| 2008/0080261 A1 | 4/2008 | Shaeffer et al. |
| 2009/0019184 A1* | 1/2009 | Skerlj .................. G06F 13/1684 710/5 |
| 2009/0063785 A1 | 3/2009 | Gower et al. |
| 2009/0175090 A1 | 7/2009 | Smolka |
| 2010/0074038 A1 | 3/2010 | Ruckerbauer et al. |
| 2010/0121994 A1 | 5/2010 | Kim et al. |
| 2010/0262790 A1 | 10/2010 | Perego et al. |
| 2011/0016345 A1 | 1/2011 | Hayashi et al. |
| 2011/0246857 A1 | 10/2011 | Bae et al. |
| 2012/0173809 A1 | 7/2012 | Ko |
| 2012/0179880 A1* | 7/2012 | Ware .................. G06F 13/1663 711/148 |
| 2013/0176763 A1 | 7/2013 | Ware et al. |
| 2013/0194881 A1 | 8/2013 | Woo et al. |
| 2013/0219239 A1 | 8/2013 | Whetsel |
| 2013/0254495 A1 | 9/2013 | Kim et al. |
| 2013/0339820 A1* | 12/2013 | Cordero ............. G06F 11/1072 714/773 |
| 2014/0052934 A1 | 2/2014 | Gopalakrishnan et al. |
| 2014/0082262 A1* | 3/2014 | Nachimuthu ......... G06F 9/4403 711/103 |
| 2014/0101382 A1 | 4/2014 | Kaviani et al. |
| 2014/0104935 A1 | 4/2014 | Ware et al. |
| 2014/0192583 A1 | 7/2014 | Rajan et al. |
| 2014/0237152 A1 | 8/2014 | Amirkhany et al. |
| 2014/0304462 A1* | 10/2014 | Venugopal ............... G11C 8/12 711/104 |
| 2014/0328132 A1 | 11/2014 | Cordero et al. |
| 2015/0103479 A1 | 4/2015 | Ware et al. |
| 2015/0255130 A1 | 9/2015 | Lee et al. |
| 2015/0378885 A1 | 12/2015 | Kim et al. |
| 2016/0118088 A1 | 4/2016 | Lee et al. |
| 2018/0005697 A1 | 1/2018 | Park et al. |

OTHER PUBLICATIONS

"IEEE Standard for High-Bandwidth Memory Interface Based on Scalable Coherent Interface (SCI) Signaling Technology (RamLink)", IEEE Std., p. 1596.4-1996, Sep. 15, 1996. 100 pages.

Diamond, Stephen L., "SyncLink: high-speed DRAM for the future", Micro, IEEE, vol. 16, No. 6, pp. 74-75, Dec. 1996. 2 pages.

EP Communication Pursuant to Article 94(3) EPC dated Oct. 10, 2019 re: EP Appln. No. 15870528.5. 4 Pages.

EP Response filed on Jan. 21, 2019 in Response to the Extended European Search Report dated Jul. 31, 2018 and the Communication Pursuant to Rules 70(2) and 70a(2) EPC dated Aug. 20, 2018. 15 Pages.

Extended European Search Report dated Jul. 31, 2018 re: EP Appln. No. 15870528.5. 7 Pages.

Gjessing, S. et al., "A RAM link for high speed", IEEE Spectrum, Oct. 1992, pp. 52-53.

Gjessing, Stein et al., "RamLink: A High-Bandwidth Point-to-Point Memory Architecture", Thirty-Seventh IEEE Computer Society International Conference, Digest of Papers, pp. 328-331, Feb. 24-28, 1992. 4 pages.

IEEE Standard for Scalable Coherent Interface (SCI), "Microprocessor and Microcomputer Standards Subcommittee of the IEEE Computer Society," IEEE Std. 1596-1992, Aug. 2, 1993. 271 pages.

Notification Concerning Transmittal of International Preliminary Report on Patentability dated Jun. 29, 2017 re: Int'l Appln. No. PCT/US15/057822. 7 Pages.

Notification of Transmittal of the International Search Report and the Written Opinion of the International Searching Authority, or the Declaration dated Mar. 4, 2016 re: Int'l Appln. No. PCT/US15/057822. 10 Pages.

Wiggers, H., "SyncLink A Proposal for an Implementation of IEEE P1596.4", Hewlett Packard, pp. 1-20 (Mar. 1995).

* cited by examiner

Transaction detail for system examples

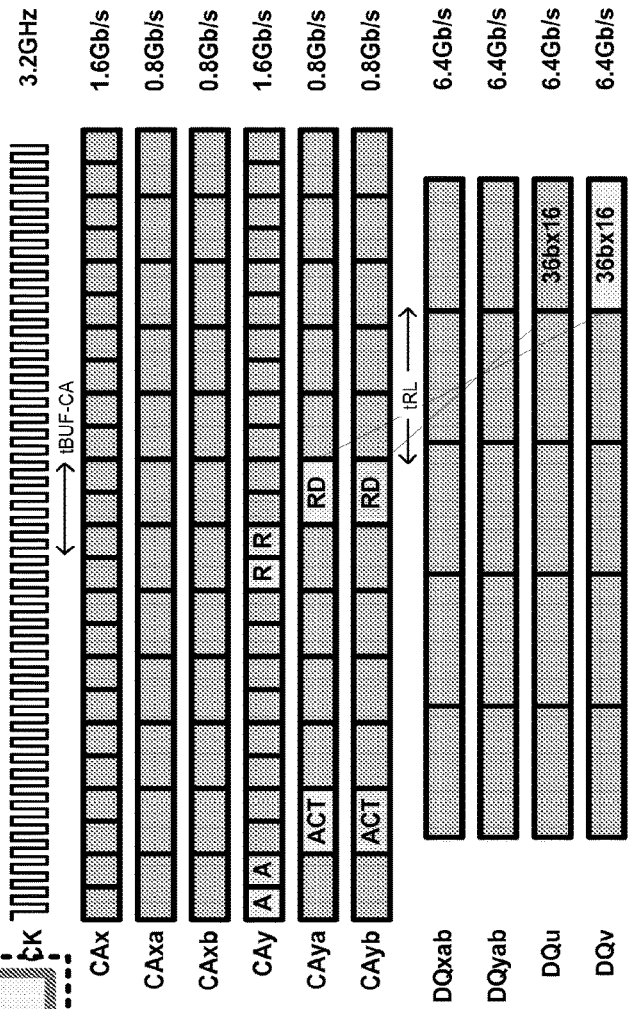
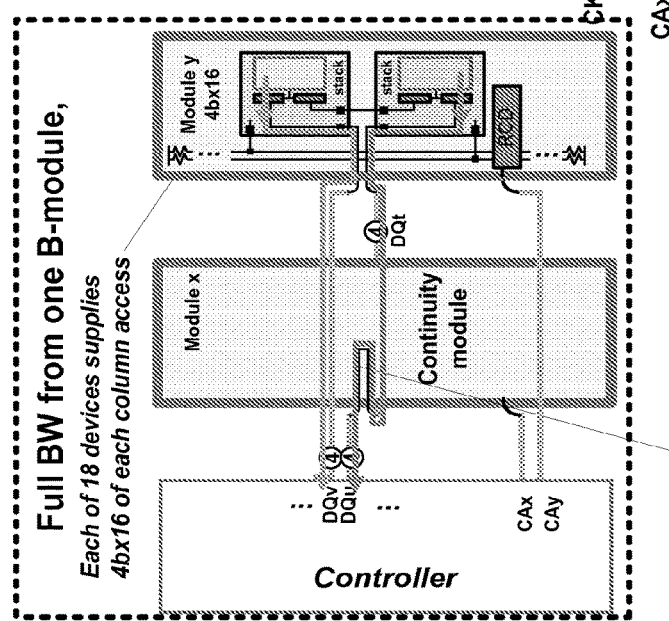
FIG. 7A
FIG. 7B

Incremental latency for different configuration cases

| SPC (socket per channel) | DPC (DIMM per channel) | DRAM/module | Incremental latency[a] | |
|---|---|---|---|---|
| 2 | 2 | 36x8 | +3 | example A |
| 2 | 2 | 18x8 | +1 | - |
| 2 | 2 | 9x8 | +0 | - |
| 2 | 1 | 36x8 | +1 | - |
| 2 | 1 | 18x8 | +0 | example B |
| 2 | 1 | 9x8 | +0 | - |
| 1 | 1 | 36x8 | +1 | - |
| 1 | 1 | 18x8 | +0 | - |
| 1 | 1 | 9x8 | +0 | - |

[a] *latency units include one cycle(312ps) for serialization and zero-two cycles for ±1 cycle of clock skew*

- System with two DRAM modules

1xA_CLK module w/ 1x36 device stacks (using CLK instead of DQS as DQ timing reference)

Each of 36 devices supplies 2bx16 of a column access

DYNAMIC RANDOM ACCESS MEMORY (DRAM) COMPONENT FOR HIGH-PERFORMANCE, HIGH-CAPACITY REGISTERED MEMORY MODULES

RELATED APPLICATIONS

This application is a continuation of U.S. patent application Ser. No. 16/290,375, filed Mar. 1, 2019, which is a continuation of U.S. patent application Ser. No. 15/533,630, filed Jun. 6, 2017, now U.S. Pat. No. 10,223,309, which is a National Phase Application of International Application No. PCT/US2015/057822, filed Oct. 28, 2018, which claims the benefit of U.S. Provisional Application No. 62/234,409, filed Sep. 29, 2015, and claims the benefit of U.S. Provisional Application No. 62/233,884, filed Sep. 28, 2015, and claims the benefit of U.S. Provisional Application No. 62/220,101, filed Sep. 17, 2015, and claims the benefit of U.S. Provisional Application No. 62/094,914, filed Dec. 19, 2014, the contents of all are incorporated by reference.

BACKGROUND

Computing memory systems are generally composed of one or more dynamic random access memory (DRAM) integrated circuits, referred to herein as DRAM devices, which are connected to one or more processors. Multiple DRAM devices may be arranged on a memory module, such as a dual in-line memory module (DIMM). A DIMM includes a series of DRAM devices mounted on a printed circuit board (PCB) and are typically designed for use in personal computers, workstations, servers, or the like. There are several different types of memory modules, including: unbuffered DIMMs (UDIMMs) where both the command/address and data busses attach directly to the DRAM components; registered DIMMs (RDIMMs) where the command/address bus is buffered but not the data bus; and load-reduced DIMMs (LRDIMMs) in which there are buffer chips for both the command/address bus as well as the data bus. In general and due to the difficult electrical signaling nature of the memory channel, the higher the capacity and bandwidth requirements of a memory channel, the more buffering is required to achieve desired performance.

Successive generations of DRAM components have appeared in the marketplace with steadily shrinking lithographic feature size. As a result, the device storage capacity of each generation has increased. Each generation has seen the signaling rate of interfaces increase, as well, as transistor performance has improved.

Unfortunately, one metric of memory system design which has not shown comparable improvement is the maximum number of modules that a single memory channel can support. This maximum number of modules has steadily decreased as the signaling rates have increased.

The primary reason for this decrease is the link topology used in standard memory systems. When more modules are added to the system, the signaling integrity is degraded, and high-speed signaling becomes more and more difficult. Typical memory systems today are limited to just one or two modules when operating at the maximum signaling rate.

Some future memory systems may be limited to a single rank of devices (or a single rank of device stacks) on a single module at the highest signaling rates.

BRIEF DESCRIPTION OF THE DRAWINGS

The present disclosure is illustrated by way of example, and not by way of limitation, in the figures of the accompanying drawings.

FIGS. 7A-7B show read transactions directed to a system with a single DRAM module and a continuity module present according to one embodiment.

FIG. 10 shows the incremental read latency seen by a controller component for the various module and channel configurations according to one embodiment.

FIGS. 15A-15B shows two memory modules with clocked DQ links according to another embodiment.

DETAILED DESCRIPTION

Figure 1:
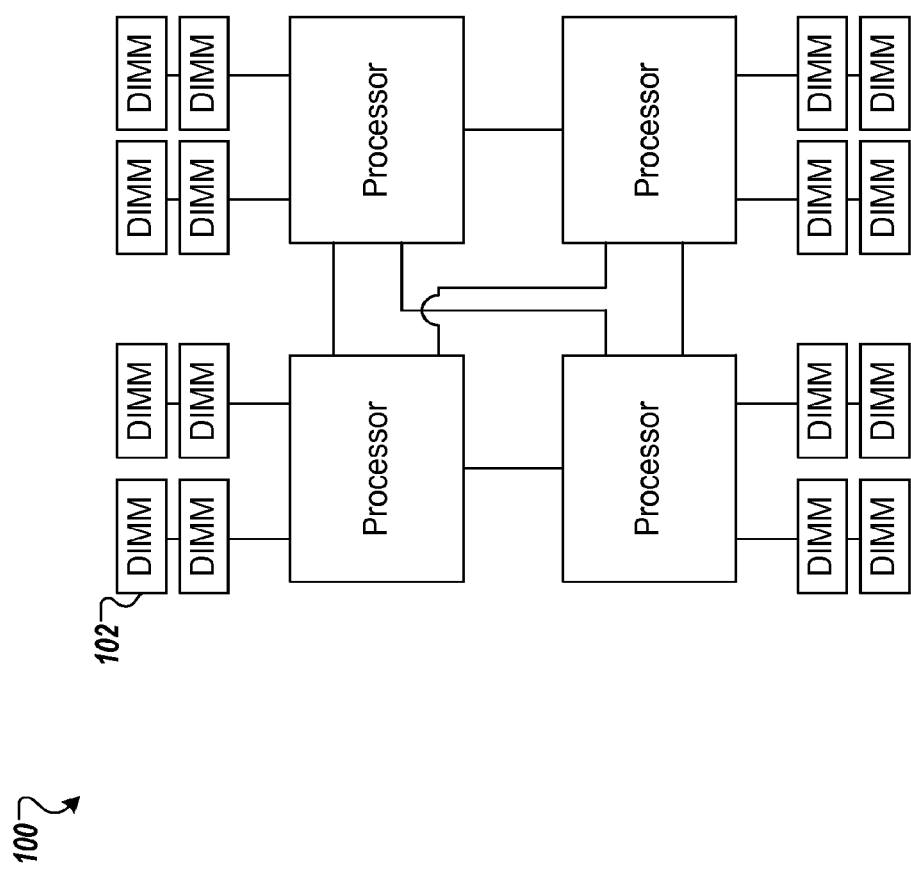
FIG. 1 is a block diagram of a four-processor computing system with a memory system containing multiple channels with 2 DIMMs per channel according to one embodiment.

The embodiments described herein describe technologies of dynamic random access memory (DRAM) components for high-performance, high-capacity registered memory modules, such as registered dual in-line memory modules (RDIMMs). One DRAM component may include a set of memory cells and steering logic. The steering logic may include a first data interface and a second data interface. The first and second data interfaces are selectively coupled to a controller component in a first mode and the first data interface is selectively coupled to the controller component in a second mode and the second data interface is selectively coupled to a second DRAM component in the second mode. Other embodiments herein describe technologies of dual-ported dies with groups of stacked dynamic random access memory (DRAM) components for high-performance, high-capacity RDIMMs. One memory module may include a module interface, a command and address (CA) interface connected on a shared bus, and at least two groups of stacked memory components. Each stack of memory components includes two data interfaces connected with point-to-point topology in a linear chain. A first stack in a first group includes a first data interface coupled to the module interface and a second data interface coupled to a second stack in a second group. Other embodiments herein describe technologies of dual-ported stacks of DRAM components for high-performance, high-capacity RDIMMs. One apparatus includes a package substrate including at least two package interfaces and a dual-ported stack including multiple homogeneous memory components stacked on the package substrate. A first memory component of the dual-ported stack includes a first external data interface that connects to a first package interface of the at least two package interfaces on the package substrate and a first internal data interface that connects to all other memory components in the dual-ported stack. A second memory component in the stack includes a second external data interface that connects to a second package interface of the at least two package interfaces on the package substrate and a second internal data interface that connects to all other memory components in the dual-ported stack.

As described above, the signaling integrity may degrade, reducing signal rates, when more modules are added to a memory system. Thus, to operate at the maximum signal rate, conventional memory systems are limited to just one or two modules. The embodiments described herein are directed to memory systems with an increase in number of memory modules and an increase of ranks per modules. Embodiments of the memory modules may be built using standard memory components with minor modifications, or no modifications. Embodiments of memory components may be used in a legacy memory system with potentially signaling rate and capacity limitations, as well as in memory systems with higher signaling rates and capacities. The embodiments described herein may be compatible with standard error detection and correction (EDC) codes, including standard (Hamming) ECC bit codes, standard "Chip-kill" symbol codes, or the like in technologies, such as the Chipkill® technology, SDDC, Extended ECC, Advanced ECC and Chipspare, or the like that spread the bits across multiple memory chips (i.e., integrated circuit dies).

In one embodiment, a DRAM component includes a set of memory cells and steering logic coupled to the set of memory cells. The steering logic may include first and second data interfaces. The first data interface and the second data interface are selectively coupled to a controller component (e.g., a memory controller of a processor) in a first mode. In a second mode, the first data interface is selectively coupled to the controller component and the second data interface is selectively coupled to a second DRAM component. The first mode may be when the DRAM component is in a DIMM that is inserted into a legacy memory system and the second mode may be when the DRAM component is in a DIMM that is inserted into an improved memory system as described herein.

In another embodiment, a memory module includes a printed circuit board with first, second and third sets of data lines and first and second sets of pins, the first set of pins being coupled to the first set of data lines and the second set of pins being coupled to the second set of data lines. A first DRAM component may be located at a first site on the printed circuit board and a second DRAM component may be located at a second site on the printed circuit board. The first DRAM component includes a first data interface coupled to the first set of data lines and second data interface coupled to the third set of data lines. The second DRAM component includes a first data interface coupled to the third set of data lines and a second data interface coupled to the second data lines.

In another embodiment, the DRAM component includes a set of memory cells, such as memory cells organized as one or more bank groups. The DRAM component also includes steering logic that can be configured to steer data to and from the memory cells, as well as from other DRAM components. In one embodiment, the steering logic includes a first receiver coupled to a first set of data links, a first transmitter coupled to the first set of data links, a second receiver coupled to a second set of data links, and a second transmitter coupled to the second set of data links. The steering logic also includes multiple multiplexers to facilitate data paths from between the three sets of data links of the DRAM component. In one example, the steering logic further includes a first multiplexer with an output coupled to the first transmitter, a second multiplexer with an output coupled to the second transmitter, a third multiplexer, a fourth multiplexer with an output coupled to an input of the first multiplexer and an input of the second multiplexer, a fifth multiplexer with an output coupled to the set of memory cells, and a sixth multiplexer with an output coupled to the third set of data links. The first receiver is coupled to an input of the second multiplexer and is coupled to an input of the third multiplexer. The second receiver is coupled to an input of the first multiplexer and is coupled to an input of the third multiplexer. An output of the third multiplexer is coupled to an input of the fifth multiplexer and is coupled to an input of the sixth multiplexer. The third set of data links is coupled to an input of the fifth multiplexer and is coupled to an input of the fourth multiplexer. The set of memory cells is coupled to an input of the fourth multiplexer and is coupled to an input of the sixth multiplexer.

In another embodiment, a memory module includes a printed circuit board (PCB) with first, second, and third sets of data lines and first and second sets of pins, the first of pins being coupled to the first set of data lines. The memory module includes a first stack of DRAM components located at a first site on the PCB, a second stack of DRAM components located at a second site on the PCB, a third stack of DRAM components located at a third site on the PCB, and a fourth stack of DRAM components located at a fourth site on the PCB. The first stack of DRAM components includes a first data interface coupled to the first set of data lines and a second data interface coupled to the second set of data lines. The second stack of DRAM components includes a first data interface coupled to the second set of data lines and a second data interface coupled to the third set of data lines. The third stack of DRAM components includes a first data interface coupled to the third set of data lines and a second data interface coupled to the fourth set of data lines. The fourth stack of DRAM components includes a first data interface coupled to the fourth set of data lines.

A DRAM stack, as used herein, includes one or more DRAM dies that are stacked in one or more packages in a single location on the memory module. In a common Single-Die Package (SDP) embodiment, a DRAM stack includes only one DRAM die and one package. Alternative embodiments may include a single package that houses a stack of multiple DRAM dies, such as 3DS die stack with through-silicon-via (TSV) connections or a Dual-Die Package (DDP) that has two DRAM dies in a single package.

In another embodiment, a memory package includes a package substrate including at least two data interfaces and a stack of memory components stacked on the package substrate. The memory components of the stack are homogeneous. Each of the memory components includes an external data interface that connects to a subset of the memory components of the stack and an internal data interface that connects to all of the memory components of the stack. The external data interfaces of at least two of the memory components are coupled to the at least two data interfaces on the package substrate. A data access to any memory component in the stack may be made through a topmost die or a bottommost die as a primary data interface (this is also referred to herein as an external data interface). The stack can transfer data from a first one of the primary interfaces, through a secondary interface, to a second one of the primary interfaces. The secondary interface in this context may also be referred to as an internal interface. The internal interfaces, as described herein, may not be coupled to the package, and the primary interfaces are used to couple to external components.

FIG. 1 is a block diagram of a four-processor computing system 100 with a memory system containing multiple channels with 2 DIMMs per channel according to one embodiment. The computing system 100 includes four processor sockets, with each socket containing multiple memory channels. In the depicted embodiment, each channel includes two DIMMs 102 per channel. In this computing system, the DIMMs 102 may be RDIMMs that have buffers on the command/address channel (these command/address buffers are generally known as "RCD" chips) but have no buffers on the data bus (data-bus buffering chips are generally known as "DB buffers") and are arranged in "point-to-point" DQ topology (discussed in more detail below) that can reach signaling rates up to 6.4 Gb/s per DQ signal. This architecture permits maximum module capacity of two sockets per channel (2SPC). The 2SPC can be populated with DIMMs in either 1 DIMM per channel (1DPC) or two DIMMS per channel (2DPC). The smallest DQ link granularity to each DRAM chip (where each chip contains a 3D "stack" of two or more DRAM die) may be four (i.e., each DRAM is "x4" in width; the x4 DQ link granularity is also called a "nibble"). This granularity is the result of the clocking used by the memory system. There is a timing link DQS (e.g., a differential strobe with two interconnect wires) which accompanies each group of four DQ links. The timing link DQS may also be considered a data strobe link. It is not possible to divide a DQ nibble between two DRAM stacks; the four links (plus the timing strobe) must connect to the same DRAM stack.

In one embodiment, the DIMM 102 includes a printed circuit board with first, second and third sets of data lines and first and second sets of pins, the first set of pins being coupled to the first set of data lines and the second set of pins being coupled to the second set of data lines. A first DRAM component of the DIMM 102, located at a first site on the printed circuit board, includes a first data interface coupled to the first set of data lines and second data interface coupled to the third set of data lines. A second DRAM component, located at a second site on the printed circuit board, includes a first data interface coupled to the third set of data lines and a second data interface coupled to the second data lines. The first data interface may be arranged into a first nibble and the second data interface may be arranged into a second nibble, the first nibble and the second nibble each including a respective timing link, e.g., a data strobe link.

In a further embodiment, the DIMM 102 includes a registered clock driver (RCD) component. The printed circuit board includes first and second sets of CA lines and fourth set of pins that are coupled to the first set of CA lines. The second set of CA lines is coupled between the RCD component and the first site and between the RCD component and the second site.

In one implementation, the first DRAM component is part of a first DRAM stack at the first site and the second DRAM component is part of a second DRAM stack at the second site. The first DRAM stack may include a primary DRAM component and multiple secondary DRAM components. The second DRAM stack includes a primary DRAM component and multiple second DRAM components.

In another implementation, the DIMM 102 includes a third DRAM stack located at a third site on the printed circuit board and a fourth DRAM stack located at a fourth site on the printed circuit board. The first, second, third and fourth DRAM stacks may be connected in a chain between the first set of pins and the second set of pins. The third DRAM stack may include a third DRAM component with a first data interface coupled to a first subset of the third set of data lines and a second data interface coupled to a second subset of the third set of data lines. The fourth DRAM stack may include a fourth DRAM component with a first data interface coupled to a third subset of the third set of data lines and a second data interface coupled to a fourth subset of the third set of data lines. This implementation may also include the RCD component, CA lines and pins as described above.

In one implementation, during a write operation, the first data interface is configured to receive data and the second data interface is configured to re-transmit the data. This may be used for a multiple rank write operation. During a read operation, the second data interface is configured to receive data and the first data interface is configured to re-transmit the data. This may be used for a multiple rank read operation.

In one implementation, the DRAM component includes a set of memory cells organized into a first bank group and a second bank group. The first data interface may access at least one of the first bank group or the second bank group. In another implementation, the DRAM component includes a set of memory cells organized as a single group.

In one embodiment, a DRAM component of the DIMM 102 includes a set of memory cells and steering logic coupled to the set of memory cells. The steering logic includes a first data interface and a second data interface. The first data interface and the second data interface are selectively coupled to a controller component in a first mode. In a second mode, the first data interface is selectively coupled to the controller component and the second data interface is selectively coupled to a second DRAM component. In one embodiment, the first data interface is arranged into a first nibble and the second data interface is arranged into a second nibble, the first nibble and the second nibble each comprising a respective timing link.

In a further embodiment, the first DRAM component is part of a first DRAM stack and the second DRAM component is part of a second DRAM stack. In a further embodiment, the steering logic includes a third data interface selectively coupled to the first data interface and the second data interface. The third data interface is to couple to a set of through-silicon-via (TSV) links in the first DRAM stack for write operations to or read operations from a secondary DRAM component of the first DRAM stack. In another embodiment, the first DRAM component is a primary DRAM component of a first DRAM stack and the second DRAM component is at least one of another primary DRAM component of a second DRAM stack or a secondary DRAM component of the second DRAM stack. In another embodiment, the first DRAM component is a secondary DRAM component of a DRAM stack and the second DRAM component is at least one of a primary DRAM component or another secondary DRAM component of the DRAM stack.

The DIMMS 102 and DRAM components of the DIMMS 102 are described in more detail below with respect to FIGS. 3-20 below the following description of a standard memory system.

Link Topology in Standard Systems

Figure 2:
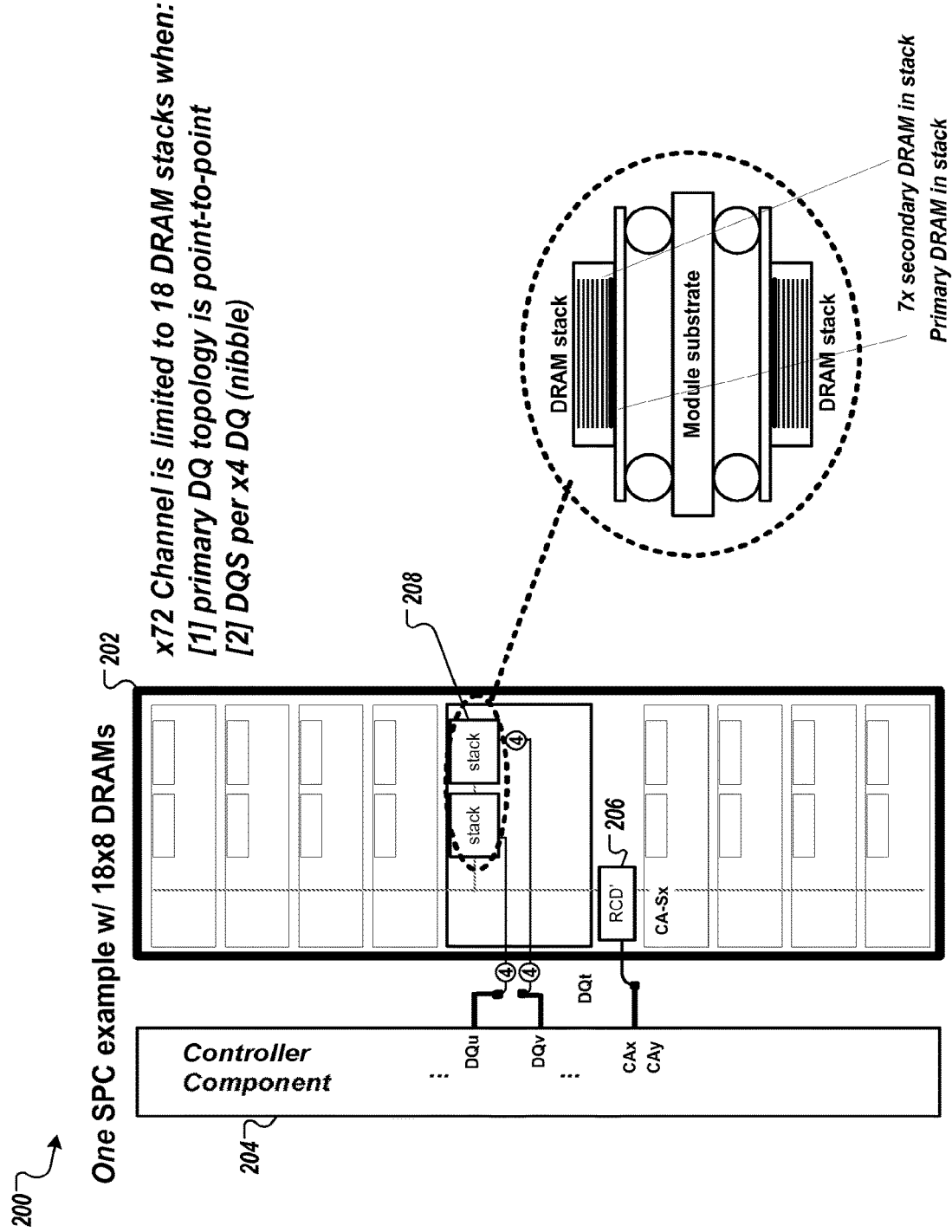
FIG. 2 illustrates physical connection topology of a signaling links in a conventional memory system according to one implementation.

FIG. 2 illustrates physical connection topology of a signaling links of a RDIMM 202 in a conventional memory system 200 according to one implementation. The signaling links can be considered high speed signal links. There are two classes of links: the CA (control-address) links and the DQ (data) links. These signals may be transmitted (and received, in the case of DQ links) by a controller component 204, such as a memory controller on one of the processors of FIG. 1. These signals are typically received (and transmitted, in the case of DQ links) by buffer components of the RDIMM 202. The RDIMM 202 may use a buffer component 206 to receive primary CA links from the controller component. The CA information received on the primary CA links may be retransmitted on the secondary CA links with a small latency (delay) cost. In this implementation, the DQ links are not buffered and the primary DQ link connects from the controller component through a module socket to DRAM components 208.

In one implementation, the DRAM components 208 are assembled into a high-density 3D stack (using "through-silicon-via" ("TSV") connections for the intra-stack die-to-die interconnect) stack as illustrated. The DQ links couple to the bottom-most DRAM component, and this primary DRAM retransmits the DQ information onto the TSV links to the secondary DRAM components (e.g., such as during a write operation). In the case of a read operation, the DQ information on the TSV links from the selected secondary DRAM is received by the primary DRAM and retransmitted to the controller component 204. In some implementations, the TSV links are implemented with a through-silicon-via technique. This is also known as 3D die stacking. Typically, the TSV links may be operated at a lower signaling rate than the primary links, but with more links, so the bandwidth is matched.

In FIG. 2, it is assumed that the primary DQ links are to operate at the highest possible signaling rate. This maximizes the data bandwidth that is available to the controller component 204 through the x72 DQ channel. The highest DQ signaling rate is only possible with a point-to-point interconnect topology. Without the benefits of some of the embodiments described herein, this would limit the memory channel to a single module, with a single rank of DRAM stacks on the module 202, with "n*# of DRAM stacks" of DRAM capacity, where "n" is the number of DRAM dies within the 3D stack.

As described herein, the smallest DQ link granularity to each DRAM stack may be four (x4) or a nibble. This granularity is the result of the clocking used by the memory system. There is a timing link DQS (e.g., a differential strobe with two interconnect wires) which accompanies each group of four DQ links. In this implementation, it is not possible to divide a DQ nibble between two DRAM stacks. That is, the four links (plus the timing strobe) must connect to the same DRAM stack.

The two constraints of point-to-point DQ topology and x4 DQ granularity permits an x72 DQ channel to connect to just eighteen DRAM stacks at the maximum signaling rate. If more memory modules are added to the channel, or more ranks are added to the module, then the signaling rate may need to be reduced.

Some conventional memory systems may use buffer components in the path of the DQ links on the memory module. These are called LRDIMMs (load-reduced-dual-inline-memory-module). These modules can support more ranks of DRAM stacks on the module, but at a higher manufacturing cost due to the extra buffer components on the memory module. This capacity-performance tradeoff of RDIMMs constrains a memory system designer. The embodiments of the high-performance, high-capacity registered memory module described herein may solve or reduce this problem and may provide significantly higher memory capacity at the highest possible signaling rate.

Memory System with High-Performance, High-Capacity Registered Memory Modules

Figure 3A:
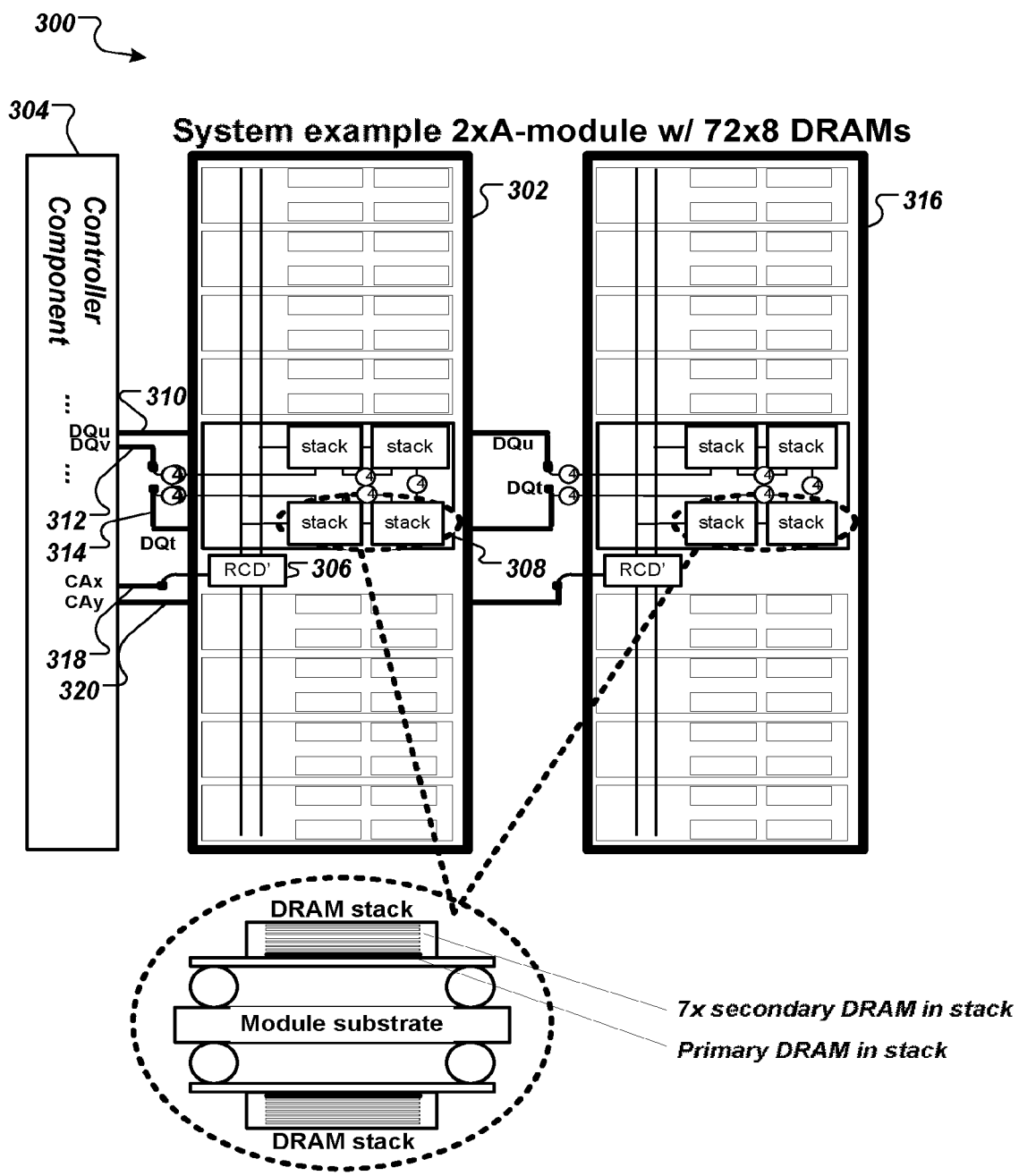
FIG. 3A is a block diagram of a RDIMM memory system with two memory modules with 72×8 DRAMs according to one embodiment.

FIG. 3A is a block diagram of a RDIMM memory system 300 with two memory modules with 72×8 DRAMs according to one embodiment. The physical connection topology of the RDIMM memory system 300 is different from the physical connection topology of the conventional memory system 200 as described below. The signaling links can be considered high speed signal links. There are two classes of links: the CA (control-address) links and the DQ (data) links. These signals may be transmitted (and received, in the case of DQ links) by a controller component 304, such as a memory controller on one of the processors of FIG. 1. These signals are typically received (and transmitted, in the case of DQ links) by buffer components of the RDIMM 302. The RDIMM 302 may use a buffer component 306 to receive primary CA links from the controller component. The CA information received on the primary CA links may be retransmitted on the secondary CA links with a small latency (delay) cost. In this implementation, the DQ links are not buffered and the primary DQ link connects from the controller component 304 through a module socket to DRAM components 308.

In one implementation, the DRAM components 308 are assembled into a high-density TSV (through-silicon-via) stack as illustrated. The DQ links couple to the bottom-most DRAM component, and this primary DRAM retransmits the DQ information onto the TSV links to the secondary DRAM components (e.g., such as during a write operation). In the case of a read operation, the DQ information on the TSV links from the selected secondary DRAM is received by the primary DRAM and retransmitted to the controller component 304. In some implementations, the TSV links are implemented with a through-silicon-via technique or 3D die stacking as described herein.

In FIG. 3A, it is assumed that the primary DQ links are to operate at the highest possible signaling rate. This maximizes the data bandwidth that is available to the controller component 204 through the x72 DQ channel. Unlike the conventional memory system 200 that would need a single rank of DRAM stacks in a single module to get the highest DQ signaling rate, the RDIMM memory system 300 includes a point-to-point interconnect topology in which four DRAM stacks are arranged in a chain. As described herein, the smallest DQ link granularity to each DRAM stack may be four (x4), also referred to as a nibble with a timing link DQS (e.g., a differential strobe with two interconnect wires) which accompanies each group of four DQ links.

The capacity of the RDIMM memory system 300 can be increased by 4× at the highest possible signaling rate by three modifications, including a first modification of adding a second DQ nibble interface to the DRAM component 308. The second DQ nibble interface connects to four DQ links and a DQS timing link (a differential signal with two wires). The details of one embodiment of this interface are described below with respect to FIG. 5. In one embodiment, either the first interface or the second interface of the DRAM component 308 can be connected to the controller component 304 and either the first interface or the second interface can be connected to another DRAM component 308 in another DRAM stack at another device site on the printed circuit board. Also, either the first interface or the second interface can be used to access a DRAM core (e.g., a set of memory cells of the DRAM component). These two interfaces may also be used to transfer data for another DRAM to which it is connected.

In FIG. 3A, each set of four DRAM stacks connects in a ring, with the first and last DRAM stack connected to a module socket.

The capacity of the RDIMM memory system 300 can be increased by 4× at the highest possible signaling rate by a second modification of changing an interconnection pattern of the primary DQ nibble groups. FIG. 3A illustrates this for one pair of nibble groups, but the other eight pairs of nibble groups have an identical pattern.

The two nibble groups are designated DQu 310 and DQv 312 at the controller component 304. The point-to-point interconnect wires for the four DQ links and the differential DQS link connect from the controller interface to a module socket via a motherboard substrate. The two nibble groups connect to different module sockets. A third nibble group is designated DQt 314 and the corresponding interconnect wires on the motherboard connect between the two module sockets. This motherboard wire pattern may allow the two modules 302, 316 to be accessed in parallel by the controller component 304. This access is by the DQu and DQv nibble groups 310, 312. The DQt nibble group 314 would not be used in this configuration example.

The capacity of the RDIMM memory system 300 can be increased by 4× at the highest possible signaling rate by a third modification of changing the primary CA links to a point-to-point topology. This is possible because the normal multi-drop topology used memory systems are forced to operate at a lower signaling rate. That is, a single multi-drop CA bus can be replaced with two point-to-point CA buses which are each half the width and which run at twice the signaling rate. These two point-to-point buses are labeled CAx 318 and CAy 320 in FIG. 3A.

Improved Module—System Example 1xB

Figure 3B:
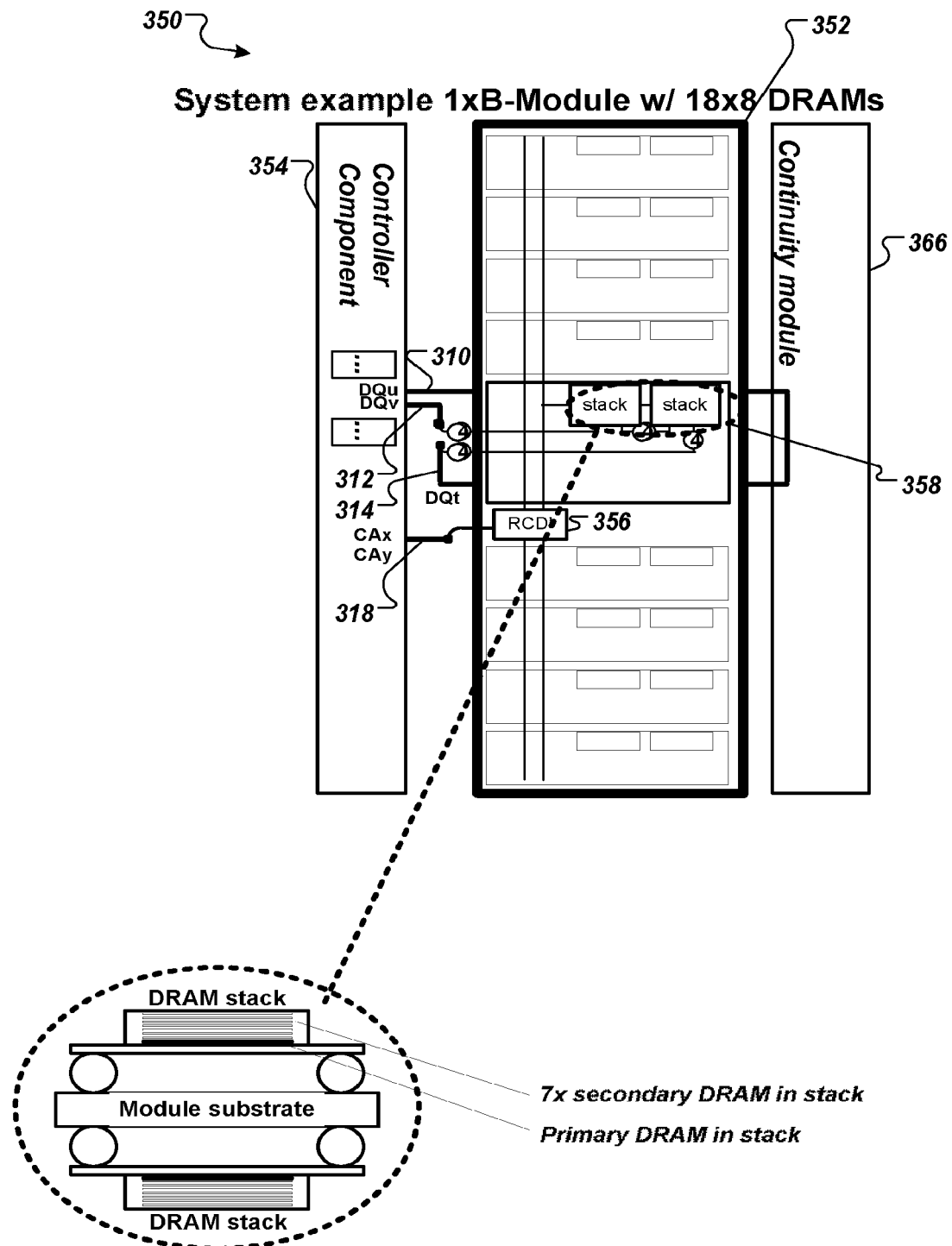
FIG. 3B is a block diagram of a RDIMM memory system with one memory module with 18×8 DRAMs and a continuity module according to one embodiment.

FIG. 3B is a block diagram of a RDIMM memory system 350 with one memory module 352 with 18×8 DRAMs and a continuity module 366 according to one embodiment. In this embodiment, there is a single DRAM module 352 in the first socket. The second socket is occupied by a continuity module 366. The continuity module 366 connects the DQt nibble group 314 to the DQu nibble group 310 for each nibble group pair. The CAy links 320 are not connected in the continuity module 366, but the CAx links 318 are connected to the RCD component 356. The RDIMM 352 contains half as many DRAM stacks as the RDIMM 302 in FIG. 3A. This illustrates the range of capacity that is possible with the three modifications described above with respect to FIG. 3A. A capacity factor of 2× may be achieved in this embodiment due to the number of modules which can populate the channel sockets. In another embodiment, another capacity factor of 4× is possible by varying the number of DRAM stacks on the module. A module with 9 DRAM stacks is shown in FIG. 4C.

It should be noted that the primary DQ and primary CA links may utilize point-to-point topology throughout the capacity range. This allows the channel capacity to be adjusted independent of performance.

Module Summary

Figure 4C:
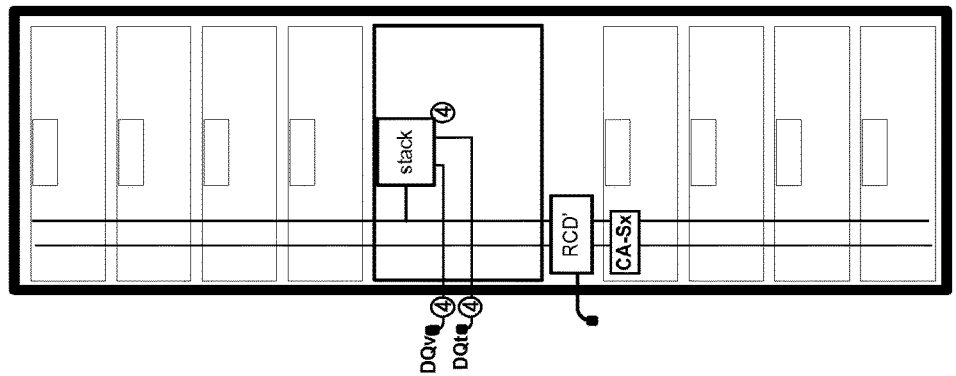
FIGS. 4A-4C are block diagrams of RDIMMs with different numbers of DRAM stacks according to various embodiments.
Figure 4B:
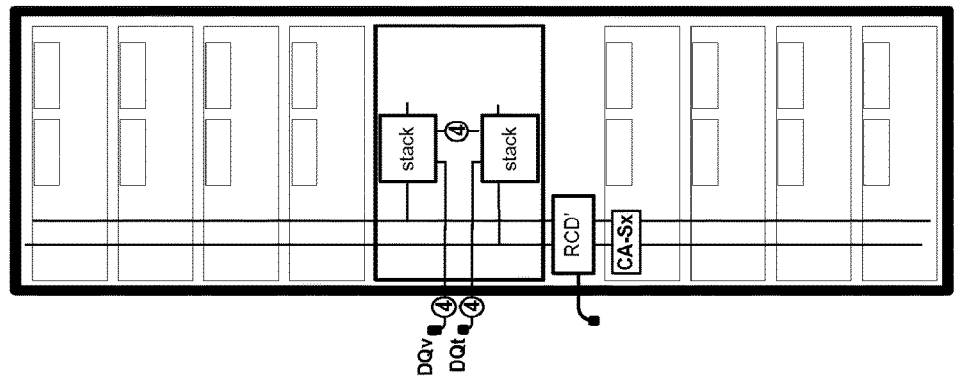
Figure 4A:
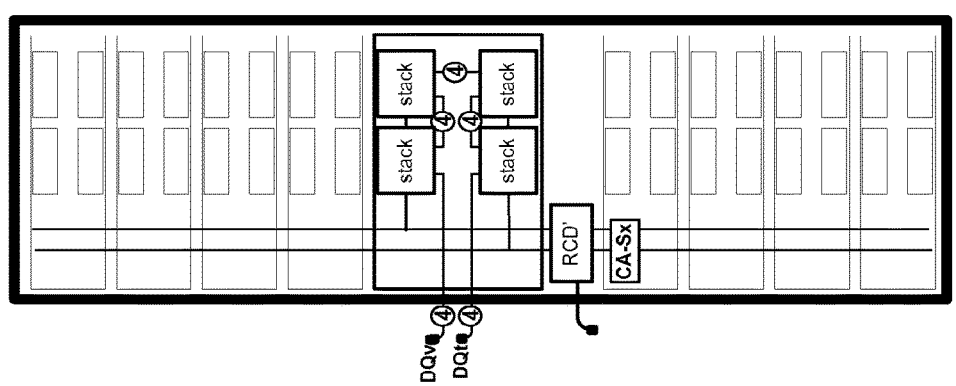

FIGS. 4A-4C are block diagrams of RDIMMs with different numbers of DRAM stacks according to various embodiments.

FIG. 4A shows a RDIMM 400 with thirty-six DRAM stacks. FIG. 4B shows a RDIMM 410 with eighteen DRAM stacks. FIG. 4C shows a RDIMM 420 with nine DRAM stacks. This configuration may offer additional flexibility in the bundling of DRAM stacks on the modules. In other implementations, it is possible to modify the internal DRAM design so that a single module with nine DRAM stacks can supply full data bandwidth to the controller component. This modification may add some cost to the DRAM, but may increase the capacity range by an additional 2×. This modification is described in more detail with respect to FIG. 20.

DRAM Interface Detail

Figure 5:
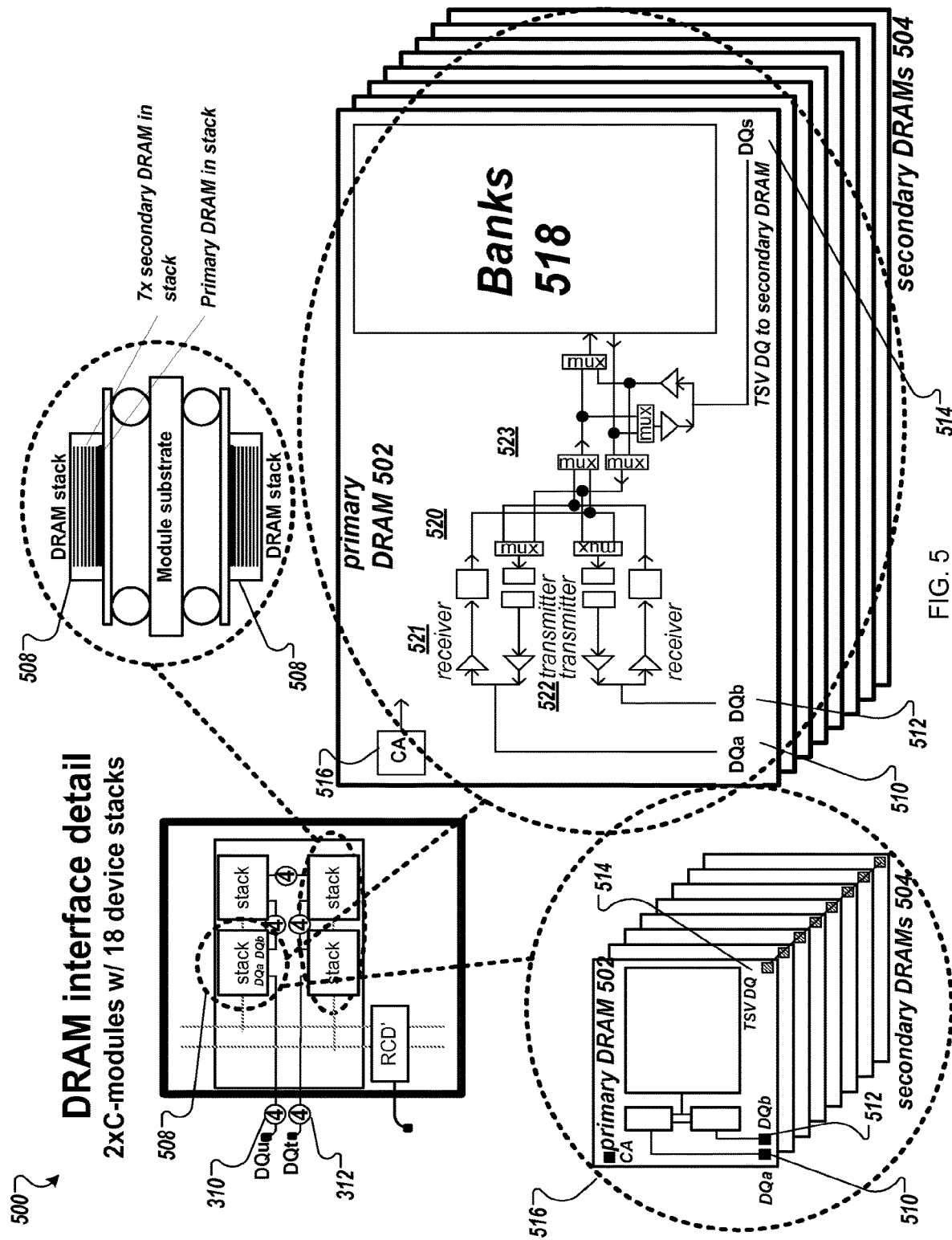
FIG. 5 is a block diagram of a memory system with multiple DRAM stacks arranged in a chain in which a DRAM component includes two primary DQ interfaces according to one embodiment.

FIG. 5 is a block diagram of a memory system 500 with multiple DRAM stacks arranged in a chain in which a DRAM component includes two primary DQ interfaces according to one embodiment. The memory system 500 includes 36 device stacks, four of which are illustrated in FIG. 5. Each DRAM stack 508 includes a primary DRAM component and seven secondary DRAM components. A primary DRAM 502 of the first DRAM stack 508 in the ring is coupled to the first nibble group DQu 310 via a first interface 510 (also referred to as first DQ nibble interface). A second interface 512 is coupled to a second DRAM component in another DRAM stack (the second DRAM stack in the ring in this implementation). The primary DRAM 502 in the last DRAM stack 508 in the ring is coupled to the second nibble group DQt 312 via a second interface 512 (also referred to as second DQ nibble interface) of the primary DRAM component in the ring. In other embodiments, the ring or chain may include more or less sites of DRAM stacks, such as two DRAM stacks as described herein. It should be noted that in the module section view, two DRAM stacks are connected to the socket connection with one interface and (in the upper left of FIG. 5) one of the DRAM stacks connects to the socket connections with one interface, and connects to another DRAM stack with the second interface. For example, a first DRAM stack connects to the memory controller component via a module socket and a second DRAM stack and the second DRAM stack connects to a third DRAM stack. The third DRAM stack connects to a fourth DRAM stack and the fourth DRAM stack connects to the memory controller via the memory socket.

The first and second interfaces 510 and 512 of the primary DRAM component support the system examples described above. The two DQ nibble interfaces 510, 512 are labeled DQa and DQb on the primary DRAM component. Each interface connects to four external DQ links and a DQS timing link (typically a differential signal connecting to two external wires).

In some implementations, the two interfaces on the primary DRAM of a DRAM stack may be identical and can be programmed or otherwise configured with static control register fields or with some equivalent technique. This static configuration method may allow identical DRAM stacks to be connected in a non-symmetric fashion. In other implementations, DRAMS can be specifically manufactured to be either primary or secondary components.

As shown in the exploded view in the lower left of FIG. 5, one of the DRAM stacks 508 includes a primary DRAM 502 stacked with seven secondary DRAMs 504. In other implementations, other stack configurations are possible. The primary DRAM 502 and secondary DRAMs 504 are connected with a set of TSV buses 514. These TSV buses 514 are typically wider and slower than the primary buses. They are physically implemented with TSV (through-silicon-via) technology or with some equivalent method. These TSV buses include links for both data (TSV DQ) and command address (TSV CA) (not separately illustrated).

In this implementation, the secondary DRAMs 504 typically have a pair of primary DQ nibble interfaces and a primary CA interface, which are all disabled by a control register field. The primary DRAM 502 has a pair of primary DQ nibble interfaces 510, 512 and a primary CA interface 516, which are all enabled by a control register field. These primary interfaces 510, 512, 516 are connected to the TSV interface 522. These connection details of these interfaces are shown in the exploded view on the right side of FIG. 5.

The DRAM component (illustrated primary component in the exploded view on the right side of FIG. 5) includes a set of memory cells, such as one or more banks 518, and steering logic 520. In one embodiment, the steering logic provides the paths and connections between the primary interfaces 510, 512, and 516. The DQa and DQb interfaces 510, 512 each contain a receiver 521 and a transmitter 522 for the four DQ links. Additional details of these interfaces are described herein.

The receiver 521 of each interface can be connected to the transmitter 522 of the other interface, to allow data to be passed through the primary DRAM 502. This transfer operation is needed when the selected DRAM stack does not have an interface connected directly to a primary socket.

In another embodiment, the DRAM component 502 includes a set of memory cells, such as memory cells organized as one or more bank groups. The DRAM component 502 also includes steering logic that can be configured to steer data to and from the memory cells, as well as from other DRAM components. In one embodiment, the steering logic includes a first receiver 521 coupled to a first set of data links, a first transmitter 522 coupled to the first set of data links, a second receiver 521 coupled to a second set of data links, and a second transmitter 522 coupled to the second set of data links. The steering logic also includes multiple multiplexers 523 (not individually labeled) to facilitate data paths from between the three sets of data links of the DRAM component. In one example, the steering logic further includes a first multiplexer with an output coupled to the first transmitter, a second multiplexer with an output coupled to the second transmitter, a third multiplexer, a fourth multiplexer with an output coupled to an input of the first multiplexer and an input of the second multiplexer, a fifth multiplexer with an output coupled to the set of memory cells, and a sixth multiplexer with an output coupled to the third set of data links. The first receiver is coupled to an input of the second multiplexer and is coupled to an input of the third multiplexer. The second receiver is coupled to an input of the first multiplexer and is coupled to an input of the third multiplexer. An output of the third multiplexer is coupled to an input of the fifth multiplexer and is coupled to an input of the sixth multiplexer. The third set of data links is coupled to an input of the fifth multiplexer and is coupled to an input of the fourth multiplexer. The set of memory cells is coupled to an input of the fourth multiplexer and is coupled to an input of the sixth multiplexer.

The data from the receiver 521 of either interface can also be directed to a DRAM bank 518 for a write operation. This bank 518 can belong to the primary DRAM, or it can belong to one of the secondary DRAMs. For example, if the write data goes to a bank on a secondary DRAM, the primary data is retransmitted on the TSV DQ links 514. The primary CA command-address information on the CA links 516 is also retransmitted on the TSV CA links 514. However, if the write data goes to a bank on the primary DRAM, the primary data is written directly to the primary bank. In some implementations, the write to the primary bank may be done with a configurable delay, so the bank behavior of the primary DRAM matches that of the secondary DRAMs. In some implementations, the primary CA command-address information typically is not retransmitted on the secondary CA links when the write operation is directed to the primary DRAM.

A bank 518 can also be accessed with a read operation, and the read data transmitted by either interface of the primary DRAM 502. This bank 518 can belong to the primary DRAM 502, or it can belong to one of the secondary DRAMs 504. For example, if the read data comes from a bank on a secondary DRAM, the primary CA command-address information on the CA links 516 is retransmitted on the TSV CA links 514, as in the case of a write operation. The TSV read data (from the TSV links 514) is retransmitted on the primary DQ links (510 or 512). If the read data comes from a bank on the primary DRAM, the data is read directly from the primary bank. This may also be done with a configurable delay, so the bank behavior of the primary DRAM matches that of the secondary DRAMs. In some implementations, the primary CA command-address information typically is not retransmitted on the secondary CA links when the read operation is directed to the primary DRAM.

In another embodiment, the steering logic further includes: a first receiver coupled to a first set of ports, which are coupled to a first set of data lines arranged into a first nibble; a first transmitter coupled to the first set of ports; a second receiver coupled to a second set of ports to couple to a second set of data lines arranged into a second nibble; a second transmitter coupled to the second set of ports; a first multiplexer with an output coupled to the first transmitter; a second multiplexer with an output coupled to the second transmitter; a third multiplexer; a fourth multiplexer with an output coupled to an input of the first multiplexer and an input of the second multiplexer; a fifth multiplexer with an output coupled to the set of memory cells; and a sixth multiplexer with an output coupled to the set of TSV links. The first receiver is coupled to an input of the second multiplexer and is coupled to an input of the third multiplexer. The second receiver is coupled to an input of the first multiplexer and is coupled to an input of the third multiplexer. An output of the third multiplexer is coupled to an input of the fifth multiplexer and is coupled to an input of the sixth multiplexer. The set of TSV links is coupled to an input of the fifth multiplexer and is coupled to an input of the fourth multiplexer. The set of memory cells is coupled to an input of the fourth multiplexer and is coupled to an input of the sixth multiplexer.

Transaction Detail—Two Modules

Figure 6B:
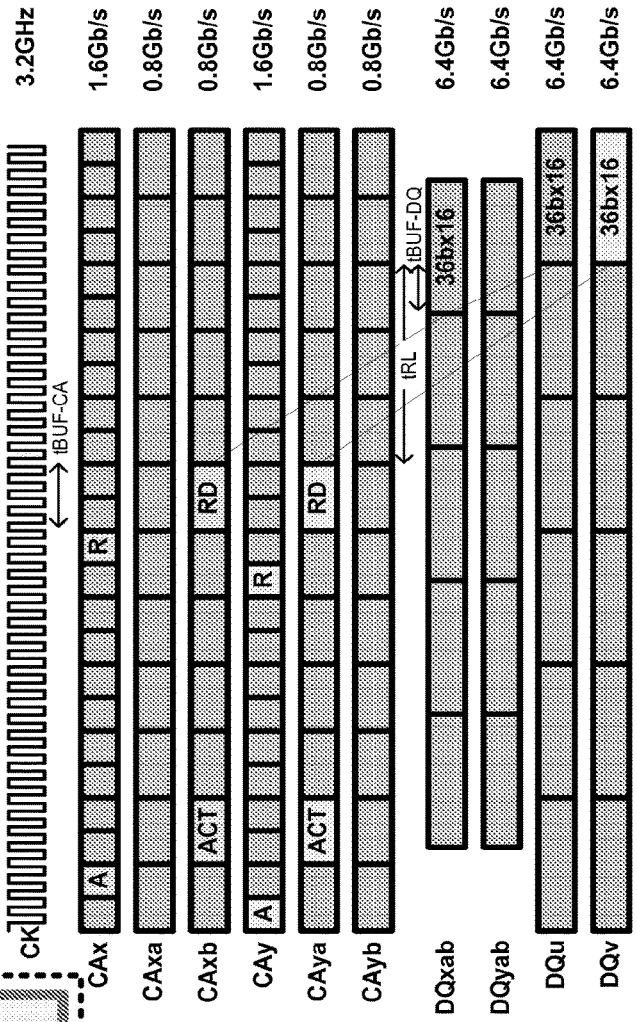
FIGS. 6A-6B show read transactions directed to a memory system with two modules present according to one embodiment.
Figure 6A:
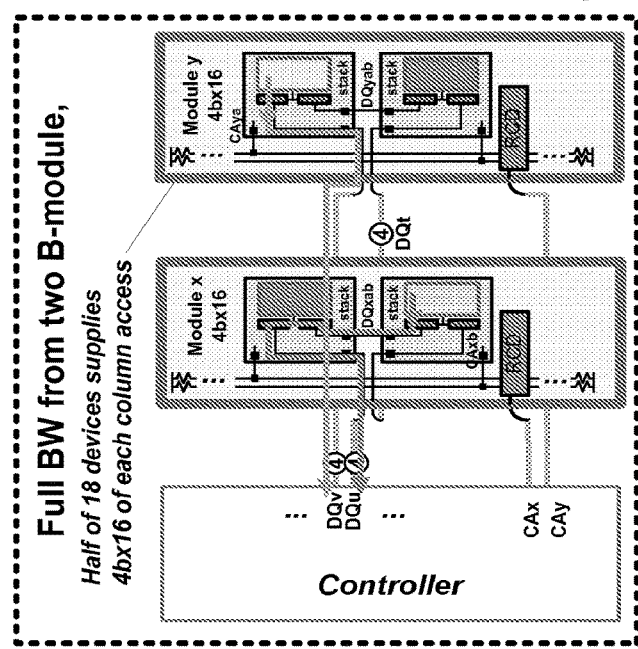

FIGS. 6A-6B show read transactions directed to a memory system with two modules present according to one embodiment. The diagram of FIG. 6A shows a section of the modules and the controller component for reference to the read transactions shown in the timing diagram of FIG. 6B. The section of the modules shows the interconnections of one of the nine pairs of DQ nibble groups and the interconnections of the two primary CA buses CAx and CAy. The two modules are labeled "Module x" and "Module y", matching the connections of the primary CA buses. The timing diagram shows the waveforms of the various CA and DQ buses.

In this implementation, the timing diagram indicates the nominal signaling rate of the various buses, assuming that the primary DQ signaling rate is 6.4 Gb/s. The relative signaling rate of the buses may scale up or down as the primary DQ rate changes.

In the depicted embodiments, each of the two read transactions includes an activate command (labeled "A" or "ACT"), a read command (labeled "R" or "RD"), and read data (labeled "36b×16"). The commands and data for each transaction may be pipelined. This means that they occupy fixed timing positions with respect to the transaction. This also means that the transactions may overlap other transactions.

It should be noted that, in this embodiment, the timing intervals that are used are shorter than what are present in a conventional memory system. For example, the ACT to RD command spacing (tRCD) is shown as 6.25 ns, but may be about 12.5 ns for a real DRAM component. This compression of the timing scale is done for clarity, and may not affect the technical accuracy as the pipeline timing may work equally well with a tRCD delay of 6.25 ns.

There are three other timing intervals shown in the FIG. 6B, namely $t_{BUF-CA}$ interval, $t_{RL}$ interval, and $t_{BUF-DQ}$. The $t_{BUF-CA}$ interval (0.93 ns) is the propagation delay needed by the RCD buffer component to retransmit the information on the primary CA links to the secondary CA links. It should be noted that the 0.93 ns and 3.125 ns are derived from multiple periods of a 3.125 Ghz clock. The $t_{RL}$ interval (3.125 ns) is the column read delay between the RD command and the read data provided by the DRAM. The $t_{BUF-DQ}$ (0.93 ns) interval is the propagation delay needed by the DRAM on Module x component to retransmit the information on the DQxab links to the primary DQu links. This is because the DRAM that is accessed on Module x does not have a direct connection to the controller.

It should be noted that the access on Module y may have a configurable delay ($t_{BUF-DQ}$) inserted in its read access so that the read data is returned to the controller on the DQu and DQv primary links at approximately the same time. This incremental delay may make it easier for the controller component to manage a memory pipeline.

It should be noted that a timing diagram for write transactions may be similar, but with different fixed timing positions of commands and data.

In this implementation, the transaction granularity that is shown is 64 bytes; that is, there are enough command slots to allow each of the primary DQu and DQv slots to be filled with data. Each transaction performs a random row activation and column access on each 64 bytes (e.g., "36b×16" as the data bus is 36b wide, switching 16 times per read/write command). It should be noted that other transaction granularities are possible.

It should also be noted that each byte is assumed to be 9b in size. This extra size may account for the syndrome of an EDC (error detection and correction) code.

In some implementations, if there are bank conflicts in the transaction stream, and if the transaction stream switches between read and write operations, then data slots will need to be skipped. This form of bandwidth inefficiency may be present in all memory systems. It should be noted that in some embodiments no additional resource conflicts are introduced by the modifications that have been made to the RDIMM memory system with the DRAM components having the two interfaces as described herein.

Referring to the timing diagram of FIG. 6B, it can be seen that the "x" and "y" transactions begin with an activation command "A" on the CAx and CAy buses. These buses have a point-to-point topology and a signaling rate of 1.6 GB/s (one-quarter the signaling rate of the point-to-point DQ buses).

In one embodiment, the RCD buffer component on each module may receive the primary CA bus and retransmits the information on the CAxb and CAya module buses. The CA module buses operate at 0.8 Gb/s, half the speed of the primary CA buses and ⅛th the speed of the primary DQ buses. This may result because the module CA buses have a multi-drop topology; each of the four module CA buses connects to about ¼ of the DRAM stacks on the module.

Referring to the timing diagram of FIG. 6B, it can be seen that the "x" and "y" transactions continue with a read command "R" on the CAx and CAy buses. This is retransmitted on the CAxb and CAya module buses. The two read transactions have accessed two of the four DRAM stacks in the set of four DRAM stacks that connect to the DQu and DQv nibble groups in this example. The two transactions have each accessed one of the eight DRAMs in the selected stack.

In the case of an access to the primary DRAM, some additional delay may be added to the access time so that the read data is transmitted on the primary DQ in the same relative time slot. It should be noted that this detail for incremental delay described above with respect to FIG. 5 is not shown in the diagrams of FIGS. 6A-6B. This incremental delay may make it easier for the controller component to manage the memory pipeline.

Returning to FIG. 6A, it can be seen that the "x" transaction accesses the lower DRAM stack. This means that the read data may be driven onto the DQxab primary links to the upper DRAM stack, and then returned to the controller on the DQu primary links.

It can be seen in the timing diagram of FIG. 6B, the incremental delay is added to the "y" transaction so the read data DQu and DQv arrive at the controller at approximately the same time. In this example, the delay to retransmit from the DQxab to DQu bus is approximately three clock cycles (e.g., about one nanosecond). This example provides one cycle for serialization latency (e.g., two data bits per clock cycle) plus two additional clock cycles for clock skew between the two DRAM stacks (±1 clock cycle).

It should be noted that in FIG. 6B the other DRAM stacks in the four DRAM stack set may be accessed with a high order address bit set differently in the CAx and CAy commands. It should also be noted that in FIG. 6B the DQt primary bus is not used; the interface circuitry on the DRAM stacks connected to this bus can be disabled by a control register field.

Transaction Detail—One Module

FIGS. 7A-7B show read transactions directed to a system with a single DRAM module and a continuity module present according to one embodiment. In this example, one RDIMM module is placed in one socket and a continuity module is placed in the other socket. The block diagram of FIG. 7A shows a section of the modules and the controller component with the interconnections of one of the nine pairs of DQ nibble groups, and the interconnections of the two primary CA buses CAx and CAy. The continuity module is labeled "Module x" and the DRAM module is labeled "Module y," matching the connections of the primary CA buses. The continuity module connects the DQu bus to the DQt bus; each of the four DQ links and the DQS link is connected with a controlled impedance wire which matches (approximately) the impedance of the motherboard wires. The CAx bus is not connected to anything on the continuity module.

The timing diagram of FIG. 7B shows the waveforms of the various CA and DQ buses. This timing diagram also indicates the nominal signaling rate of the various buses, assuming that the primary DQ signaling rate is 6.4 Gb/s. The relative signaling rate of the buses may scale up or down as the primary DQ rate changes.

In this example, each of the two read transactions includes an activate command (labeled "A" or "ACT"), a read command (labeled "R" or "RD"), and read data (labeled "36b×16"). The commands and data for each transaction may be pipelined. This means that they may occupy fixed timing positions with respect to the transaction and that the transactions may overlap other transactions.

It should be noted that the fixed timing positions may be shifted slightly from the positions in other configurations (as in FIG. 6B, for example). This may not cause a scheduling problem in the controller because these configurations are static. The configuration may be detected at system initialization, and after the appropriate control register field(s) is set, the configuration may not be changed.

The timing intervals that are used are shorter than what are present in a conventional memory system. For example, the ACT to RD command spacing (tRCD) is shown as 6.25 ns, but may be about 12.5 ns for a real DRAM component. This compression of the timing scale is done for clarity, and does not affect the technical accuracy and the pipeline timing may equally well with a tRCD delay of 6.25 ns.

There are other timing intervals shown in the FIG. 7B, namely $t_{BUF-CA}$ interval, $t_{RL}$ interval. The $t_{BUF-CA}$ interval (0.93 ns) is the propagation delay needed by the RCD buffer component to retransmit the information on the primary CA links to the secondary CA links. The $t_{RL}$ interval (3.125 ns) is the column read delay between the RD command and the read data needed by the DRAM. The $t_{BUF-DQ}$ interval of FIG. 6B does not appear in this example because all DRAM stacks have a direct primary connection to the controller. In other one-module configurations this propagation delay could be present if a DRAM stack needs to transfer its data through another DRAM stack on the module It should be noted that the diagram for write transactions may be similar, but with different fixed timing positions of commands and data.

In this example, the transaction granularity that is shown is 64 bytes; that is, there are enough command slots to allow each of the primary DQu and DQv slots to be filled with data. Each transaction performs a random row activation and column access on each 64 bytes ("36b×16"). Other transaction granularities are possible.

It should be noted that each byte is assumed to be 9b in size. This extra size accounts for the syndrome of an EDC (error detection and correction) code. In some implementations, if there are bank conflicts in the transaction stream, and if the transaction stream switches between read and write operations, then data slots will need to be skipped. This form of bandwidth inefficiency may be present in all memory systems. It should be noted that no additional resource conflicts are introduced by the modifications that have been made to this RDIMM memory system as described herein.

Referring to FIG. 7B, it can be seen that the "x" and "y" transactions begin with an activation command "A" on the CAy bus. The CAx bus is not used in this configuration. These buses have a point-to-point topology and a signaling rate of 1.6 GB/s (one-quarter the signaling rate of the point-to-point DQ buses).

The RCD buffer component on the y module receives the primary CAy bus and retransmits the information on the CAyb and CAya module buses. The CA module buses operate at 0.8 Gb/s, half the speed of the primary CA buses and ⅛th the speed of the primary DQ buses. This may result because the module CA buses have a multi-drop topology; each of the four module CA buses connects to about ¼ of the DRAM stacks on the module Referring to the FIG. 7B, it can be seen that the "ya" and "yb" transactions continue with a read command "R" on the CAy bus. This is retransmitted on the CAyb and CAya module buses. The two read transactions have accessed the two DRAM stacks that connect to the DQu and DQv nibble groups. The two transactions have each accessed one of the eight DRAMs in each selected stack.

In the case of an access to the primary DRAM, some additional delay may be added to the access time so that the read data is transmitted on the primary DQ in the same relative time slot (detail not shown in FIG. 7). This incremental delay may make it easier for the controller component to manage the memory pipeline.

Referring to FIG. 7A, it can be seen that the "yb" transaction accesses the lower DRAM stack. This means that the read data may be driven onto the DQt primary links through the continuity module, and then returned to the controller on the DQu primary links. The incremental propagation time of the "yb" read data through the continuity module may be small enough that it can be absorbed in the clock skew management circuitry, so the read data on DQu and DQv arrive at the controller at approximately the same time.

Direct Transfer Option within Module

Figure 8B:
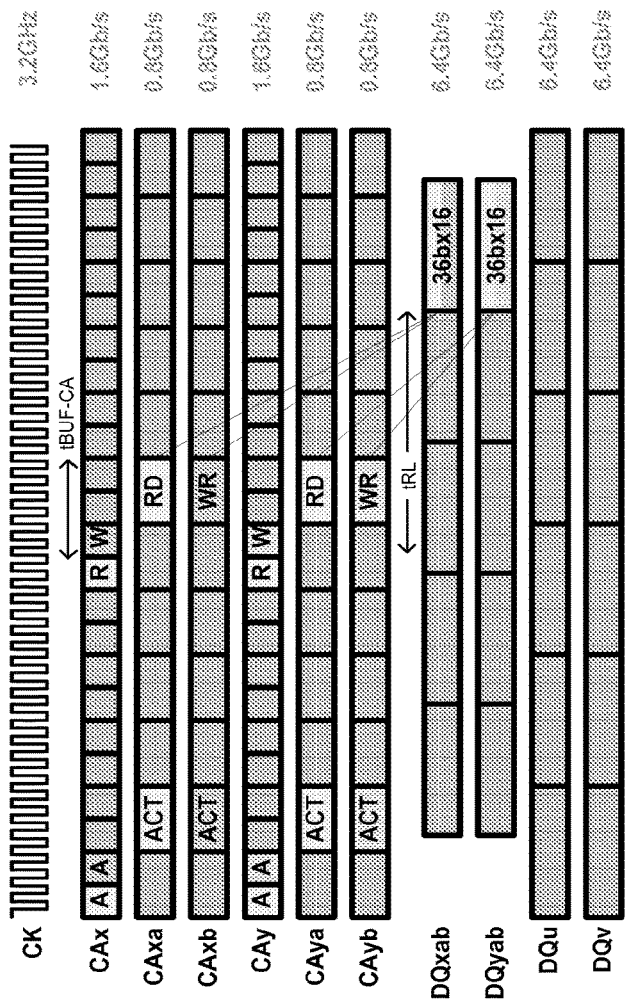
FIGS. 8A-8B show direct transfers between two DRAM stacks on the same module according to one embodiment.
Figure 8A:
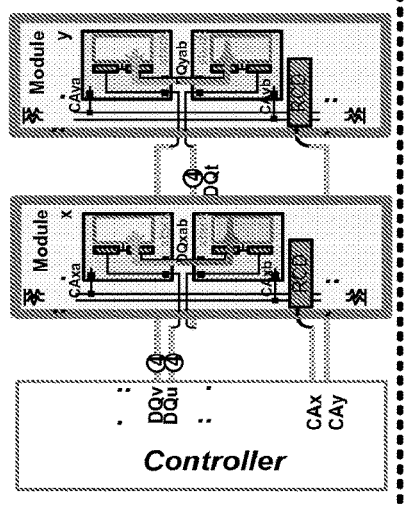

FIGS. 8A-8B show direct transfers between two DRAM stacks on the same module according to one embodiment. FIG. 8A shows how the interface logic can accommodate direct transfers between two DRAM stacks on the same module. In this example, the two sockets are populated with DRAM modules, similar to the example of FIG. 7A.

This transfer option is possible because the DRAM interface already needs the necessary interface logic to support maximum capacity modules and systems (this is the logic shown in FIG. 6).

The diagram of FIG. 8A shows a section of the modules and the controller component with the interconnections of one of the nine pairs of DQ nibble groups and the interconnections of the two primary CA buses CAx and CAy. The two modules are labeled "Module x" and "Module y," matching the connections of the primary CA buses. The timing diagram of FIG. 8B shows the waveforms of the various CA and DQ buses. This timing diagram also indicates the nominal signaling rate of the various buses, assuming that the primary DQ signaling rate is 6.4 Gb/s. The relative signaling rate of the buses may scale up or down as the primary DQ rate changes.

In this example, a transfer operation may involve a read transaction in one DRAM stack and a write transaction in a second DRAM stack (within the same module). This may be carried out simultaneously on each module, so that four transactions take place, twice as many as in the read transaction examples of FIGS. 6A and 7A.

In one implementation, each of the two read transactions includes an activate command (labeled "A" or "ACT"), a read command (labeled "R" or "RD"), and read data (labeled "36b×16"). Each of the two write transactions includes an activate command (labeled "A" or "ACT"), a write command (labeled "W" or "WR"), and write data (labeled "36b×16").

In this case, the write data that is used is generated by the read transaction. The timing of the write transaction (tWL) is configured to approximately match the read transaction ($t_{RL}$) with respect to the interval from the column command to the column date. The data is transferred on the shared DQ bus between the DRAM stacks (DQyab and DQxab in this case).

It should be noted that the timing is described as "approximately" matching. This language recognizes that each DRAM component may accommodate a small amount of variability in the timing of its interface. This may result because the position of the receive data and transmit data may drift over a small range during system operation.

In one embodiment, the interface is designed to accommodate this dynamic drift, with the result that any drift (within the allowed range) may not affect the operation of the memory system.

In one implementation, when the command-to-data interval for a write operation matches a read operation, the controller may need to account for the bank usage when a transfer transaction or a write transaction to a DRAM stack is followed by a read transaction to the same DRAM stack. This resource management is a key function performed by some memory controllers. In some implementations, the commands and data for each transaction may be pipelined. This means that they occupy fixed timing positions with respect to the transaction, and it also means that the transactions overlap other transactions.

In the depicted embodiment, the timing intervals that are used may be shorter than what are present in a typical system. For example, the ACT to RD command spacing (tRCD) is shown as 6.25 ns, but may be about 12.5 ns for a real DRAM component. This compression of the timing scale is done for clarity, and does not affect the technical accuracy; the pipeline timing works equally well with a tRCD delay of 6.25 ns. There are two other timing intervals shown in FIG. 7B.

There are two other timing intervals shown in the FIG. 8B, namely $t_{BUF-CA}$ interval, $t_{RL}$ interval. The $t_{BUF-CA}$ interval (0.93 ns) is the propagation delay needed by the RCD buffer component to retransmit the information on the primary CA links to the secondary CA links. The $t_{RL}$ interval (3.125 ns) is the column read delay between the RD command and the read data needed by the DRAM. The $t_{BUF-DQ}$ interval does not appear in this example because each DRAM read stack has a direct connection to the DRAM write stack destination. In other configurations, this propagation delay could be present if a DRAM read stack needs to transfer its data through another DRAM stack on the module to the DRAM write stack destination.

In this implementation, the transaction granularity that is shown is 64 bytes; that is, there are enough command slots to allow each of the primary DQu and DQv slots to be filled with data. Each transaction performs a random row activation and column access on each 64 bytes ("36b×16"). Other transaction granularities are possible. It should also be noted that each byte is assumed to be 9b in size. This extra size may account for the syndrome of an EDC (error detection and correction) code.

Returning to the timing diagram of FIG. 8B, it can be seen that the "x" and "y" transactions begin with an activation command "A" on the CAx and CAy buses. These buses have a point-to-point topology and a signaling rate of 1.6 GB/s (one-quarter the signaling rate of the point-to-point DQ buses).

In one embodiment, the RCD buffer component on each module may receive the primary CA bus and retransmits the information on the CAxa, CAxb, Cya, and CAyb module buses. It should be noted that all four of the CA module buses may be used for the transfer transaction.

In one embodiment, the CA module buses operate at 0.8 Gb/s, half the speed of the primary CA buses and ⅛th the speed of the primary DQ buses. This may result because the module CA buses have a multi-drop topology; each of the four module CA buses connects to about ¼ of the DRAM stacks on the module.

Returning to the timing diagram of FIG. 8B, it can be seen that the "x" and "y" transactions continue with two read commands "R" and two write commands "W" on the CAx and CAy buses. This is retransmitted as two read commands "RD" and two write commands "WR" on the CAxa, CAxb, Cya, and CAyb buses. The two read transactions have accessed two of the four DRAM stacks, and the two write transactions have accessed the other two DRAM stacks in this example.

FIG. 8A shows one of the nine sets of DRAM stacks on the modules. The four transactions have each accessed one of the eight DRAMs in each selected stack.

In the case of an access to the primary DRAM, some additional delay may be added to the access time so that the read data is transmitted on the primary DQ in the same relative time slot (note that this detail is not shown in FIG. 8A, but was previously shown in FIG. 5). This incremental delay makes it easier for the controller to manage the memory pipeline.

Returning to the FIG. 8A, it can be seen that the "x" read transaction accesses the upper DRAM stack. The read data may be driven onto the DQxab primary links to the lower DRAM stack, to be written to the selected DRAM. In the depicted embodiment, it can be seen that the "y" read transaction accesses the upper DRAM stack. The read data may be driven onto the DQyab primary links to the lower DRAM stack, to be written to the selected DRAM.

It should be noted that in FIG. 8A a different DRAM stack in the DRAM stack set may be accessed with a high order address bit set differently in the CAx and CAy commands.

Also, note that in FIG. 8A, the DQu, DQv, and DQt primary buses may not be used; the interface circuitry on the DRAM stacks connected to this bus can be disabled by a control register field during the transfer operation in one implementation.

Direct Transfer Option Between Modules

Figure 9B:
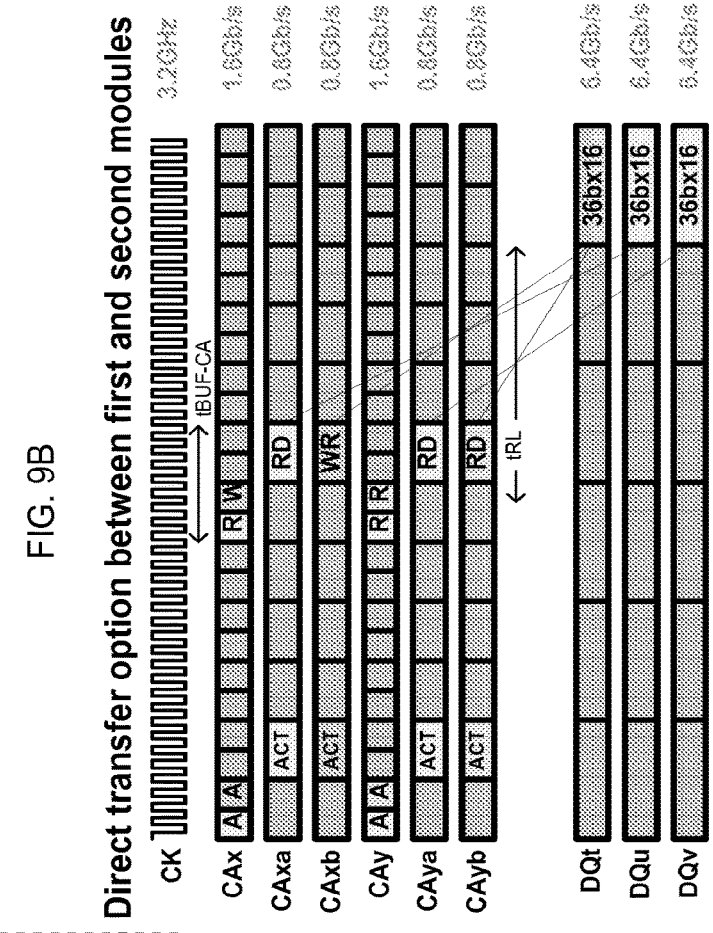
FIGS. 9A-9B show direct transfers between two DRAM stacks on different modules according to one embodiment.
Figure 9A:
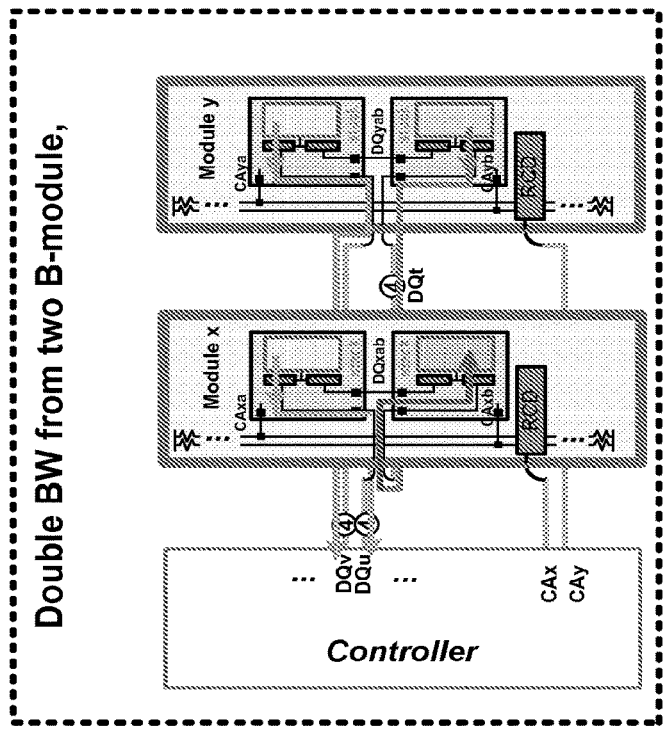

FIGS. 9A-9B show direct transfers between two DRAM stacks on different modules according to one embodiment. FIG. 9A show how the interface logic can accommodate direct transfers between two DRAM stacks on different modules. The system example is the same as that from FIG. 7A with two sockets populated with DRAM modules.

The diagram of FIG. 9A shows a section of the modules and the controller component with the interconnections of one of the nine pairs of DQ nibble groups and the interconnections of the two primary CA buses CAx and CAy. The two modules are labeled "Module x" and "Module y", matching the connections of the primary CA buses.

The timing diagram of FIG. 9B shows the waveforms of the various CA and DQ buses. This timing diagram also indicates the nominal signaling rate of the various buses, assuming that the primary DQ signaling rate is 6.4 Gb/s. The relative signaling rate of the buses may scale up or down as the primary DQ rate changes.

In this example, a transfer operation involves a read transaction in one DRAM stack and a write transaction in a second DRAM stack (within different modules). This may be carried out simultaneously with two additional read transactions, so that four transactions take place, twice as many as in the read transaction examples of FIGS. 6A and 7A.

In one implementation, each of the three read transactions includes an activate command (labeled "A" or "ACT"), a read command (labeled "R" or "RD"), and read data (labeled "36b×16"). The single write transaction may include an activate command (labeled "A" or "ACT"), a write command (labeled "W" or "WR"), and write data (labeled "36b×16").

In this case, the write data that is used is generated by one of the read transactions. The timing of the write transaction is configured to approximately match the read transaction with respect to the interval from the column command to the column date. The data is transferred on the shared DQ bus between the two modules (DQt).

In one implementation, when the command-to-data interval for a write operation matches a read operation, the controller may need to account for the bank usage when a transfer transaction or a write transaction to a DRAM stack is followed by a read transaction to the same DRAM stack. This resource management is a key function performed by some memory controllers. In some implementations, the commands and data for each transaction may be pipelined. This means that they occupy fixed timing positions with respect to the transaction, and it also means that the transactions overlap other transactions.

In the depicted embodiment, the timing intervals that are used may be shorter than what are present in a typical system. For example, the ACT to RD command spacing (tRCD) is shown as 6.25 ns, but may be about 12.5 ns for a real DRAM component. This compression of the timing scale is done for clarity, and does not affect the technical accuracy; the pipeline timing works equally well with a tRCD delay of 6.25 ns. There are two other timing intervals shown in FIG. 9B.

There are two other timing intervals shown in the FIG. 9B, namely $t_{BUF-CA}$ interval, $t_{RL}$ interval. The $t_{BUF-CA}$ interval (0.93 ns) is the propagation delay needed by the RCD buffer component to retransmit the information on the primary CA links to the secondary CA links. The $t_{RL}$ interval (3.125 ns) is the column read delay between the RD command and the read data needed by the DRAM. The $t_{BUF-DQ}$ interval does not appear in this example because each DRAM stack has a direct connection its destination (e.g., to the controller or to the DRAM write stack). In other configurations, this propagation delay could be present if a DRAM read stack needs to transfer its data through another DRAM stack on the module to the DRAM write stack destination.

In this implementation, the transaction granularity that is shown is 64 bytes; that is, there are enough command slots to allow each of the primary DQu and DQv slots to be filled with data. Each transaction performs a random row activation and column access on each 64 bytes ("36b×16"). Other transaction granularities are possible. It should also be noted that each byte is assumed to be 9b in size. This extra size may account for the syndrome of an EDC (error detection and correction) code.

Returning to FIG. 9B, it can be seen that the "x" and "y" transactions begin with an activation command "A" on the CAx and CAy buses. These buses have a point-to-point topology and a signaling rate of 1.6 GB/s (one-quarter the signaling rate of the point-to-point DQ buses).

The RCD buffer component on each module receives the primary CA bus and retransmits the information on the CAxa, CAxb, Cya, and CAyb module buses. It should be noted that all four of the CA module buses may be used for the transfer transaction.

In one embodiment, the CA module buses operate at 0.8 Gb/s, half the speed of the primary CA buses and ⅛th the speed of the primary DQ buses. This is because the module CA buses have a multi-drop topology; each of the four module CA buses connects to about ¼ of the DRAM stacks on the module.

Returning to FIG. 9B, it can be seen that the "x" and "y" transactions continue with three read commands "R" and one write command "W" on the CAx and CAy buses. This is retransmitted as three read commands "RD" and one write command "WR" on the CAxa, CAxb, CAya, and CAyb buses. The three read transactions have accessed three of the four DRAM stacks, and the write transaction has accessed the other DRAM stack in this example.

FIG. 9B shows one of the nine sets of DRAM stacks on the modules. The four transactions have each accessed one of the eight DRAMs in each selected stack.

In the case of an access to the primary DRAM, some additional delay may be added to the access time so that the read data is transmitted on the primary DQ in the same relative time slot (note that this detail is not shown in FIG. 8, but was previously shown in FIG. 5). This incremental delay makes it easier for the controller to manage the memory pipeline.

Returning to FIG. 9B, it can be seen that the "x" read transaction accesses the upper DRAM stack. The read data may be driven onto the DQu primary links to controller. In the depicted embodiment, it can be seen that the "y" read transaction accesses the upper DRAM stack. The read data may be driven onto the DQv primary links to the controller component. The second "y" read transaction accesses the lower DRAM stack. The read data may be driven onto the DQt primary links to the lower DRAM stack of module "x," to be written to the selected DRAM.

It should be noted that in FIG. 9A a different DRAM stack in the DRAM stack set may be accessed with a high order address bit set differently in the CAx and CAy commands.

Also, as note that in FIG. 9A, the DQxab and DQyab primary buses may not be used; the interface circuitry on the DRAM stacks connected to this bus can be disabled by the command decode logic in the primary DRAM of each stack.

Incremental Latency Table

FIG. 10 shows the incremental read latency seen by a controller component for the various module and channel configurations according to one embodiment. In this embodiment, this table uses latency units which make some assumptions about DRAM to DRAM communication. The previous examples assumed that this latency unit is approximately three clock cycles (about one nanosecond). The delay from the DQ interface of one DRAM stack to the DQ interface of a different DRAM stack includes two components:

[1] one cycle for serialization latency (two data bits per clock cycle) plus [2] two additional clock cycles for clock skew between the two DRAM stacks (±1 clock cycle). With a 3.2 GHz clock, these three clock cycles are a bit less than one nanosecond. The latency table is organized according to [1] the number of sockets per channel (either one SPC or two SPC),
[2] the number of DIMMs per channel (either one DPC or two DPC), and [3] the number of DRAM stacks per module (e.g., thirty-six, eighteen, or nine). Each stack can hold (typically) four or eight DRAMs.

The incremental latency column indicates the additional read delay seen by the worst case DRAM stack, compared to the minimum capacity examples.

The table shows that only a pair of maximum capacity modules (with thirty-six device stacks) may see the maximum incremental latency (+3 units, or about 3 ns). Three other configurations may see a smaller incremental latency (+1 unit, or about 1 ns). The remaining configurations see no incremental latency. These incremental latencies are relatively small compared to the ~30 ns read latency for a row/column access and the ~50 ns for a bank cycle time.

Alternatively, in other embodiments, other latencies for the various configurations may be achieved.

DQ-DQS Phase Mode & Domain Crossing Detail for DRAM Interface

Figure 11:
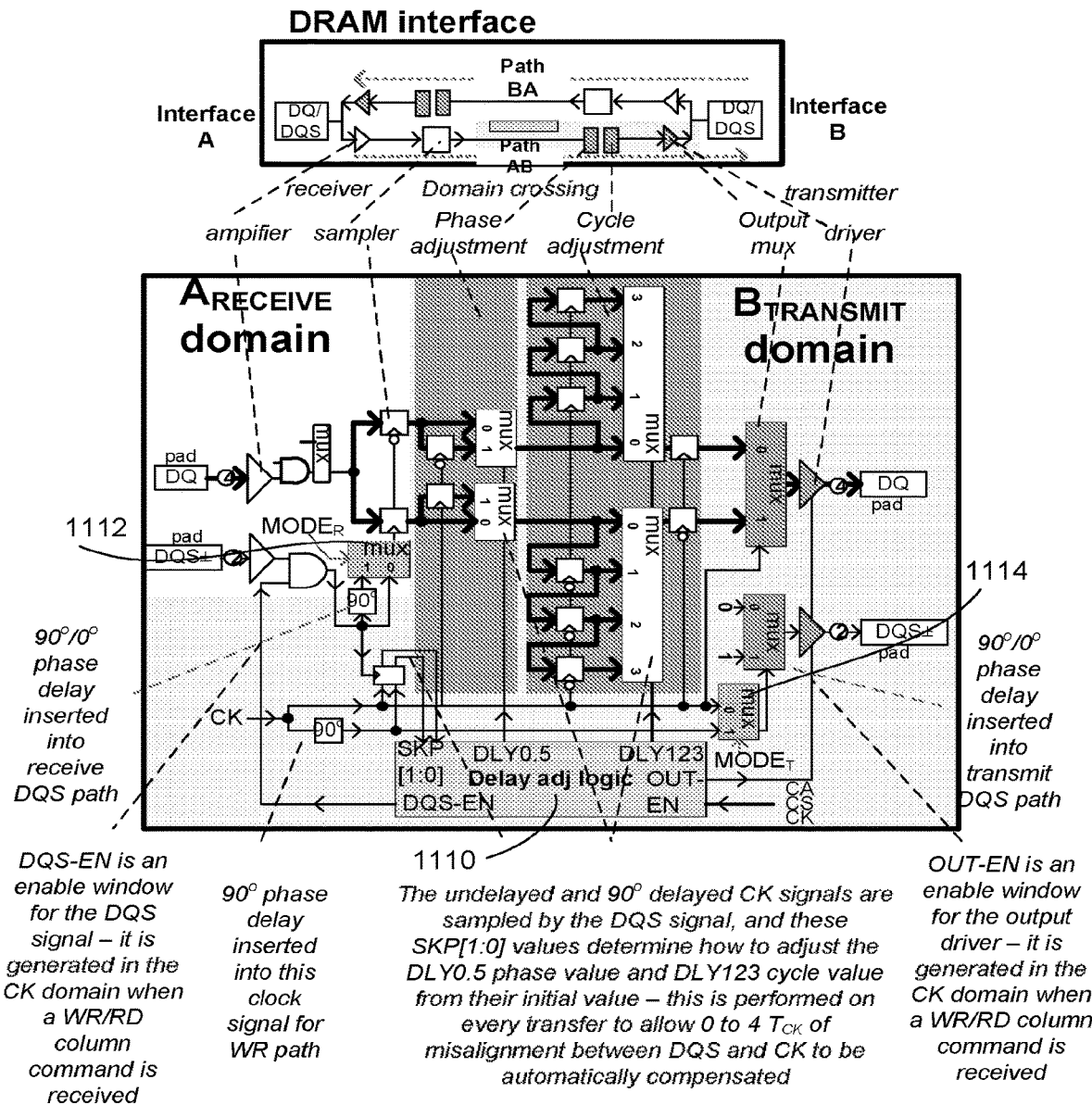
FIG. 11 shows additional details for a receive-to-transmit path between the DQa and DQb interfaces in the primary DRAM component according to one embodiment.

FIG. 11 shows additional details for a receive-to-transmit path between the DQa and DQb interfaces in the primary DRAM component according to one embodiment. The reverse path from DQb to DQa may be similar. The first order detail was shown earlier in FIG. 5. Most of the DRAM operates in a clock domain created from the CLK link which accompanies the CA bus. This domain is shown in blue in FIG. 9 and is labeled BTRANSMIT.

There is a small part of the interface on the left which operates in the domain of the received DQS timing signal for the DQA interface. It is labeled ARECEIVE. The block 1110 at the bottom of FIG. 11 contains the control logic needed to perform the domain-crossing function between the ARECEIVE and BTRANSMIT domains. This block 1110 operates in the BTRANSMIT domain. The domain-crossing logic is described in detail below. The multiplexers 1112 and 1114 may be used to enable the modified memory system described above. These blocks may be multiplexer circuits with selector inputs driven from control register fields (the selector signals are labeled "MODER" and "MODET"). The selector signals may be used to adjust the phase relationship between DQ and DQS for both receive and transmit blocks.

FIG. 11 also shows the domain-crossing logic. The domain-crossing logic may have the control register fields set to specific values to illustrate how the interface may be initially configured and maintained. The waveforms of six internal nodes are shown in the accompanying timing diagrams, along with the data input and data output signals.

In the depicted embodiment, each primary data link DQIN (ARECEIVE domain) is sampled by the primary timing link DQSIN at the rising and falling edges (because MODER=0, inserting zero degrees of delay into the DQS path). This may result in two sampled values Y and Z held on the DQY0 and DQZ0 register outputs in the DQS domain. It should be noted that the DQS-EN signal is formed in the CK domain (shown in the delay adjustment logic 1110) and gates the DQSIN signal. In some cases, this may be extended if the data transfer is longer. This example assumes the DQS and CK signals are aligned so the SKP[1] value sampled from CK+90° by DQS is LOW. The DLY0.5 control value was set by the SKP[1] value on the previous WR transfer, so the control value is also low.

Figure 12:
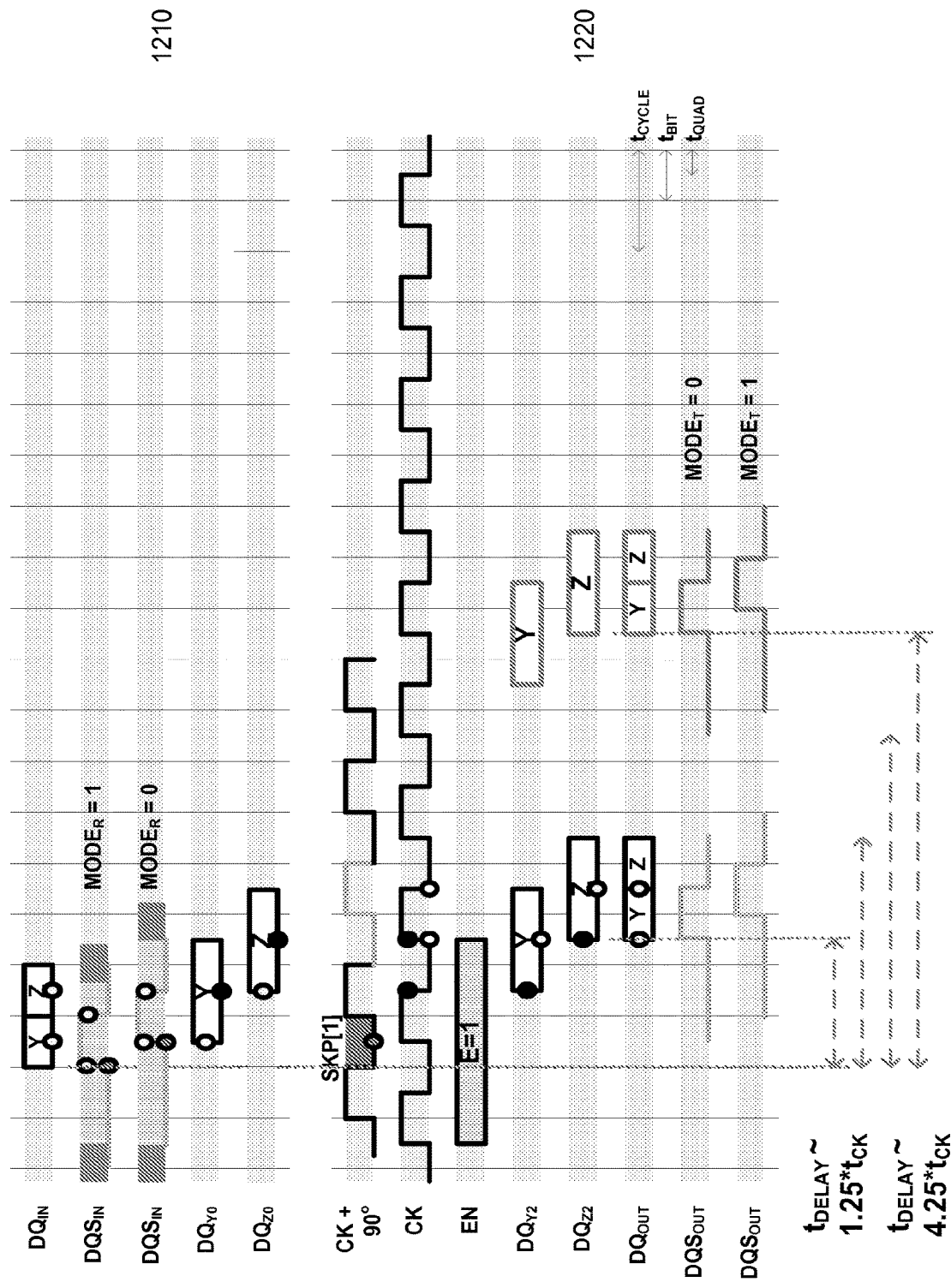
FIG. 12 shows timing relationships with the two sets of waveforms according to one embodiment.

FIG. 12 shows timing relationships with the two sets of waveforms 1210, 1220 according to one embodiment. The top set 1210 of waveforms show the DQIN and DQSIN timing relationship for the ARECEIVE domain. When MODER is one, DQSIN is edge-aligned; DQSIN and DQIN make transitions which are approximately aligned (in-phase). When MODER is zero, DQSIN is center-aligned; DQSIN and DQIN make transitions which are not aligned (out-of-phase). The alignment is approximately 90°, meaning that DQSIN transitions are approximately midway between the DQIN transitions. In some cases, it may be necessary for the modified DRAM interface to receive data with either phase alignment. For example, the center alignment may be used for write data, and the edge alignment may be used for read data. This modal configurability of the DRAM interface may permit the DRAM to transfer either read or write data from one interface to the other for some of the system configurations.

The bottom set 1220 of waveforms shows the DQOUT and DQSOUT timing relationship for the ATRANSMIT domain. When MODET is zero, DQSOUT is edge-aligned;

DQSOUT and DQOUT make transitions which are approximately aligned (in-phase). When MODER is one, DQSOUT is center-aligned; DQSOUT and DQOUT make transitions which are not aligned (out-of-phase). The alignment is approximately 90°, meaning that DQSOUT transitions are approximately midway between the DQOUT transitions.

In some cases, it may be necessary for the modified DRAM interface to receive data with either phase alignment. For example, the center alignment may be used for write data, and the edge alignment may be used for read data. This modal configurability of the DRAM interface may permit the DRAM to transfer either read or write data from one interface to the other for some of the system configurations.

DRAM Module with DB Buffer

Figure 13B:
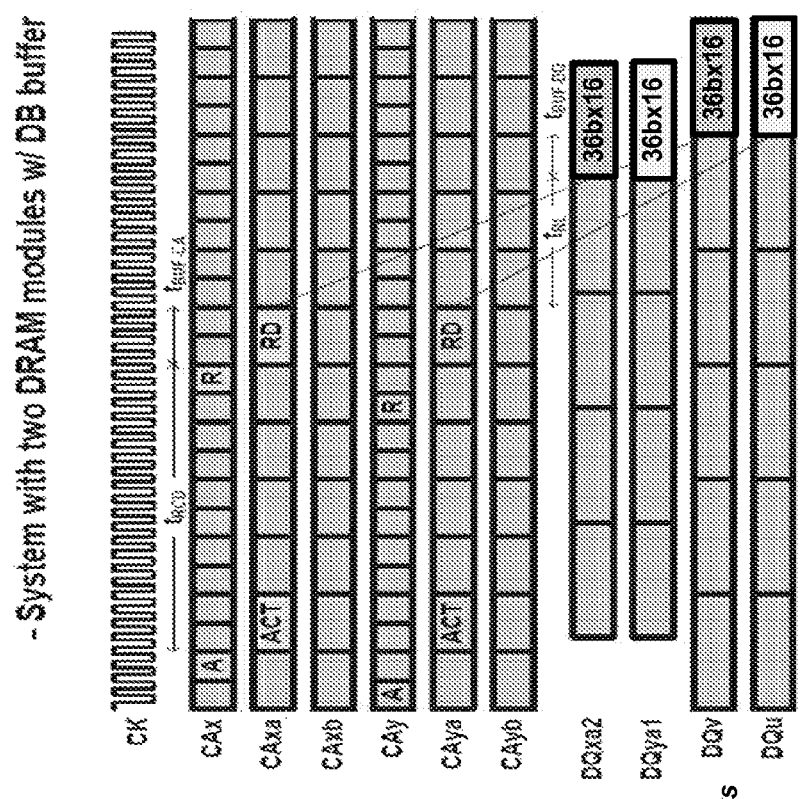
FIGS. 13A-13B shows memory modules with DB buffers according to another embodiment.
Figure 13A:
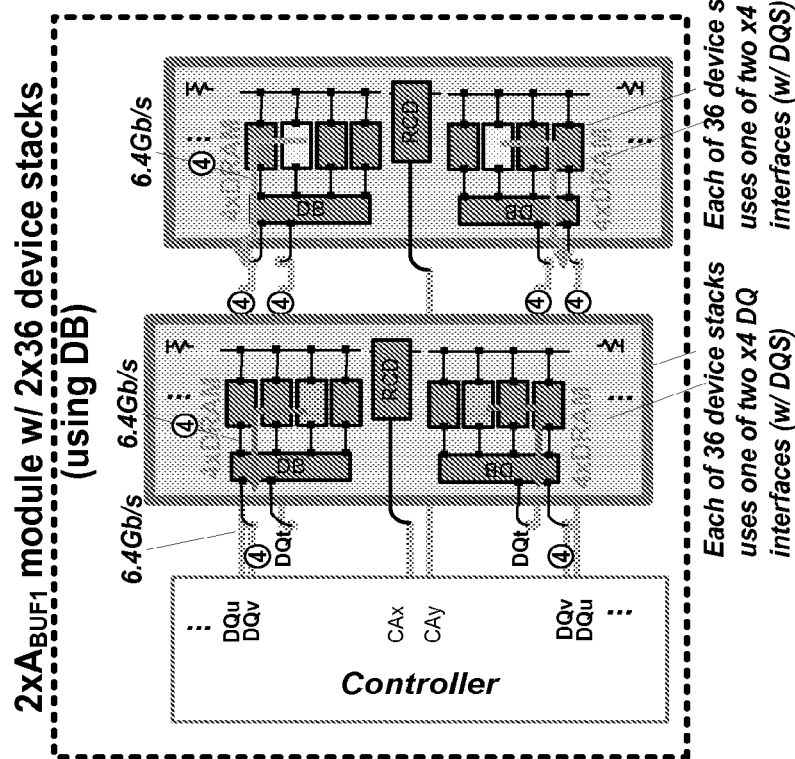

FIGS. 13A-13B shows memory modules with DB buffers according to another embodiment. This system includes two DRAM modules connected to a controller component. Each of nine pairs of primary DQ nibble groups (DQu and DQv) connects to the two modules, with a third primary DQt nibble group connecting the modules. This interconnection pattern on the motherboard allows the system to be configured with two DRAM modules (as in FIG. 6) or with one DRAM module and one continuity module (as in FIG. 7).

The memory modules of FIG. 13A differ from the memory modules of FIG. 6 in the way the components are connected on the module. Each pair of primary DQ nibble groups connects to a DB buffer component. There are nine DB buffer components on each module. These DB buffer components operate in parallel.

In other embodiments, other functionally equivalent embodiments could merge two or more DB buffers together. For example, there could be three DB components per module, with each DB component connected to three pairs of primary DB nibble groups.

In this implementation, each DB buffer has four nibble groups of secondary links, each with four DQ data links and a differential DQS timing link. These secondary links are operated at the same data rate as the primary links (6.4 Gb/s as in FIG. 6). Each secondary nibble group connects to a DRAM stack similar to the one shown in previous system configurations (see FIG. 5, for example).

Alternatively, each secondary nibble group could connect to a single DRAM component, similar to the primary DRAM shown in DRAM stacks in previous system configurations (see FIG. 5, for example). In this case, there may be no secondary DRAMs, and no TSV connections.

A third alternative may be to use place a pair of stacked DRAM packages at each DRAM site in FIG. 13A. Four sets of DRAM package pairs would connect to each DB buffer component.

In the first two cases, the secondary DQ links may have a simple point-to-point topology, permitting a signaling rate that matched that of the primary DQ links.

In the third alternative, the secondary DQ links may have a point-to-two-point topology, which would have a slightly reduced signaling rate relative to the other two alternatives.

It should be noted that the second and third options is that the module may hold 72 DRAM components without resorting to TSV stacking technology (e.g., thirty-six device sites per module, with two DRAMs stacked at each device site). The package stacking technology is more mature than TSV technology, and this option could offer a cost advantage for some module capacities.

In this embodiment, as compared with FIG. 6, the DRAM stack (or single DRAM) may only require a single nibble group interface. Instead, the DB buffer component would have the two nibble group interfaces.

These interfaces may be similar to DQa and DBb interfaces shown in the primary DRAM in FIG. 5. Control register fields may be used at initialization to set the configuration mode (i.e. the number of modules present, the number of DRAM stacks present, etc.).

The timing diagram of FIG. 13B is similar to the timing diagram of FIG. 5B. The waveforms of the primary CA and primary DQ links are shown, along with the 3.2 GHz primary clock signal. The primary CA links have ¼ the signaling rate of the DQ links (6.4 Gb/s) as in FIG. 5A. Other embodiments could have other signaling rates.

The configuration of the DRAM component in FIG. 13A may avoid the cost of the second interface, but the additional DB components may add to the cost of the module.

DRAM Module w/DB (Half-Rate Secondary)

Figure 14B:
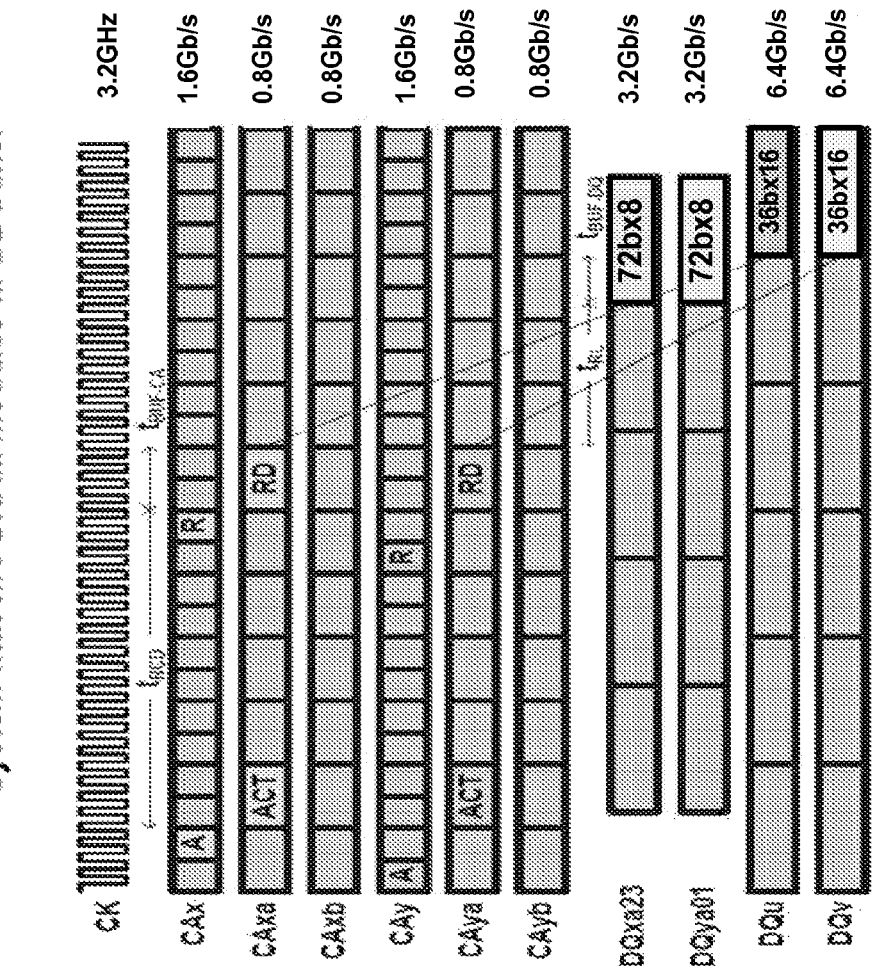
FIGS. 14A-14B shows memory modules with DB buffers and half-rate secondary DQ links according to another embodiment.
Figure 14A:
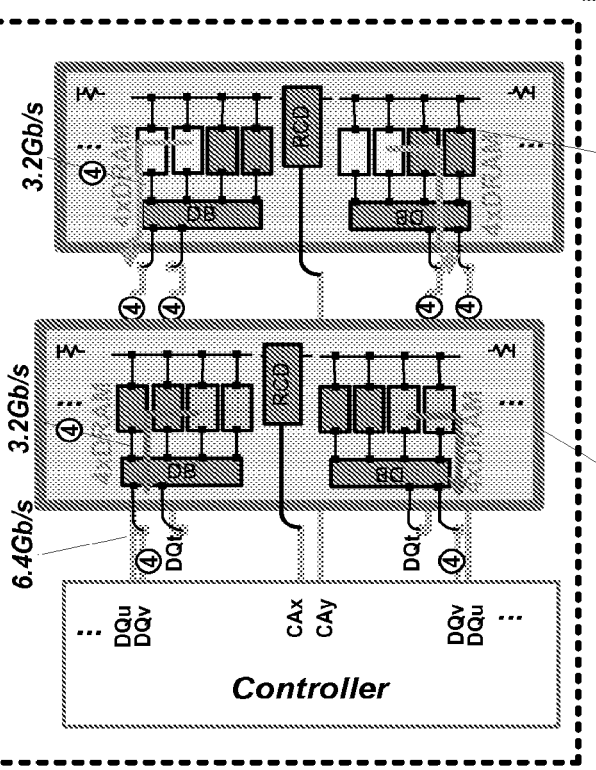

FIGS. 14A-14B shows memory modules with DB buffers and half-rate secondary DQ links according to another embodiment. This system includes two DRAM modules connected to a controller component. Each of nine pairs of primary DQ nibble groups (DQu and DQv) connects to the two modules, with a third primary DQt nibble group connecting the modules. This interconnection pattern on the motherboard allows the system to be configured with two DRAM modules (as in FIG. 6A) or with one DRAM module and one continuity module (as in FIG. 5B).

FIG. 14A differs from FIG. 6A in the way the components are connected on the module. In FIG. 14A, each pair of primary DQ nibble groups connects to a DB buffer component. There are nine DB buffer components on each module. These DB buffer components operate in parallel.

In other embodiments, other functionally equivalent embodiments could merge two or more DB buffers together. For example, there could be three DB components per module, with each DB component connected to three pairs of primary DB nibble groups.

In this implementation, each DB buffer has four nibble groups of secondary links, each with four DQ data links and a differential DQS timing link. These secondary links are operated at ½ the data rate as the primary links; the primary links would run at a 6.4 Gb/s, and the secondary links would run at a 3.2 Gb/s rate). Each secondary nibble group connects to a DRAM stack similar to the one shown in previous system configurations (see FIG. 5, for example).

Alternatively, each secondary nibble group could connect to a single DRAM component, similar to the primary DRAM shown in DRAM stacks in previous system configurations (see FIG. 5, for example). In this case, there may be no secondary DRAMs, and no TSV connections.

A third option may be to connect each secondary nibble group to a pair of package-stacked DRAM components. The secondary link topology of this option is point-to-two-point, but would not be an issue since the secondary data links are deliberately being run at half the rate of the primary data links.

The second and third options may permit the module to hold 72 DRAM components without resorting to TSV stacking technology (e.g., thirty-six device sites per module, with two DRAMs stacked at each device site). The package stacking technology is more mature than TSV technology, and this option could offer a cost advantage for some module capacities.

In some embodiments, the DRAM interface in these three options may need to only operate at half the speed of the primary links and only the controller and DB components operate at the highest signaling rate (6.4 Gb/s in this example). One consequence of this may be that pairs of DRAMs must be accessed so that their 3.2 Gb/s data rates can be aggregated into a 6.4 Gb/s data rate. This is indicated in FIG. 14A with the two shaded pairs of DRAMs being accessed for each transaction.

As in FIG. 13A, the system in FIG. 14A may be configured so that each DRAM stack (or single DRAM) has only a single nibble group interface. Instead, the DB buffer component would have the two primary nibble group interfaces.

These interfaces may be similar to DQa and DBb interfaces shown in the primary DRAM in FIG. 5. Control register fields may be used at initialization to set the configuration mode (i.e. the number of modules present, the number of DRAM stacks present, etc.).

The timing diagram of FIG. 14B is similar to the timing diagram of FIG. 6A. The waveforms of the primary CA and primary DQ links are shown, along with the 3.2 GHz primary clock signal. The primary CA links have ¼ the signaling rate of the DQ links (6.4 Gb/s) as in FIG. 6A. Other embodiments could have other signaling rates.

In this implementation, for each transaction, each of the DRAMs in the active pairs of DRAMs may each supply 4b×8 of data at 3.2 Gb/s to a DB component. Each DB component would supply 4b×16 of data at 6.4 Gb/s on the primary links. The nine DB components would supply 36b×16 of data at 6.4 Gb/s on the primary links.

As in FIG. 13A, one possible advantage of the configuration of FIG. 14A is that the DRAM component may avoid the cost of the second interface, but the additional DB components may add to the cost of the module. It should be noted that the memory module may utilize slower DRAMs (half-rate interface speed) resulting in a potential cost saving. In addition, these slower DRAMs may use a shallower x8 prefetch, compatible with legacy components. Also, in some cases, one of the options may utilize package-stacked DRAMs (multi-drop secondary link topology running at half-rate interface speed), also resulting in a potential cost saving.

Two DRAM Modules w/Clocked DQ Links

Figures 15A, 15B:
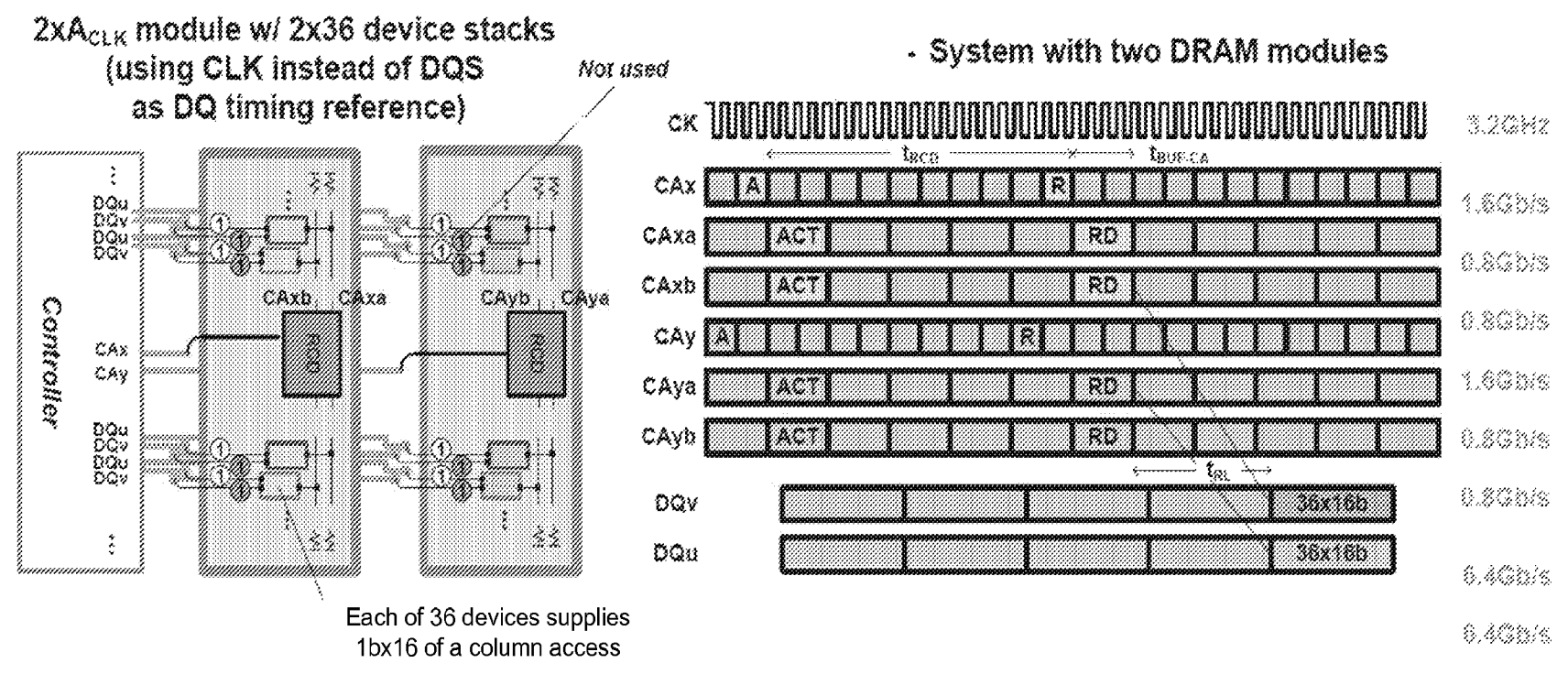

FIGS. 15A-15B shows two memory modules with clocked DQ links according to another embodiment. This system includes two DRAM modules connected to a controller component. The primary DQ links have been grouped into thirty-six pairs of single DQ data links. Further, the controller interface and DRAM interface have been modified so that the timing signals needed for transmitting and receiving data are not communicated with links that accompany the data (the DQS links used in FIG. 6). Instead, the clock link CLK that is included in the CA group is used as a frequency and phase source for DQ as well as CA. The timing events that are used for transmitting and receiving data are synthesized from the CLK link using phase interpolation circuits. The phase interpolation values needed by each DRAM may be generated by a process at initialization, and maintained by a periodic calibration process.

This change to the clocking system may provide the benefit: the minimum number of links which connect to a single DRAM may no longer be limited by the size of the data link group which shares a DQS timing signal. This means that, instead of each DRAM containing two nibble-group (x4) DQ interfaces (as in FIG. 6), each DRAM can contain two data link groups which are each one link (x1). The result can be seen in FIG. 15A. The 72 data links connect to the controller component, and each data links connects to one primary DRAM (of a DRAM stack). There is room for thirty-six DRAM stacks on each of the two modules, meaning that there is no need to couple any of the DRAM stacks together on the module (as in FIG. 4, for example).

In FIG. 15A, each DRAM has two x1 DQ interfaces (similar to FIG. 4, but one bit wide instead of four bits wide). In the two module configuration in FIG. 14A, one DQ interface of each DRAM of one module connects to a motherboard trace to one DQ bit of each DRAM of the other module. This path is not used in the two module configuration.

The timing diagram of FIG. 15B is similar to the timing diagram of FIG. 6. The waveforms of the primary CA and primary DQ links are shown, along with the 3.2 GHz primary clock signal. The primary CA links have ¼ the signaling rate of the DQ links (6.4 Gb/s) as in FIG. 6. Other embodiments could have other signaling rates.

One possible advantage of the configurations of FIG. 15A is that the DRAM component may avoid the latency cost of transferring the data through a DRAM in the high capacity configurations. The DRAM may also avoid the cost of a second x4 DQ interface (but may implement an interface with a configurable width—{x1,x2,x4} to support the same configurations listed in FIG. 8). This interface clocking of the DRAM and the controller component may need to be modified when using this alternative embodiment.

One DRAM Module w/Clocked DQ Links

Figure 16B:
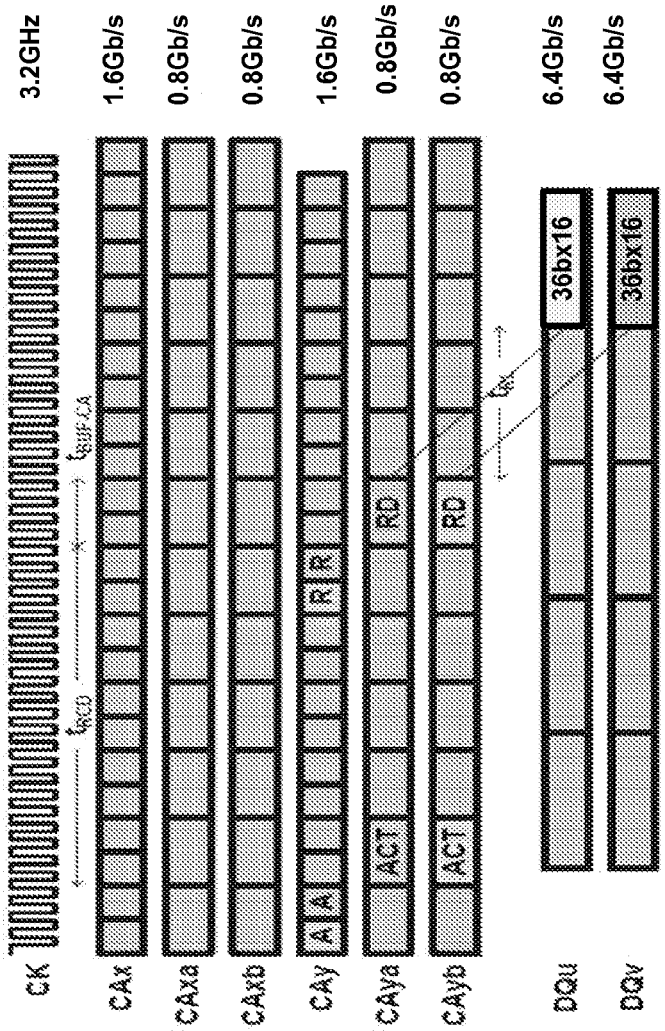
FIGS. 16A-16B shows one memory module with clocked DQ links according to another embodiment.
Figure 16A:
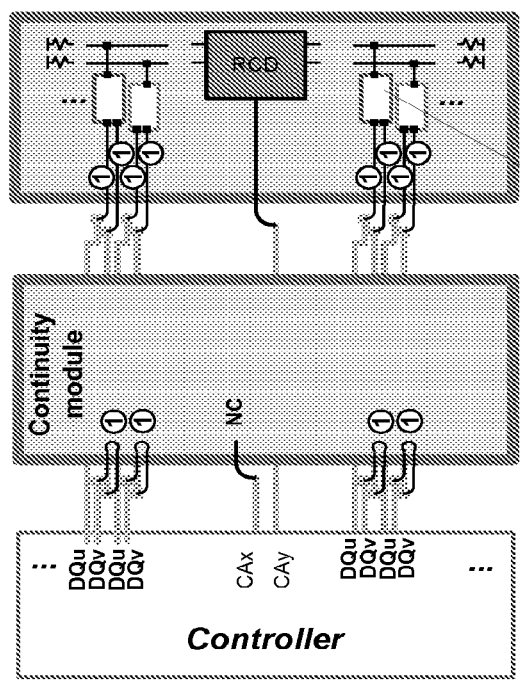

FIGS. 16A-16B shows one memory module with clocked DQ links according to another embodiment. This system includes one DRAM module connected to a controller component. The primary DQ links have been grouped into thirty-six pairs of single DQ data links. Further, the controller interface and DRAM interface have been modified so that the timing signals needed for transmitting and receiving data are not communicated with links that accompany the data (the DQS links used in FIG. 7). It should be noted that this timing method may be similar to the timing used in FIG. 15B.

The clock link CLK that is included in the CA group is used as a frequency and phase source for DQ as well as CA. The timing events that are used for transmitting and receiving data are synthesized from the CLK link using phase interpolation circuits. The phase interpolation values needed by each DRAM may be generated by a process at initialization, and maintained by a periodic calibration process.

This change to the clocking system may result in the following benefit: the minimum number of links which connect to a single DRAM may no longer be limited by the size of the data link group which shares a DQS timing signal. This means that, instead of each DRAM containing two nibble-group (x4) DQ interfaces (as in FIG. 6), each DRAM can contain two data link groups which are each one link (x1). The result can be seen in FIG. 16A. The 72 data links connect to the controller component, and each pair of data links connects to one primary DRAM (of a DRAM stack). There is room for thirty-six DRAM stacks on the single module, meaning that there is no need to couple any of the DRAM stacks together on the module (as in FIG. 5, for example).

In this embodiment, the second socket of FIG. 16A contains a continuity module instead of a DRAM module, as in the case of FIG. 15A. In the one module configuration in FIG. 16A, both DQ interfaces of each DRAM of one module connects to the controller component, with half of the connections flowing through a continuity module. The topology looks like FIG. 7, but with each DRAM having two x1 interfaces rather than two x4 interfaces.

The timing diagram of FIG. 16B is similar to the timing diagram of FIG. 7. The waveforms of the primary CA and primary DQ links are shown, along with the 3.2 GHz primary clock signal. The primary CA links have ¼ the signaling rate of the DQ links (6.4 Gb/s) as in FIG. 7. Other embodiments could have other signaling rates.

One possible advantage of the configuration of FIG. 16A is that the DRAM component may avoid the latency cost of transferring the data through a DRAM in the high capacity configurations. The DRAM may also avoid the cost of a second x4 DQ interface, but may be implemented with an interface with a configurable width—{x1,x2,x4} to support the same configurations listed in FIG. 8. The interface clocking of the DRAM may have to be modified in this alternative embodiment.

The waveforms of six internal nodes are shown in the accompanying timing diagrams, along with the data input and data output signals.

WR Timing Detail DQ-BUF-SKP[1]=0

Figure 17:
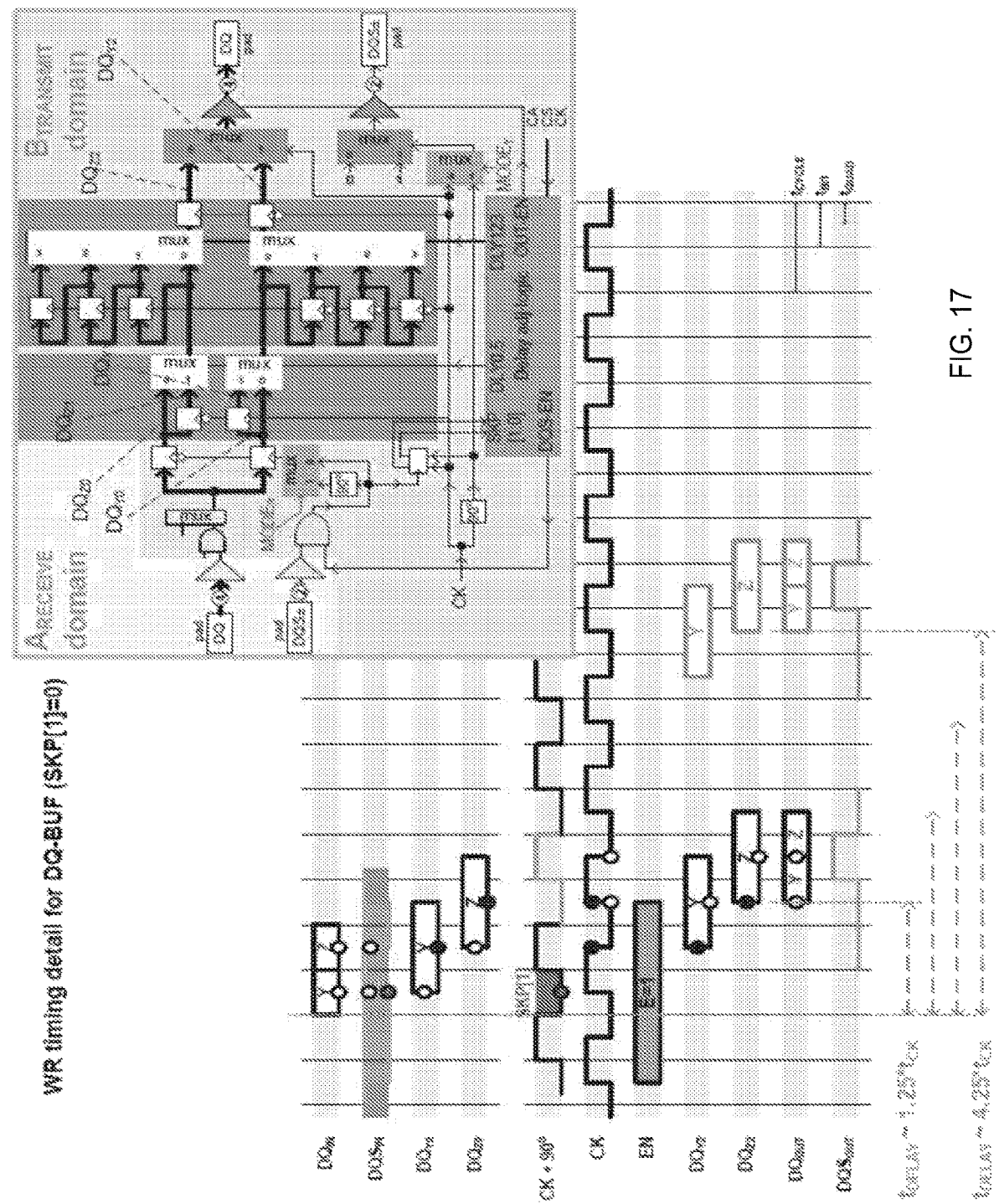
FIG. 17 is a timing diagram of a write operation for the DQ buffer according to one embodiment.

FIG. 17 is a timing diagram of a write operation for the DQ buffer according to one embodiment. FIG. 17 illustrates what happens when the new SKP[1] sampled value does not match the previous one because of drift between the DQS and CK domains. The low value on the DLY0.5 control causes the DQY0 and DQZ0 values to be passed through the multiplexers in the phase adjustment block. The value on the DLY123[1:0] control is assumed to be 00, which causes the DQY0 and DQZ0 values to be passed through the multiplexers in the cycle adjustment block, as well. The DQY0 and DQZ0 values may be sampled by the DQY2 and DQZ2 registers and may have crossed into the CK domain (BTRANSMIT domain) at this point. The DQY2 and DQZ2 registers drive the output multiplexer, which in turn drives the output driver for the secondary link group.

A DQS output may be created from the delay adjustment logic. The DQS may be driven using the CK+90° signal, since the MODET=1 value causes 90 degrees of delay to be inserted to the DQS value. If the value on the DLY123[1:0] control is assumed to be 11, the DQY0 and DQZ0 values may be delayed by a three cycle pipeline. The data and timing signal may appear on the secondary links 3*tCK later than for the previous case. This allows the delay through the DQS-to-CK domain crossing to be adjusted in one cycle increments.

WR Timing Detail DQ-BUF-SKP[1]=1

Figure 18:
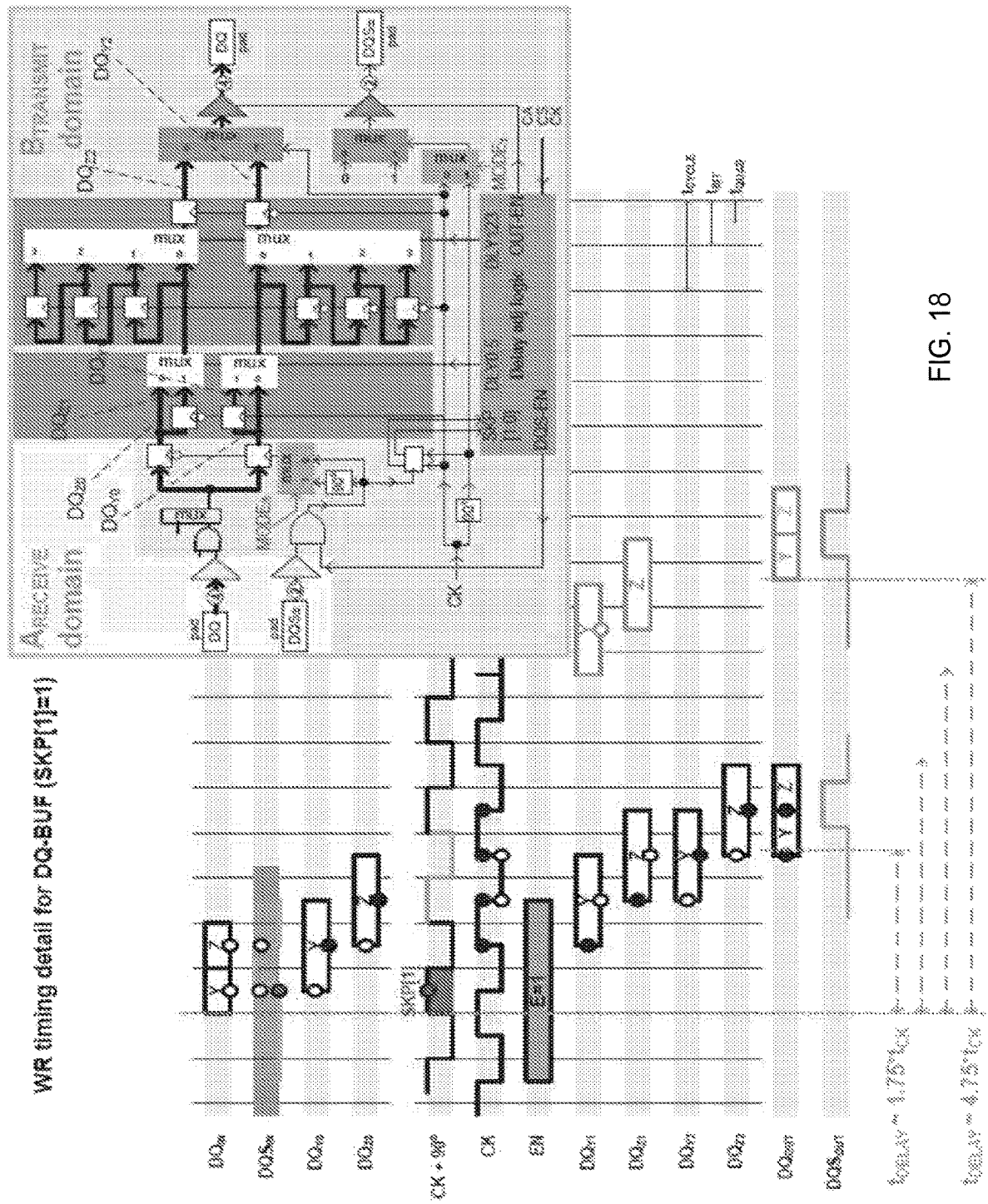
FIG. 18 is a timing diagram of a write operation for the DQ buffer according to another embodiment.

FIG. 18 is a timing diagram of a write operation for the DQ buffer according to another embodiment. FIG. 18 is similar to FIG. 17, except that it assumes the DQS and CK signals are aligned so the SKP[1] value sampled from CK+90° by DQS is high.

The waveforms of six internal nodes are shown in the FIG. 18, along the primary data input and secondary data output signals. Each primary data link DQIN is sampled by the primary timing link DQSIN at the rising and falling edges, resulting in two sampled values Y and Z held on the DQY0 and DQZ0 register outputs in the DQS domain.

It should be noted that the DQS-EN signal is formed in the CK domain and gates the DQSIN signal. This delay may be extended if the data transfer is longer.

This example assumes the DQS and CK signals are aligned so the SKP[1] value sampled from CK+90° by DQS is HIGH. The DLY0.5 control value was set by the SKP[1] value on the previous WR transfer, so the control value is also high.

FIG. 18 illustrates what happens when the new SKP[1] sampled value does not match the previous one because of drift between the DQS and CK domains. The high value on the DLY0.5 control causes the DQY0 and DQZ0 values to be sampled by the DQY1 and DQZ1 registers and passed through the multiplexers in the phase adjustment block. The value on the DLY123[1:0] control is assumed to be 00, which causes the DQY1 and DQZ1 values to be passed through the multiplexers in the cycle adjustment block, as well. The DQY1 and DQZ1 values may be sampled by the DQY2 and DQZ2 registers and may have crossed into the CK domain at this point. The DQY2 and DQZ2 registers drive the output multiplexer, which in turn drives the output driver for the secondary link group.

A DQS output may be created from the delay adjustment logic. The DQS output may be driven using the CK+90° signal, since the MODET=1 value causes 90 degrees of delay to be inserted to the DQS value. If the value on the DLY123[1:0] control is assumed to be 11, the DQY0 and DQZ0 values may be delayed by a three cycle pipeline. The data and timing signal may appear on the secondary links 3*tCK later than for the previous case. This allows the delay through the DQS-to-CK domain crossing to be adjusted in one cycle increments.

Automatic Tracking of Timing Drift

Figure 19:
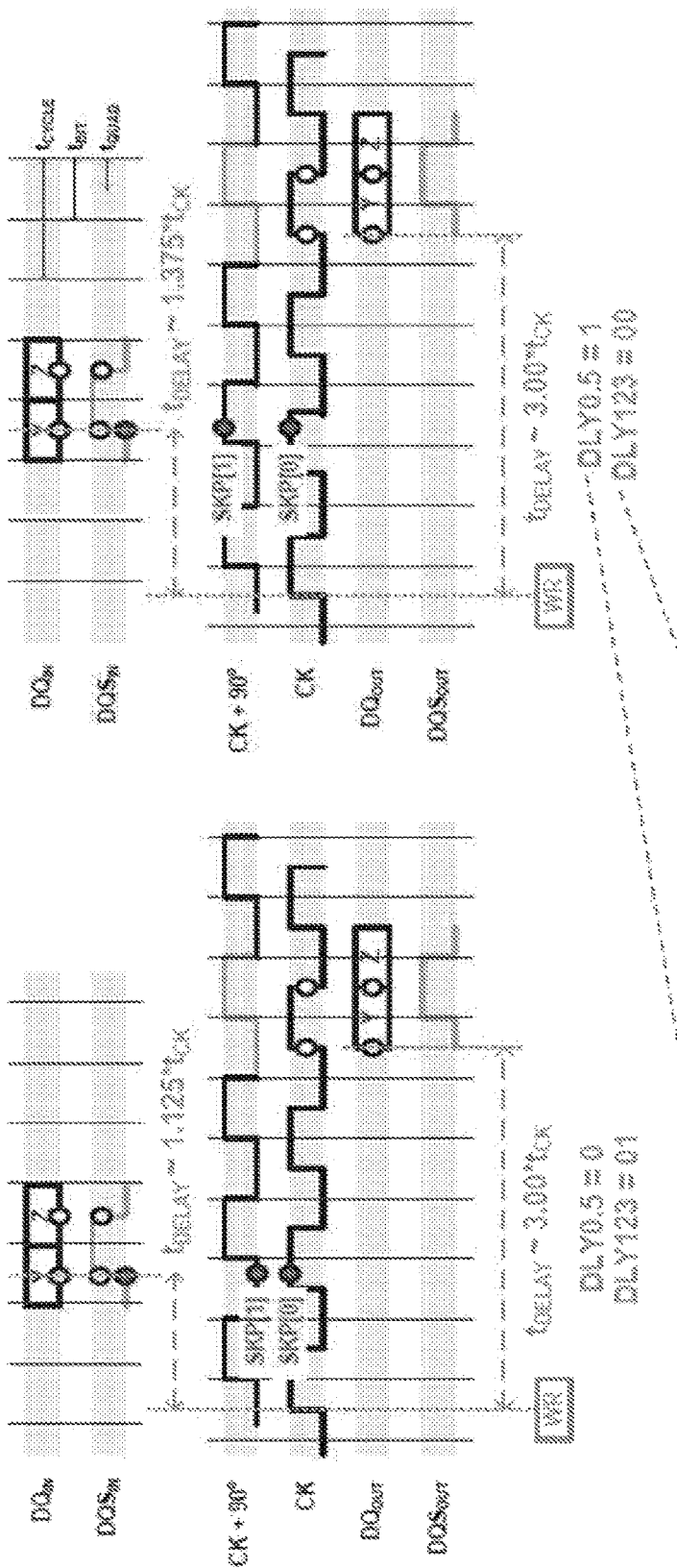
FIG. 19 shows the timing examples of FIG. 17 and FIG. 18 can be combined together to automatically track drift between the DQS and CK domain over an arbitrarily large range according to one embodiment.

FIG. 19 shows the timing examples of FIG. 17 and FIG. 18 can be combined together to automatically track drift between the DQS and CK domain over an arbitrarily large range according to one embodiment.

FIG. 19 assumes that the domain-crossing logic has been initialized so the delay from a column write command on the CA bus and the write data for that command is a constant 3.00*tCK. It should be noted that the illustrated values may be smaller than may be seen in an actual system in order to fit within the timing diagram for description purposes.

In the timing diagram 1910, the write strobe arrives 1.125*tCK after the write command. The SKP[1:0] values that are sampled are "01". The new DLY0.5 phase value is set from SKP[1], and the new DLY123[1:0] cycle value is "01" (the same as what was previously set at initialization).

In the timing diagram 1920, the DQS timing has drifted relative to the CK domain, so the write strobe arrives 1.375*tCK after the write command. The SKP[1:0] values that are sampled are "11". The new DLY0.5 phase value is set from SKP[1]. Because the SKP[1] and the old DLY0.5 phase value are different, and because SKP[0] is high, the new DLY123[1:0] may need to increment or decrement (relative to old DLY123[1:0] value) to keep the command to data delay constant at 3.00 tCK; it decrements in this example.

In summary, the DQS timing signal for each transfer may sample the CK and CK+90° (in the case of a write) and retain this information in the SKP[1:0] register. At the idle interval before the next transfer, the DLY0.5 and DLY123 [1:0] values (held in a control register in the CK domain) can be updated to reflect the SKP[1:0] from the previous transfer. These new DLY0.5 and DLY123[1:0] values are used on the next transfer.

In one implementation, this sequence may happen automatically on each transfer, and may allow the domain-crossing logic to accommodate an arbitrarily large range of DQS-to-CK drift during system operation. After an initialization process gets the control registers set to appropriate values, no further maintenance operations are required to support this automatic tracking.

Alternate DQ Topology

Figure 20:
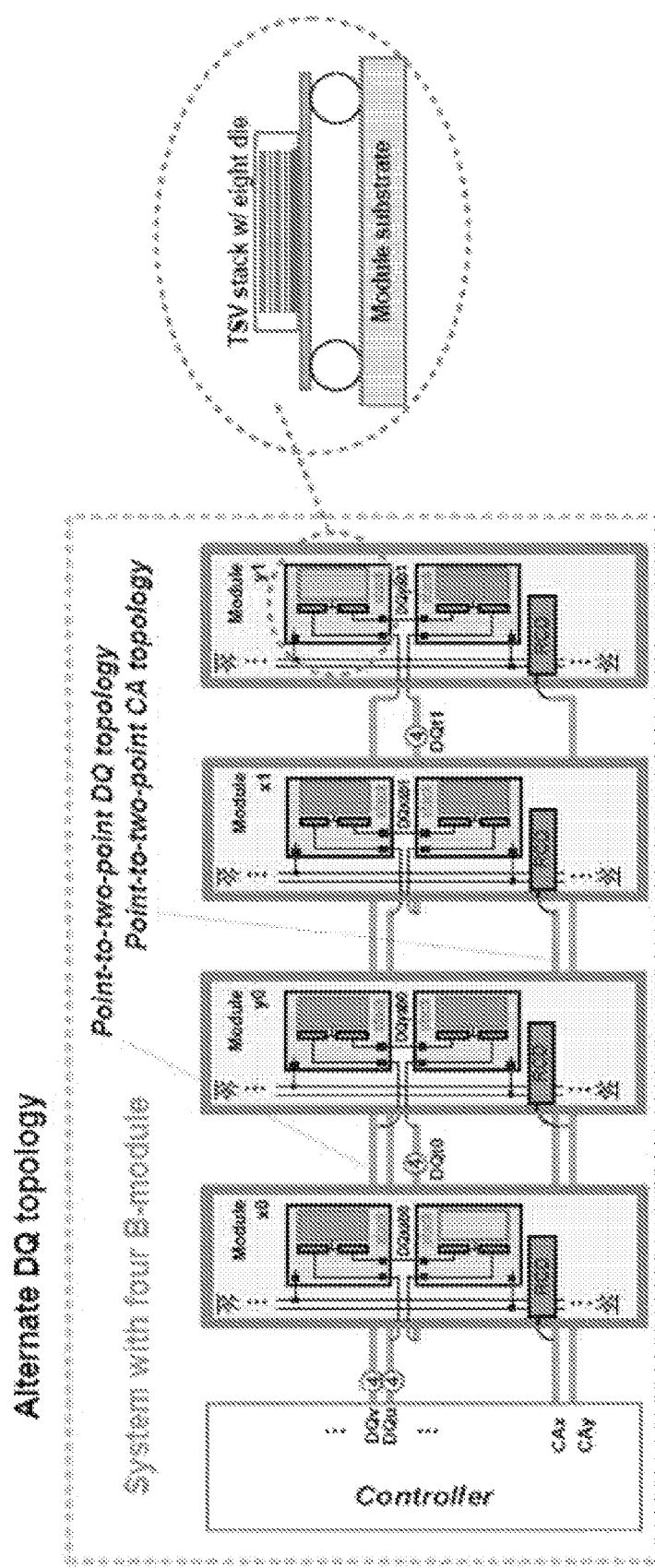
FIG. 20 shows another memory system with an alternative DQ topology according to one embodiment.

FIG. 20 shows another memory system with an alternative DQ topology according to one embodiment. This DQ topology may be considered a point-to-two-point DQ topology. This system includes four DRAM modules connected to a controller component. Each of nine pairs of primary DQ nibble groups (DQu and DQv) connects to the four modules. A third primary DQt0 nibble group connects the x0 and y0 modules. A fourth primary DQt1 nibble group connects the x1 and y1 modules. This interconnection pattern on the motherboard may allow the system to be configured with two pairs of DRAM modules or with a single pair (the x0/y0 pair, for example.

In other embodiments, this interconnection pattern can also support one and three module configurations with the use of a continuity module. In this embodiment, the primary DQ and primary CA links have a point-to-two-point topology, rather than the point-to-point topology illustrated and described above with respect to FIG. 6.

This configuration may result in a lower signaling rate on the primary DQ and primary CA links, but may provide a higher capacity for the memory system, such as twice as many modules as those described above.

The DRAM interface modifications as described herein may be used in the DRAMs of FIG. 20. The DRAM-to-DRAM transfer cases may be supported in these embodiments so that the module capacities can have the same range as described in the earlier memory systems.

Figure 21:
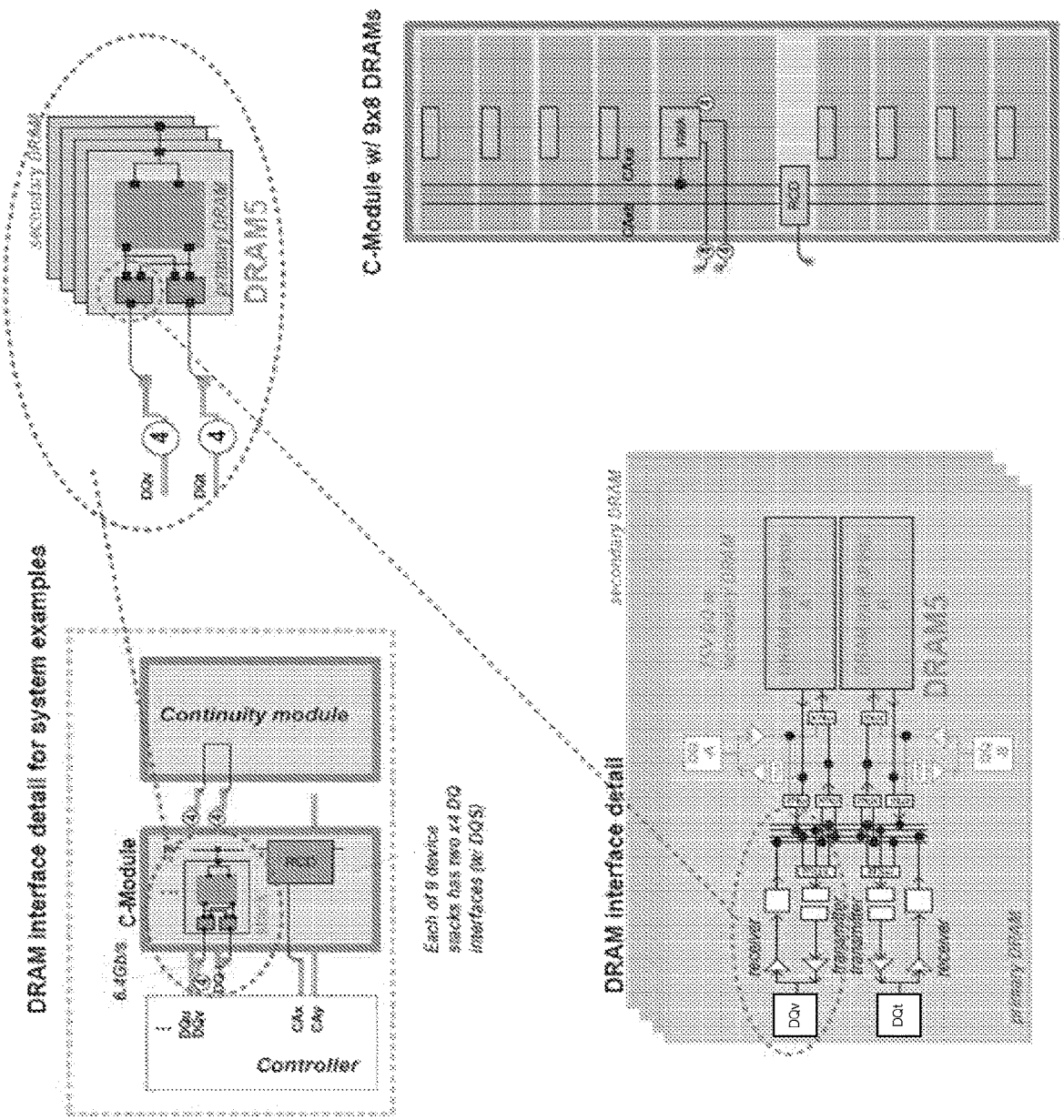
FIG. 21 shows a system configuration in which a single DRAM module contains nine DRAM stacks according to another embodiment.

In some implementations, another link may be used for performing rank selection. The primary CA links may be received by a pair of modules. An address link or a chip-select link may be used to direct an access to one of the two modules sharing the CA links DRAM Interface Detail—Dual Bank Group FIG. 21 shows a system configuration in which a single DRAM module contains nine DRAM stacks according to another embodiment. This configuration represents the smallest possible configuration when using a 72 DQ link channel and a DRAM stack with two x4 DQ nibble interfaces.

One option to this configuration may be to increase the column access granularity to 128 B. Each of the nine DRAM stacks would supply an 8b×16 column block burst. This is twice the width of the 4b×16 column blocks used in the FIG. 6 system.

It should be noted that the modification to the interface logic may be minimal in this configuration, since the width of the column access path may only need to be increased.

A second option to this configuration may be to keep the column access granularity fixed at 4b×16 and increase the concurrency of the interface and core of the DRAM.

In some implementations, the DRAM banks are separated into two independently accessible groups (A and B). Each of the two bank groups can execute independent transaction streams, carrying out independent row accesses and column accesses.

The CA interface of the DRAM may need to be doubled to enable this second concurrent access (not shown in FIG. 20). This is accomplished by connecting both the CAxa and CAxb links (similar to what is present in FIG. 5) to each DRAM stack in this minimal module configuration.

There may be enough bandwidth on the primary CA links to support the second access, since the other configurations (like the one in FIG. 6) are executing two independent transaction streams and steering them to the CAxa and CAxb module links.

The modified DRAM of FIG. 20 may also need to be able to steer the two primary interfaces (DQv and DQt) to the two bank groups. A second TSV DQ link is also needed to allow the data to be steered to the bank groups on the secondary DRAMs.

In an alternate core configuration, it may be possible for each DRAM in the stack to only have a single bank group. In this alternative embodiment, the controller component could direct the two transaction streams to two different DRAMs in the stack (but not to the same DRAM).

This may simplify the DRAM core and save cost. Steering logic may be included in the interface, as well as the second TSV DQ link. The controller component may check the request queue to make sure the same DRAM was not being used in each transaction pair.

In architectures with DRAM stacks with two data interfaces, return busses can be optimized to minimize the variation in data return latency. This optimization can be referred to as levelizing or deskewing the data return latency. If the data return latency is not deskewed (or levelized), a memory module topology, as described in detail below, can be managed as a pipeline with multiple stages. This is possible because the stacks are arranged in a topology that is a daisy chain, instead of a multi-drop bus. The embodiments described herein may give lower average data latency, improve bandwidth, reduce address bus contention, or any combination thereof. Due to the lower intermediate bus connection, as described herein, the embodiments described herein may result in a DQ/DQS bus that will time easier. In some implementations, a read-with-delay (D) can be used to relive address bus contention.

In one implementation, a memory module has at least two groups of stacked memory components, each stack with two data interfaces connected with point-to-point topology in a linear chain. A CA interface of the memory module is connected on a shared bus. A first stack of the first group connects to a module interface (e.g., connects to pins of the memory module). The stacks of the memory module are configured so that access slots at the module interface for the first and second groups are offset in time. The stacks of memory components can have variable latency to create a pipeline of access slots at the module interface. In one implementation, the offset between access slots is managed by the memory controller like a pipeline of access slots. In another implementation, a read latency for each stack is the same.

In other implementations, a memory controller coupled to this memory module can send commands to the memory module, and the memory module can vary the latency based on the type of command. For example, an RCD component can receive a command and the RCD component can control the delay of the stacks in the different groups to create a pipeline of access slots. In one implementation, the CA link of each group may be independent, but shared within the group. For example, a first CA link is coupled between the RCD component and a first group of stacked memory components and a second CA link is coupled between the RCD component and a second group of staked memory components. The first CA link can be shared between multiple stacks in the first group and the second CA link can be shared between multiple stacks in the second group.

In one implementation, the memory module can receive a read command or a read-with-delay command from the memory controller. The stacks of memory components can be programmed with a first latency in response to the read command and is programmed with a second latency in response to the read-with-delay command, where the first latency is less than the second latency, as described herein.

Figure 22:
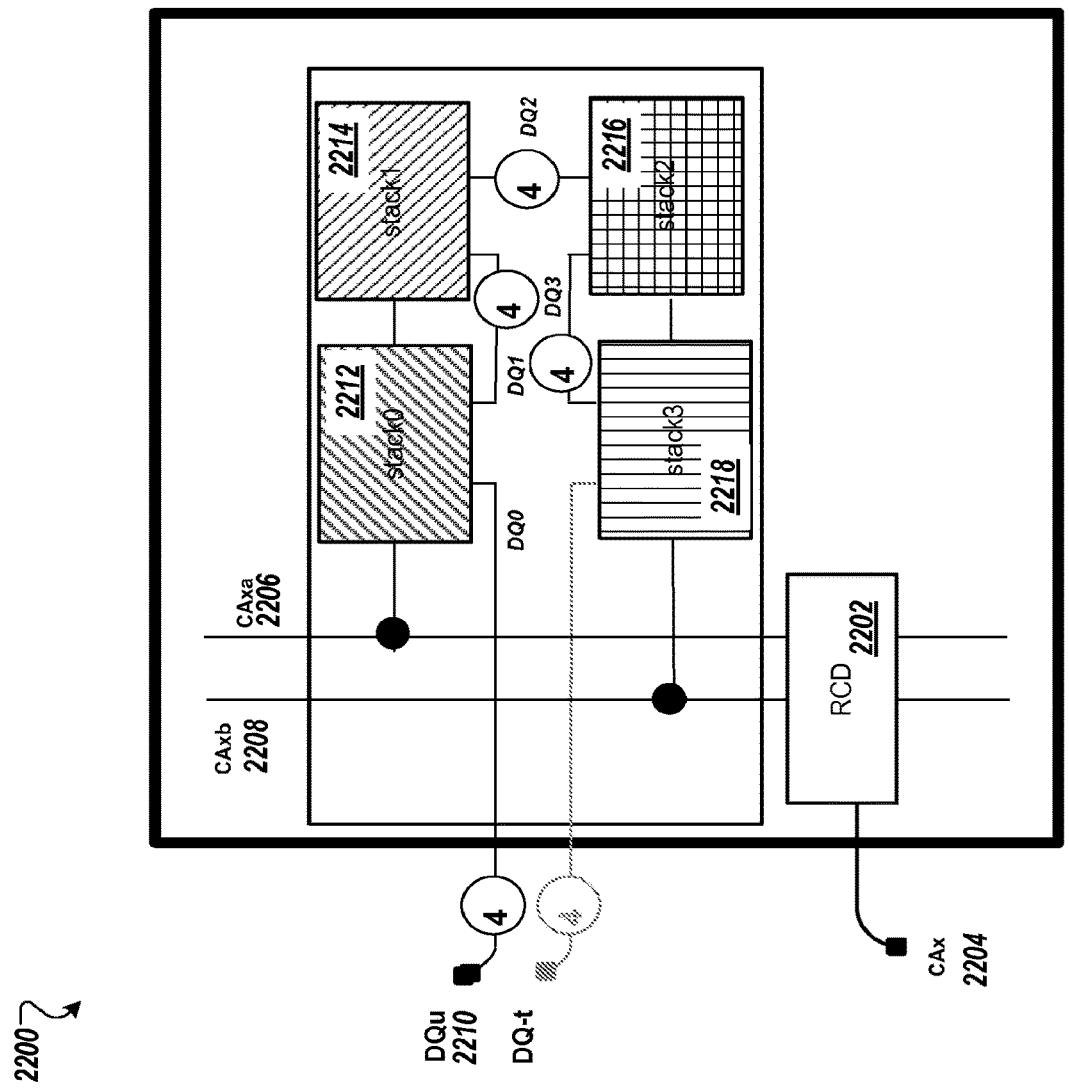
FIG. 22 is a block diagram of a memory module with multiple DRAM stacks arranged in a ring in which each DRAM stack includes two data interfaces according to one embodiment.

FIG. 22 is a block diagram of a memory module with multiple DRAM stacks arranged in a ring in which each DRAM component includes two data interfaces according to one embodiment. The memory module 2200 includes four stacks of memory components: a first stack 2212, a second stack 2214, a third stack 2216, and a fourth stack 2218. A first data interface of the first stack 2212 is coupled to a module interface 2210 via a first DQ link (DQ0). The module interface 2210 (DQu) is arranged into a first nibble and includes a respective timing link. A first data interface of the third stack 2216 is coupled to a second data interface of the first stack 2212 via a second DQ link (DQ1). A first data interface of the second stack 2214 is coupled to a second data interface of the third stack 2216 via a third DQ link (DQ2). A first data interface of the fourth stack 2218 is coupled to a second data interface of the second stack 2214 via a fourth DQ link (DQ3).

In one implementation, the memory module 2200 also includes a RCD component 2202 coupled to a module interface via a primary CA link 2204 (CAx). A first secondary CA link 2206 is coupled between the RCD component 2202 and the first stack 2212. The first secondary CA link 2206 is shared with the second stack 2214. A second secondary CA link 2208 is coupled between the RCD component 2202 and the fourth stack 2218. The second secondary CA link 2208 is shared with the third stack 2216. It should be noted that the memory module 2200 may include additional stacks that are arranged with the same topology as these four stacks.

The following describes how the RCD component 2202 and the four stacks 2212-2218 handle read operations.

Figure 23:
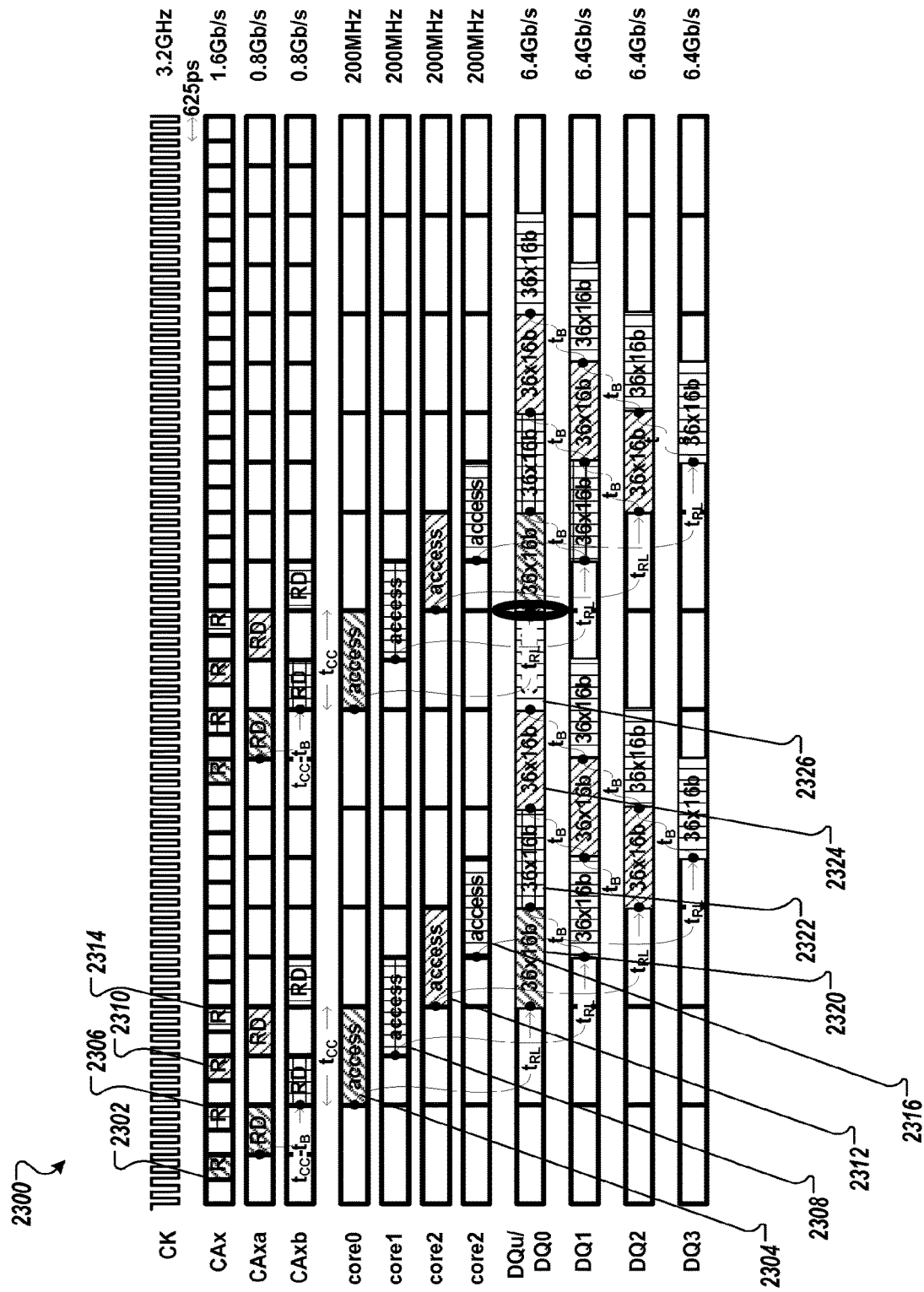
FIG. 23 is a timing diagram of read operations by the memory module of FIG. 22 according to one embodiment.

FIG. 23 is a timing diagram of read operations by the memory module 2200 of FIG. 22 according to one embodiment. The RCD component 2202 receives a first read command (R) 2302. The RCD component 2202 sends the first read command on the first secondary CA link 2206, which causes a first access 2304 at the first stack 2212. The RCD component 2202 receives a second read command (R) 2306. The RCD component 2202 sends the second read command on the second secondary CA link 2208, which causes a second access 2308 at the third stack 2216. The RCD component 2202 receives a third read command (R) 2310. The RCD component 2202 sends the third read command on the first secondary CA link 2206, which causes a third access 2312 at the second stack 2214. The RCD component 2202 receives a fourth read command (R) 2314. The RCD component 2202 sends the fourth read command on the second secondary CA link 2208, which causes a fourth access 2316 at the fourth stack 2218.

As illustrated in FIG. 23, the RCD component 2202 has to wait a delay between when the first read command 2302 and the third read command 2310 can be signaled on the first secondary CA link 2206. Similarly, the RCD component 2202 has to wait a delay between when the second read command 2306 and the fourth read command 2314 can be signaled on the second secondary CA link 228. This delay is labeled as $t_{CC}$. There is a read latency ORO between when the respective stack receives the read command and when the data is available on the respective data interface of the respective stack. The time to access the data on the respective data interface is referred to as an access slot. The access time of the access slot is equal to $t_{CC}$. There may also be a delay between when the read commands are signaled on the two secondary CA links. The delay between the two consecutive read commands is labeled $t_{CC}$-$t_B$. The stacks are accessed at different times so that the intervening stacks can route the data through the ring, resulting in a first access slot 2320 at the module interface 2210, followed by a second access slot 2322, followed by a third access slot 2324, followed by a fourth access slot 2326.

As illustrated in FIG. 23, there are various access time slots in which the slots are idle. This topology may also present some possible timing problems. In order to compensate for the potential timing problems, this topology uses speed-matching buffers. These speed-matching buffers can be difficult to implement. As noted above, speed-matching buffers may be used to prevent bus contentions, as reflected in a buffer delay $t_B$ so that the data is sequentially available at the module interface (DQu) as illustrated in FIG. 23.

Figure 24:
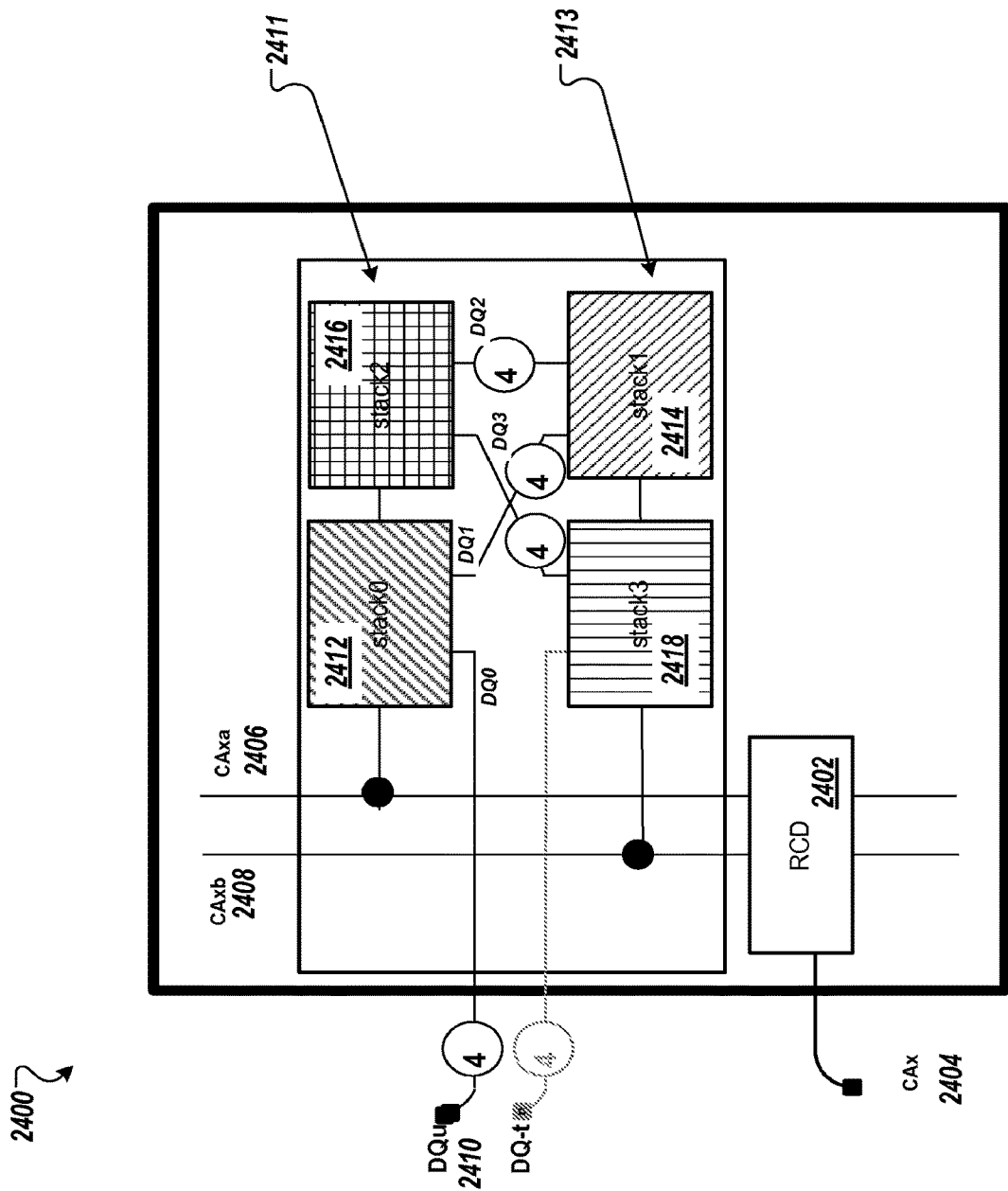
FIG. 24 is a block diagram of a memory module with multiple DRAM stacks arranged into at least two groups in a linear chain in which each DRAM stack includes two data interfaces according to another embodiment.

FIG. 24 is a block diagram of a memory module 2400 with multiple DRAM stacks arranged into at least two groups in a linear chain in which each DRAM stack includes two data interfaces according to another embodiment. The memory module 2400 includes four stacks of memory components arranged into a first group 2411 and a second group 2413. The first group 2411 includes a first stack 2412 and a third stack 2415. The second group 2413 includes a second stack 2414 and a fourth stack 2418. A first data interface of the first stack 2412 is coupled to a module interface 2410 via a first DQ link (DQ0). The module interface 2410 (DQu) is arranged into a first nibble and includes a respective timing link. A first data interface of the second stack 2414 is coupled to a second data interface of the first stack 2412 via a second DQ link (DQ1). A first data interface of the third stack 2416 is coupled to a second data interface of the second stack 2414 via a third DQ link (DQ2). A first data interface of the fourth stack 2418 is coupled to a second data interface of the third stack 2416 via a fourth DQ link (DQ3).

In one embodiment, the memory module 2400 includes a RCD component 2402 coupled to a module interface via a primary CA link 2404 (CAx). A first secondary CA link 2406 is coupled between the RCD component 2402 and the first stack 2412. The first secondary CA link 2406 is shared with the third stack 2416. A second secondary CA link 2408 is coupled between the RCD component 2402 and the fourth stack 2418. The second secondary CA link 2408 is shared with the second stack 2414. It should be noted that the memory module 2400 may include additional stacks that are arranged with the same topology as these four stacks.

The following describes how the RCD component 2402 and the four stacks 2412-2418 handle read operations.

Figure 25:
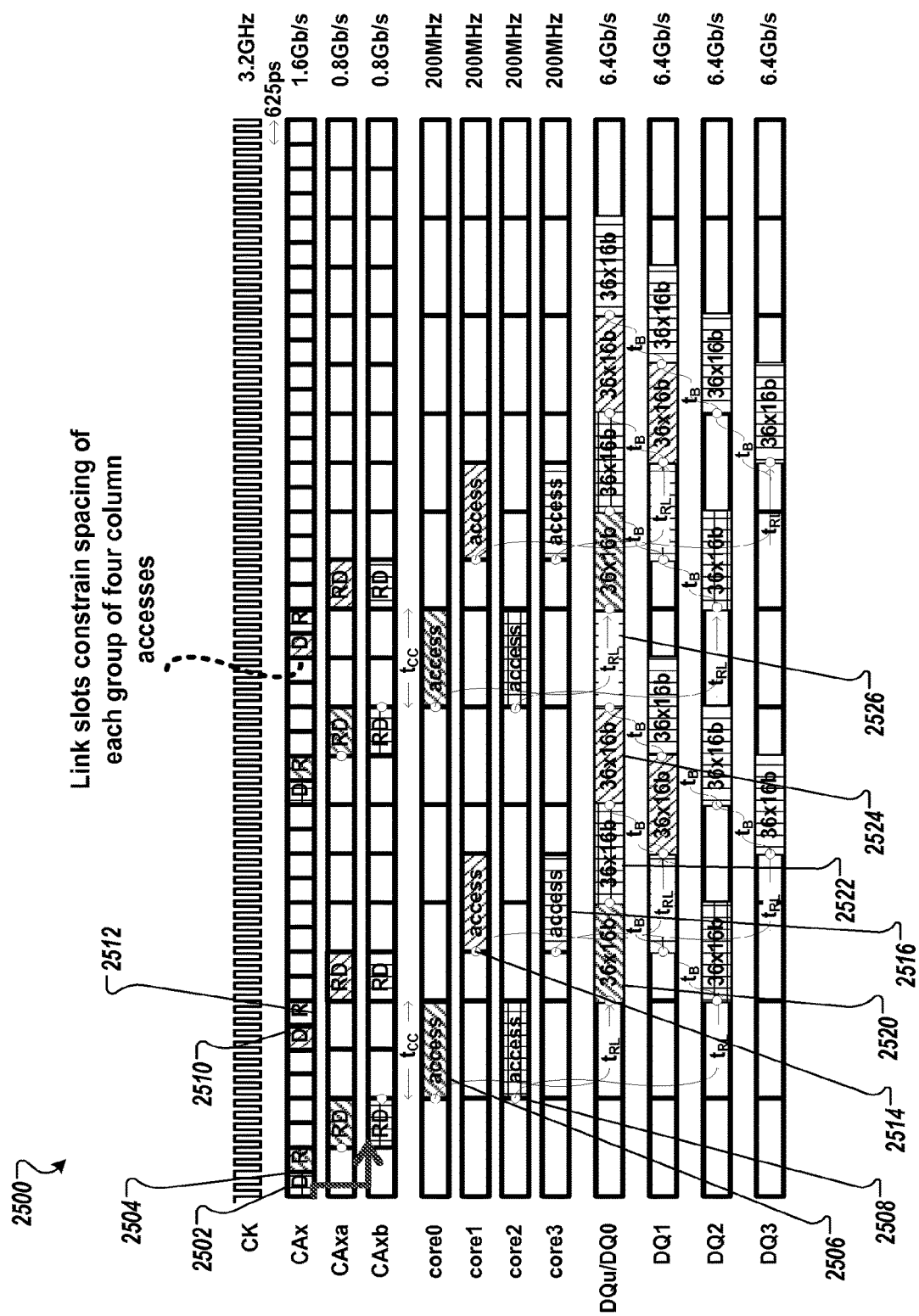
FIG. 25 is a timing diagram of read operations by the memory module of FIG. 24 according to another embodiment.

FIG. 25 is a timing diagram of read operations by the memory module of FIG. 24 according to another embodiment. The RCD component 2402 receives a first command 2502, which is a read-with-delay command (D), directly followed by a second command 2504, which is a read command (R). The RCD component 2402 sends the first command 2502 on the first secondary CA link 2406, which causes a first access 2506 at the first stack 2412 and sends the second command 2504 on the second secondary CA link 2408, which cause a second access 2508 at the second stack 2414. The RCD component 2402 receives a third command 2510, which is a read-with-delay command (D), directly followed by a fourth command 2512, which is a read command (R). The RCD component 2402 sends the third command 2510 on the first secondary CA link 2406, which causes a third access 2514 at the third stack 2416 and sends the fourth command 2512 on the second secondary CA link 2408, which cause a fourth access 2516 at the fourth stack 2418. It should be noted that the read-with-delay command (D) can be encoded into one or more signals in various ways. For example, the RCD component can add the extra delay on the secondary CA link for the particular stack once the read-with-delay (D) is received on the primary CA link. As illustrated in FIG. 25, the time between receiving the read command (R) on the primary CA link and sending the command on the first secondary CA link is different than the time between receiving the read-with-delay command (D) on the primary CA link and sending the command on the second secondary CA link. This permits two stacks to be accessed at the same time because they are in separate groups. Also, since the accessed stacks are in separate groups, data can be transferred to the non-accessed stack (in the other group) as an intermediate transfer to reduce the data return latency and the address bus contentions as described herein. In contrast, the read commands (R) in FIG. 23 exhibit the same timing response between receiving the command on the primary CA link and sending the command on the secondary CA link.

Although the RCD component 2402 does have to still wait between the first command 2502 and the third command 2510 being sent on the first secondary CA link 2406, the RCD component 2402 can send the first command 2502 on the first secondary CA link 2406 and the second command 2504 on the second secondary CA link 2408 at the same time. Similarly, the RCD component 2402 can send the third command 2510 on the first secondary CA link 2406 and the fourth command 2512 on the second secondary CA link 2408 at the same time. The first command 2502 results in a first access slot 2520 and the second command 2504 results in a second access slot 2522. The first access slot 2520 and the second access slot 2522 are offset in time. The third command 2510 results in a third access slot 2524 and the fourth command 2512 results in a fourth access slot 2526. The third access slot 2524 and the fourth access slot 2526 are offset in time. As illustrated in FIG. 25, link slots constrain spacing of each group of four column accesses.

It should be noted that the access slots at the module interface are sequential as in FIG. 23, but the secondary data buses have less address bus contention and less access time slots are idle, as compared to FIG. 23.

In another embodiment, a memory module includes a memory interface, a CA interface connected on a shared bus and at least two groups of stacked memory components with each stack of memory components including two data interfaces connected with point-to-point topology in a linear chain. A first stack in a first group of the at least two stacked memory components includes a first data interface coupled to the module interface and a second data interface coupled to a second stack in a second group of the at least two stacked memory components. In this topology, a first access slot at the module interface for the first group is offset in time from a second access slot at the module interface for the second group. That is, the access slots at the module interface for the groups are offset in time to reduce data return latency and address bus connection.

Figure 26:
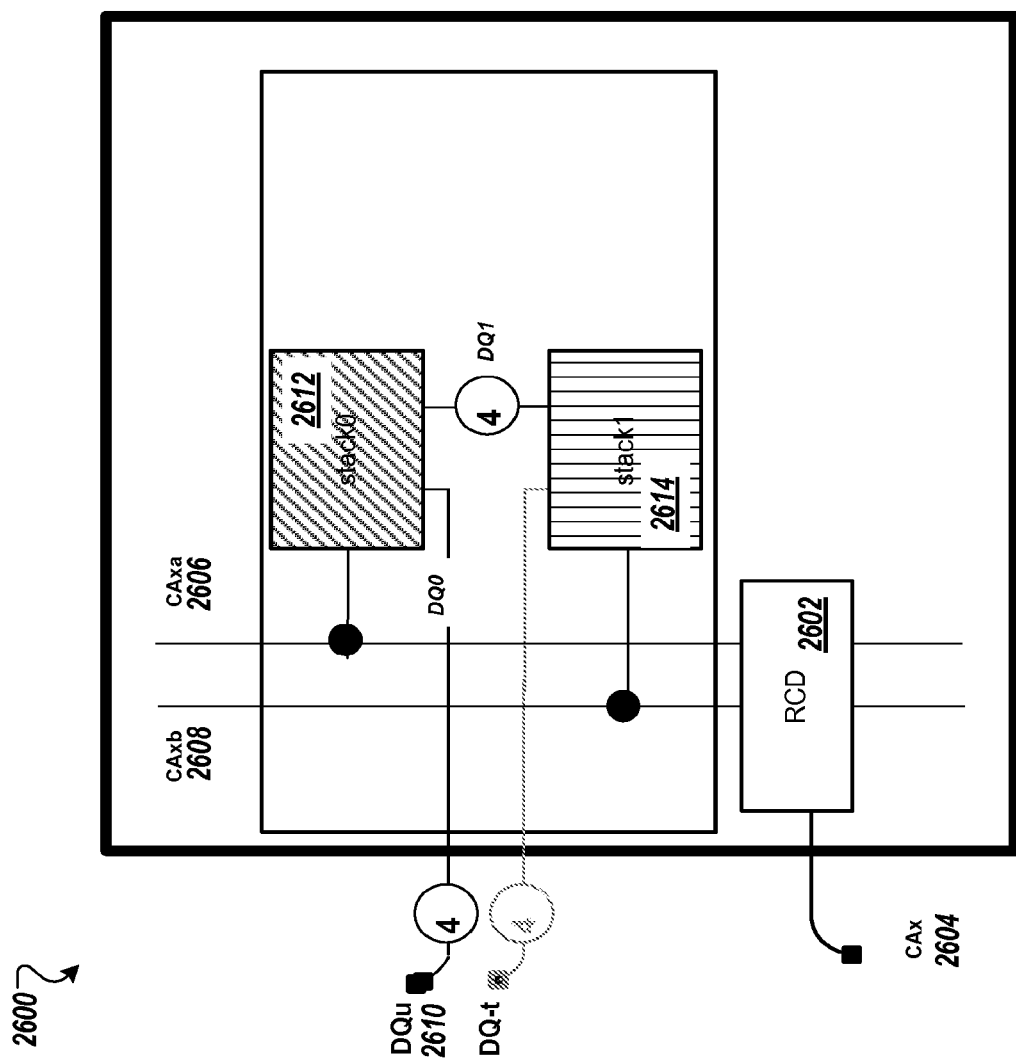
FIG. 26 is a block diagram of a memory module 2600 with multiple DRAM stacks arranged into at least two groups in a linear chain in which each DRAM stack includes two data interfaces according to another embodiment.

In a further embodiment, a memory controller is coupled to the memory module and controls an offset between the first access slot and the second access slot as a pipeline of slot accesses. As described above, the two groups may each include two stacks for a total of four stacks in this portion of the memory module. The memory module may include more portions with four stacks separated into two groups with the secondary CA links as described above. For example, there may be a total of 36 device sites, with a stack at each device site. Alternatively, the two groups may each include only one stack, as illustrated in FIG. 26. In other embodiments, the two groups may include more than two stacks as illustrated in FIG. 24. The groups may have any number of stacks as long as adjacent stacks in the linear chain are in different groups so they can be accessed on separate CA links.

In the implementation of two groups of two stacks each, the first group includes a first stack and a third stack and the second group includes a second stack and a fourth stack. Like the first access slot and the second access slot are offset in time, so are a third access slot and a fourth access slot at the module interface. The second stack includes a first data interface coupled to the first stack in the first group and a second data interface coupled to the third stack in the first group. The third stack includes a first data interface coupled to the second stack in the second group and a second data interface coupled to the fourth stack in the second group.

In another embodiment, the memory module includes a printed circuit board with first, second, and third sets of data lines and first and second sets of pins, the first pins being coupled to the first set of data lines. The memory module also includes four stacks: a first stack of DRAM components located at a first site on the printed circuit board; a second stack of DRAM components located at a second site on the printed circuit board; a third stack of DRAM components located at a third site on the printed circuit board; and a fourth stack of DRAM components located at a fourth site on the printed circuit board. The first stack of DRAM components includes a first data interface coupled to the first set of data lines and a second data interface coupled to the second set of data lines. The second stack of DRAM components includes a first data interface coupled to the second set of data lines and a second data interface coupled to the third set of data lines. The third stack of DRAM components includes a first data interface coupled to the third set of data lines and a second data interface coupled to the fourth set of data lines. The fourth stack of DRAM components includes a first data interface coupled to the fourth set of data lines.

In a further embodiment, the memory module includes an RCD component disposed on the printed circuit board. The printed circuit board includes first, second, and third sets of sets of command and address (CA) lines and a third set of pins, the third set of pins being coupled to the first set of CA lines. The first set of CA lines is coupled to the RCD component and the second set of CA lines is coupled between the RCD component and the first site and between the RCD component and the third site. The third set of CA lines is coupled between the RCD component and the second site and between the RCD component and the fourth site.

In various embodiments described herein, the DRAM components include: a set of memory cells; a first set of data links; a second set of data links; a third set of data links; a first receiver coupled to the first set of data links; a first transmitter coupled to the first set of data links; a second receiver coupled to the second set of data links; a second transmitter coupled to the second set of data links; a first multiplexer with an output coupled to the first transmitter; a second multiplexer with an output coupled to the second transmitter; a third multiplexer; a fourth multiplexer with an output coupled to an input of the first multiplexer and an input of the second multiplexer; a fifth multiplexer with an output coupled to the set of memory cells; and a sixth multiplexer with an output coupled to the third set of data links. The first receiver is coupled to an input of the second multiplexer and is coupled to an input of the third multiplexer. The second receiver is coupled to an input of the first multiplexer and is coupled to an input of the third multiplexer. An output of the third multiplexer is coupled to an input of the fifth multiplexer and is coupled to an input of the sixth multiplexer. The third set of data links is coupled to an input of the fifth multiplexer and is coupled to an input of the fourth multiplexer. The set of memory cells is coupled to an input of the fourth multiplexer and is coupled to an input of the sixth multiplexer. Alternatively, the DRAM components may include more or less components to facilitate data transfers between other DRAM components in the stack and other DRAM components on other stacks as described herein.

During operation, as illustrated in FIG. 25, first data from the first stack is transferred to the module interface at the first access slot at a first period. Second data from the second stack is transferred to the first stack at the first period. Third data from the third stack is transferred to the second stack at the first period. Fourth data from the fourth stack is transferred to the third stack at the first period. Further, the second data is transferred to the module interface at the second access slot at a second period. The third data is transferred from the second stack to the first stack and the second period and the fourth data is transferred from the third stack to the second stack at the second period. Then, the third data is transferred to the module interface at a third access slot at a third period and the fourth data is transferred from the second stack to the first stack at the third period. Then, the fourth data is transferred to the module interface at a fourth access slot at a fourth period.

FIG. 26 is a block diagram of a memory module 2600 with multiple DRAM stacks arranged into at least two groups in a linear chain in which each DRAM stack includes two data interfaces according to another embodiment. The memory module 2600 includes two stacks of memory components arranged into a first group 2611 and a second group 2613. The first group 2611 only includes a first stack 2612. The second group 2613 only includes a second stack 2614. A first data interface of the first stack 2612 is coupled to a module interface 2610 via a first DQ link (DQ0). The module interface 2610 (DQu) is arranged into a first nibble and includes a respective timing link. A first data interface of the second stack 2614 is coupled to a second data interface of the first stack 2612 via a second DQ link (DQ1).

In one embodiment, the memory module 2600 includes a RCD component 2602 coupled to a module interface via a primary CA link 2604 (CAx). A first secondary CA link 2606 is coupled between the RCD component 2602 and the first stack 2612. A second secondary CA link 2608 is coupled between the RCD component 2602 and the second stack 2414. It should be noted that the memory module 2400 may include additional stacks that are arranged with the same topology as these two stacks.

In one embodiment, during operation at a first period, first data from the first stack is transferred to the module interface at the first access slot and second data from the second stack is transferred to the first stack. The second data is transferred to the module interface at the second access slot at a second period.

It should be noted that the embodiments described above with respect to FIGS. 22-26 show only a portion of the memory module. In one implementation, there may be 36 device sites with stacks, totally 36 stacks on the memory module. In other embodiments, the device sites may vary based on the application. Thus, the memory module may include more stacks and groups than those illustrated and descried herein. It should also be noted that the memory modules may be implemented in a system. For example, a system may include a motherboard substrate upon which a memory controller and one or more memory modules may be disposed as described herein.

Figure 27:
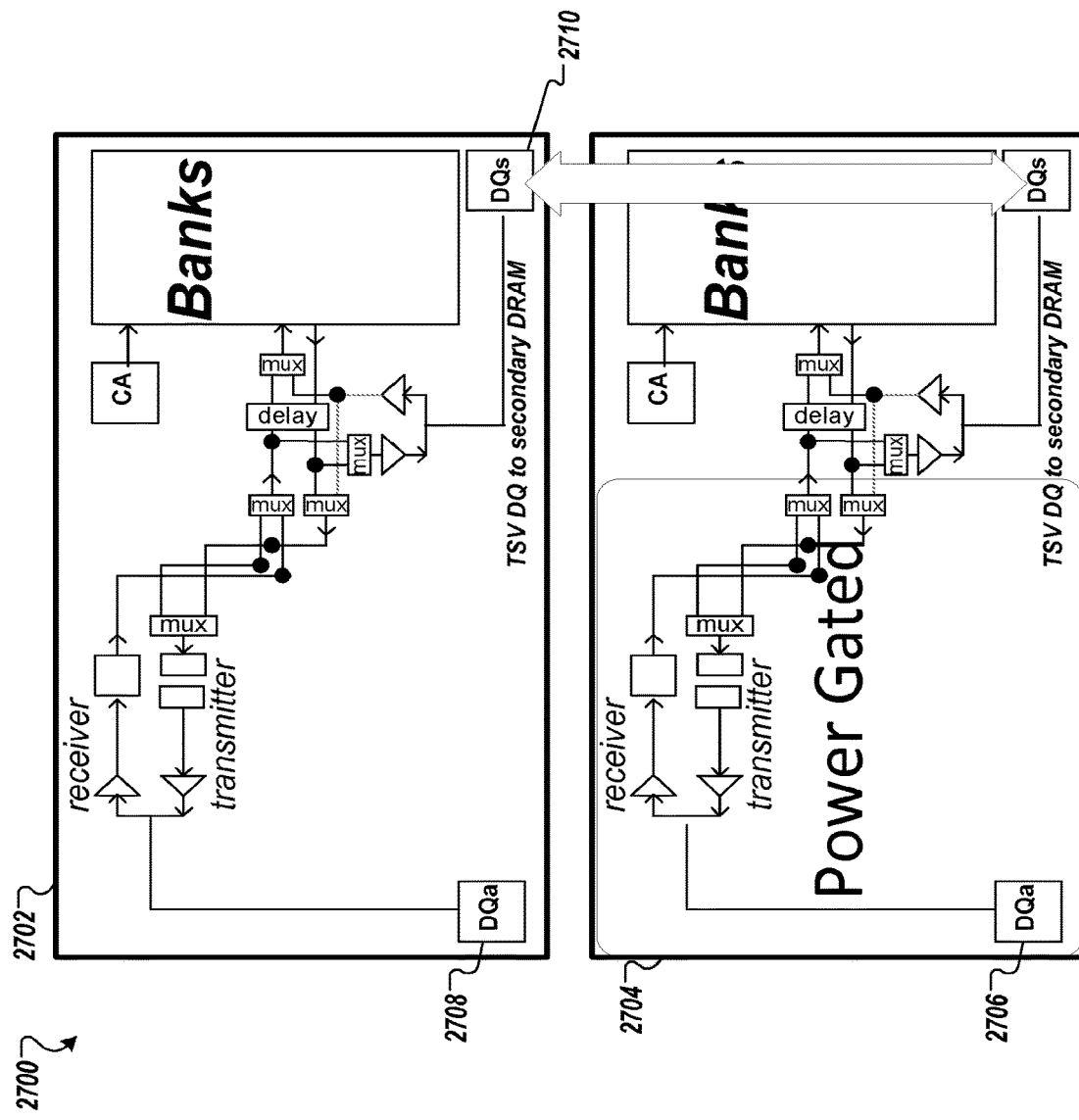
FIG. 27 is a block diagram of a standard stack of memory components with each memory component including a single data interface according to one implementation.
Figure 28:
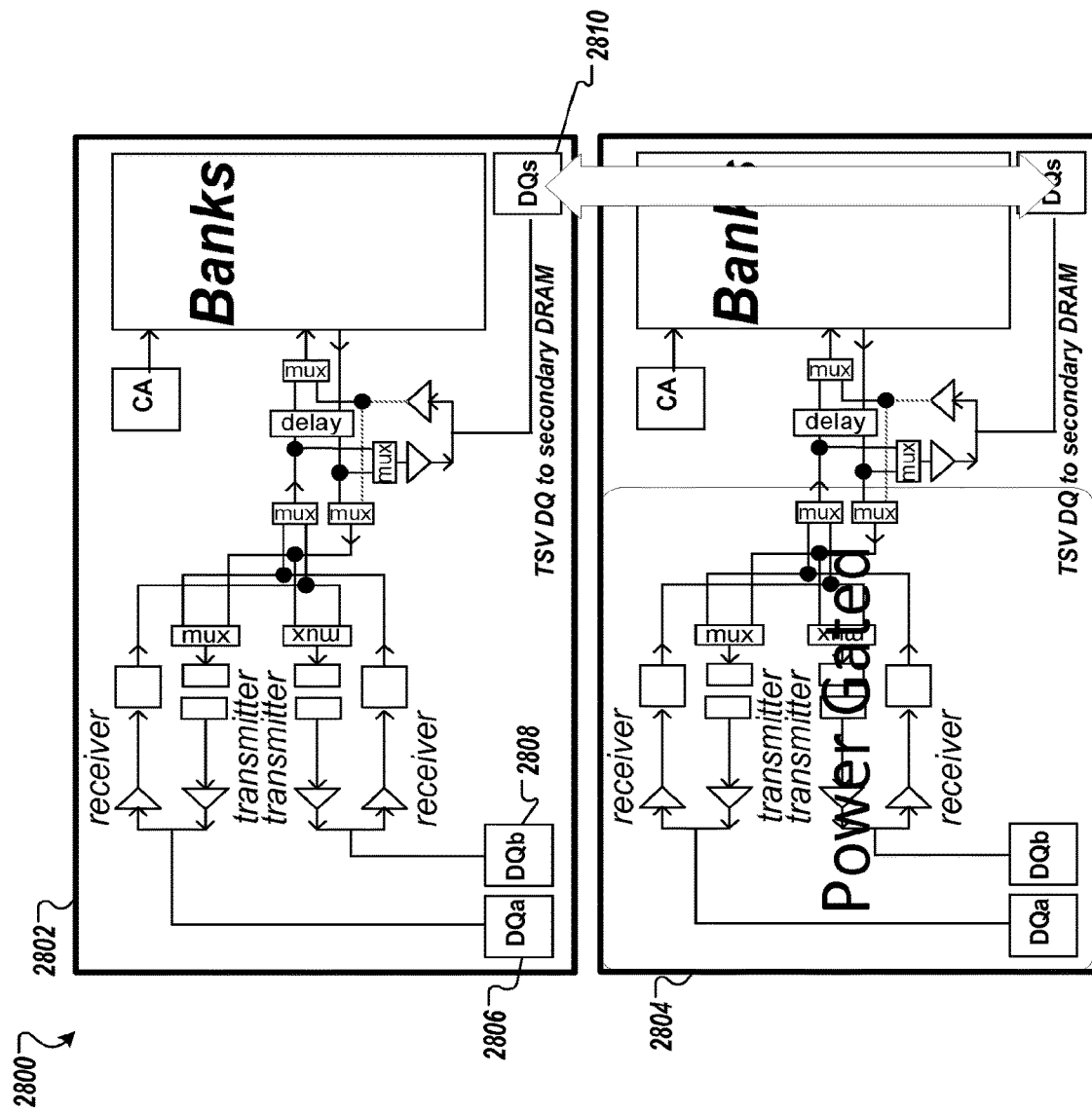
FIG. 28 is a block diagram of a stack of memory components with each memory component including two data interfaces according to one implementation.
Figure 29:
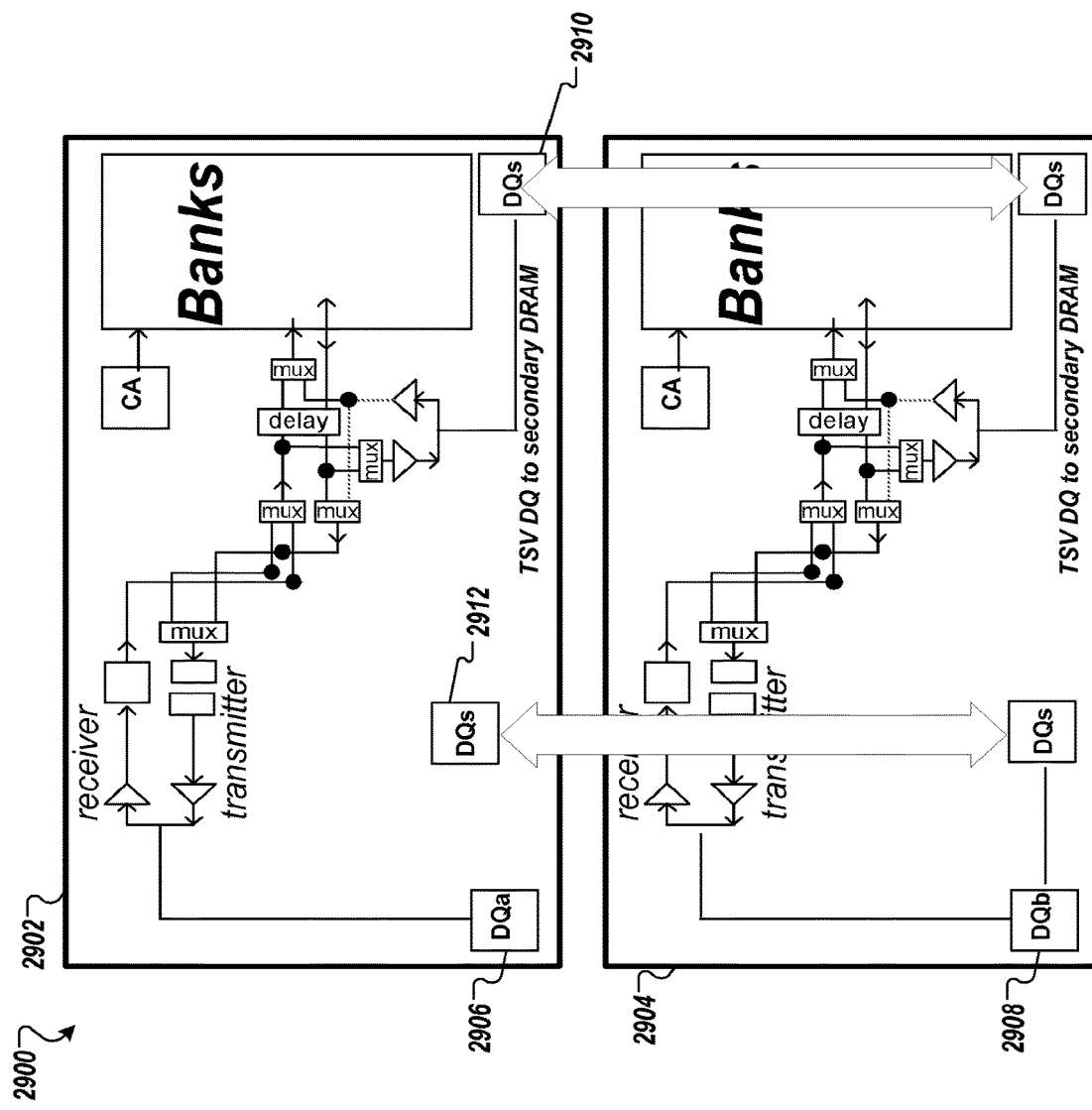
FIG. 29 is a block diagram of a stack of memory components with the stack including two data interfaces and each memory component including one data interface according to one embodiment.

The embodiments described above are direct to dual-ported dies. The following embodiments are directed to dual-ported stacks of DRAM components for high-performance, high-capacity RDIMMs. A die including a single DQ/DQS can be used to make a stack couple of the dual-ported dies described herein. Various embodiments described above may be referred to as dynamic point-to-point (DPP) stacked architecture or DPP stack. In some cases, the DPP stacked architecture is implemented with buffers. In other cases, the DPP stacked architecture is implemented with stacks. The DPP stacked architecture enables higher bus speeds by reducing loading on the DQ/DQS bus. The DPP stacked architecture also enables higher system capacity by combining multiple modules in a given access. FIG. 27 illustrates a standard (non-DPP stacked) DDR 3DS DRAM topology, where each die only has one DQ/DQS interface. FIG. 28 illustrates a DPP stacked topology, where each die has two DQ/DQS interfaces. Having two DQ/DQS interfaces may cause several engineering difficulties, such as noise, cross talk between independent interfaces, extra buffering and peripheral logic, or the like. The dual-ported dies may require changes to the standard DRAM die in various ways. FIG. 29 and FIG. 30 illustrate a topology where each die only has one DQ/DQS interface, but enable higher bus speeds and higher system capacity to make a DPP stack. In these embodiments, the idea is that each package needs two DQ/DQS interfaces, but not each die. In these embodiments, a configuration can be used where existing DQ/DQS interfaces on the standard die can be reused to create a DPP stacked architecture in which the package includes two data interfaces, not the individual dies. In some embodiments, depending on how the 3DS is implemented, the topology may include extra TSVs to permit one of the data interfaces to connect to the package interfaces or the topology may include topside bonding or extra F2F micro balls to make the connections to the two ports on the stack of dies each with a single DQ/DQS interface. It should be noted that in other embodiments, there may be more than two dies in the stack with each die being dual ported. It should also be noted that in other embodiments, there may be more than two dies in the stack with each stack being dual ported.

FIG. 27 is a block diagram of a standard stack 2700 of memory components with each memory component including a single data interface according to one implementation. The standard stack 2700 is illustrated as having two memory components. In this implementation, a first memory component 2702 and a second memory component 2704 are homogeneous. However, because a data interface 2706 of the second memory component 2704 is not used, the transmitter, receiver, and multiplexers coupled to the data interface are power gated. An access to the second memory component 2704 is accessed via a data interface 2708 of the first memory component and a secondary interface 2710 coupled to all memory components in the stack 2700. The secondary interface 2710 can be implemented using TSVs.

FIG. 28 is a block diagram of a stack 2800 of memory components with each memory component including two data interfaces according to one implementation. The stack 2800 is illustrated as having two memory components. In this implementation, a first memory component 2802 and a second memory component 2804 are homogeneous. The first memory component includes a first data interface 2806 and a second data interface 2808. The second memory component also includes two data interfaces. However, because the data interfaces of the second memory component 2804 are not used, the transmitter, receiver, and multiplexers coupled to the data interfaces are power gated. An access to the second memory component 2804 is accessed via the data interface 2806 or data interface 2808 of the first memory component and a secondary interface 2810 coupled to all memory components in the stack 2800. The secondary interface 2810 can be implemented using TSVs.

FIG. 29 is a block diagram of a stack 2900 of memory components with the stack 2900 including two data interfaces and each memory component including one data interface according to one embodiment. The stack 2900 is illustrated as having two memory components, however, the stack 2900 may include more than two memory components in the stack. In this embodiment, a first memory component 2902 and a second memory component 2904 are homogeneous. The first memory component 2902 includes a first data interface 2906 and the second memory component 2904 includes a second data interface 2908. The transmitter, receiver, and multiplexers of the second memory component 2904 are used, and thus, are not power gated. An access the second memory component 2904 may be accessed via the first data interface 2906 or the second data interface 2908. In some cases, the second memory component 2904 is accessed via the first data interface of the first memory component 2902 and a secondary interface 2910 coupled to all memory components in the stack 2900. In other cases, the second memory component 2904 is accessed via the second data interface 2908. The secondary interface 2910 can be implemented using TSVs. Also, as illustrated in FIG. 29, additional TSV 2912 can be used to connect the second data interface (DQS/DQ) 2908 to the first memory component 2902, which is also referred to as a base chip, to be connected to a second package interface.

It should be noted that in this embodiment, the secondary interface 2910 may still include several (magnitude of hundreds) wide TSVs for the internal interface, but additional TSVs (magnitude of tens) for pulling the data lines from second data interface 2908 to the first memory component 2902.

In some cases, the first memory component 2902 is closer to a package substrate than the second memory component 2904. For example, the first memory component 2902 is the closest or bottommost memory component in the stack 2900, whereas the second memory component 2904 is the farthest or topmost memory component in the stack 2900. The stack 2900 may include zero or more intervening memory components between the first memory component 2902 and the second memory component 2904. It should be noted that there are other embodiments to connect the data interfaces to two the package interfaces. For example, wire bonding connections may be used as illustrated and described below with respect to FIGS. 30A-30B.

Figures 30A, 30B:
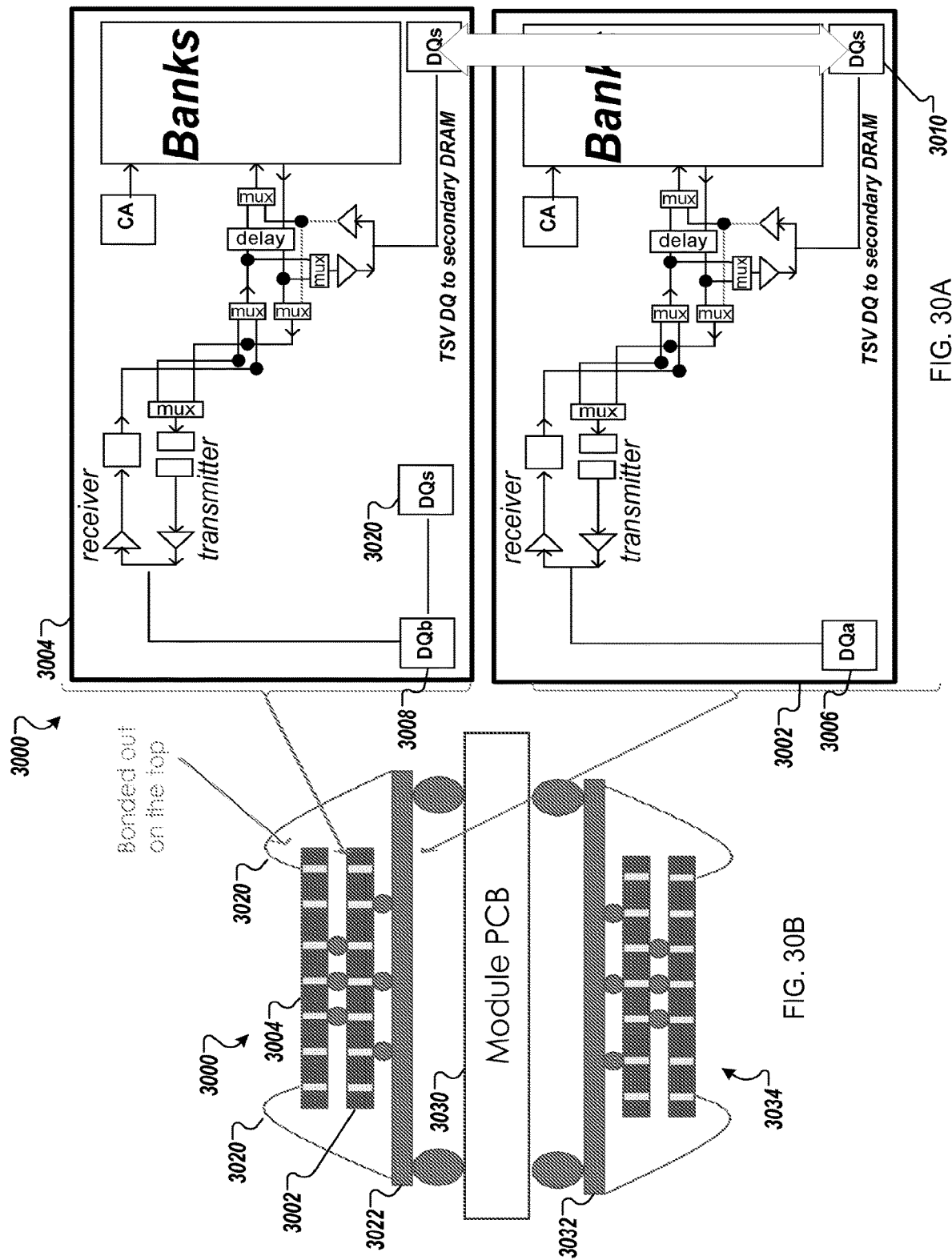
FIG. 30A is a block diagram of a stack of memory components with the stack including two data interfaces and each memory component including one data interface according to another embodiment.
FIG. 30B is a side view of a memory module with two stacks, each stack including two data interfaces and each memory component including one data interface according to one embodiment.

FIG. 30A is a block diagram of a stack 3000 of memory components with the stack 3000 including two data interfaces and each memory component including one data interface according to another embodiment. FIG. 30B is a side view of a memory module with two stacks, each stack including two data interfaces and each memory component including one data interface according to one embodiment. With reference to FIGS. 30A-30B, the stack 3000 is illustrated as having two memory components, however, the stack 3000 may include more than two memory components in the stack. In this embodiment, a first memory component 3002 and a second memory component 3004 are homogeneous. The first memory component 3002 includes a first data interface 3006 and the second memory component 3004 includes a second data interface 3008. The transmitter, receiver, and multiplexers of the second memory component 3004 are used, and thus, are not power gated. An access the second memory component 3004 may be accessed via the first data interface 3006 or the second data interface 3008. In some cases, the second memory component 3004 is accessed via the first data interface 3006 of the first memory component 3002 and a secondary interface 3010 coupled to all memory components in the stack 3000. In other cases, the second memory component 3004 is accessed via the second data interface 3008. The secondary interface 3010 can be implemented using TSVs. However, unlike FIG. 29 in which additional TSVs are used to connect the data interface of the second memory component 3004 to the second package interface, the stack 3000 uses wire bonding connections 3020. The wire bonding connections 3020 may be natural bonding interfaces. As illustrated in FIG. 30A, the wire bonding connections 3020 may be bonded out on top of the stack 3000.

In some cases, the first memory component 3002 is closer to a package substrate than the second memory component 3004. For example, the first memory component 3002 is the closest or bottommost memory component in the stack 3000, whereas the second memory component 3004 is the farthest or topmost memory component in the stack 3000. The stack 3000 may include zero or more intervening memory components between the first memory component 3002 and the second memory component 3004.

In a further embodiment, as illustrated in FIG. 30A, the stack 3000 is disposed on a first package substrate 3022. The first package substrate 3022 includes the two package interfaces. The data interface of the first memory component 3002 is coupled to a first package interface and the data interface of the second memory component 3004 is coupled to a second package interface via wire bonding connections 3020.

In another embodiment, a memory package includes a package substrate including at least two data interfaces and a stack of homogeneous memory components stacked on the package substrate. The first memory component includes an external data interface that connects to a subset of the memory components of the stack and an internal data interface that connects to all of the memory components of the stack. In some cases, the external data interface is connected to just one of the memory components. However, in other embodiments, one of the at least two data interface can be connected to more than one memory components in the stack when the stack has more than two memory components. In either embodiment, the external data interfaces of at least two of the memory components in the stack are coupled to the at least two data interfaces on the package substrate. Although only two memory components are illustrated in FIGS. 30A-30B, there could be more than two components and the two memory components illustrated in FIG. 30A-30B are the topmost and the bottommost memory components in the stack. The external data interfaces of these two memory components are coupled to the at least two data interfaces on the package substrate, while the external data interfaces of the intervening memory components are not coupled to the at least two data interfaces on the package substrate. The internal data interfaces of all the memory components connect to all of the other memory components in the stack. As described herein, the stack of homogenous memory components may each includes a single set of primary and secondary interfaces, also referred to as single DQ/DQs, in which the memory component only includes the external data interface and the internal data interface.

In one embodiment, the second memory component 3004 is the topmost memory component. The external data of the topmost memory component is coupled to a first data interface on the package substrate. The first memory component 3002 is the bottommost memory component. The bottommost memory component is disposed on the package substrate 3022 closer than the topmost memory component. The external data interface of the bottommost memory component is coupled to a second data interface on the package substrate.

An access to any one of the memory components in the stack can be made through at least one of the first data interface or the second data interface. The stack of memory components may transfer data from the first data interface to the second data interface through the internal data interface and transfer data from the second data interface to the first data interface through the internal data interface. In one embodiment, the memory components includes steering logic to enable a bypass path through the stack of memory components, such as illustrated and described with respect to FIG. 31. In some embodiments, the internal data interfaces of the memory components in the stack are not coupled to the package substrate, but a first external interface of a first memory component in the stack is coupled to the package substrate and a second external interface of a second memory component in the stack is coupled to the package substrate.

In another embodiment, a first package substrate includes two or more package interfaces and a dual-ported stack comprising multiple homogeneous memory components stack on the package substrate. The dual-ported stack includes a first memory component of the dual-ported stack. The first memory component includes a first external data interface that connects to a first package interface of the two package interfaces on the package substrate and a first internal data interface that connects to all other memory components in the dual-ported stack. A second memory component of the dual-ported stack includes a second external data interface that connects to a second package interface on the package substrate and a second internal data interface that connects to all other memory components of the dual-ported stack. In a further embodiment, the dual-ported stack includes a third memory component. The third memory component includes a third external data interface that does not connect to the two package interfaces on the package substrate and a third internal data interface that connects to all other memory components in the dual-ported stack. In a further embodiment, the dual-ported stack includes a fourth memory component. The fourth memory component includes a fourth external data interface that does not connect to the two package interfaces on the package substrate and a fourth internal data interface that connects to all other memory components in the dual-ported stack. In other embodiments, the dual-ported stack may include more than four components.

Referring back to FIG. 30A, the first package substrate 3022 is disposed on a memory module substrate 3030. A second package substrate 3032 is disposed on an opposite side as the first package substrate 3022. A second dual-ported stack 3034 can be disposed on the second package substrate 3032 in a similar manner to stack 3000. The second package substrate 3032 includes at least two additional package interfaces. The second dual-ported stack 3034 may include two or more homogeneous memory components stacked on the second package substrate 3032. The second dual-ported stack 3034 may include a third memory component with a third external data interface that connects to a third package interface on the second package substrate 3032 and a third internal data interface that connects to all other memory components in the second dual-ported stack 3034. The second dual-ported stack 3034 may further include a fourth memory component with a fourth external data interface that connects to a fourth package interface on the second package substrate 3032 and a fourth internal data interface that connects to all other memory components in the second dual-ported stack 3034.

As illustrated in the embodiment of FIG. 30A, the first memory component 3002 is located at a first side of the dual-ported stack 3000 that is disposed on a first surface of the package substrate 3022 and the second memory component 3004 is located at a second side of the dual-ported stack 3000 that is disposed farthest from the first surface of the package substrate 3022. In a further embodiment, the second dual-ported stack 3034 is disposed on a first surface of the package substrate 3032. The dual-ported stack 3000 and the first package substrate 3022 are disposed on a first surface of a memory module substrate and the second dual-ported stack 3034 and the second package substrate 3032 are disposed on a second surface of the memory module substrate. As described herein, the topmost memory components can be connected to the respective package substrates using wire bonding interconnects. Alternatively, the data interface of one of the memory components can be connected to the package substrate through additional TSVs as described herein.

Figure 31:
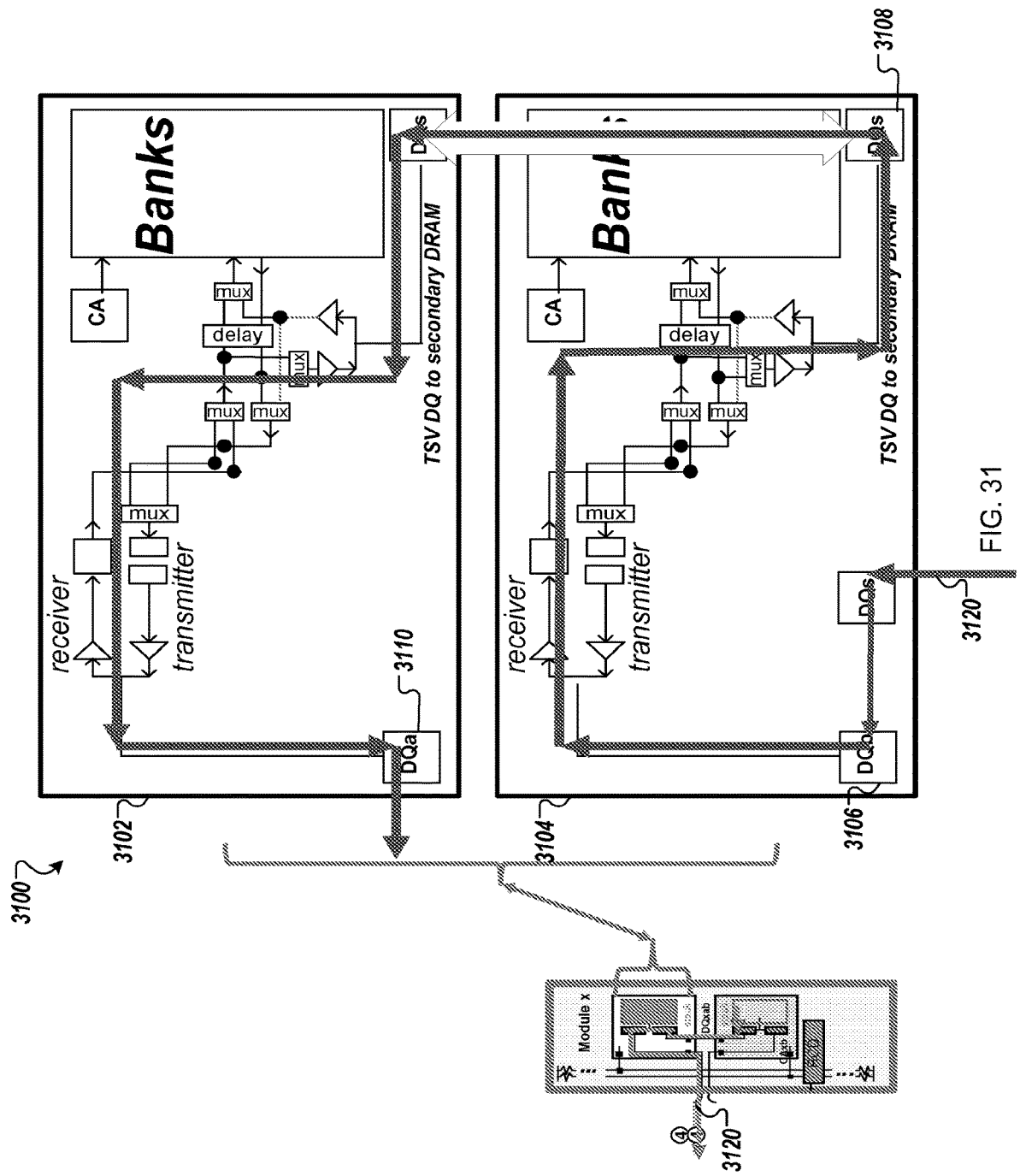
FIG. 31 illustrates a pass-through path through a dual-ported stack according to one embodiment.

In one embodiment, memory components of a dual-ported stack 3000, or the second dual-ported stack 3034, each includes steering logic that can be programmed to enable a bypass path through the stack of memory components, such as illustrated and described with respect to FIG. 31.

FIG. 31 illustrates a pass-through path 3120 through a dual-ported stack 3100 according to one embodiment. The dual-ported stack 3100 includes a first memory component 3102 and a second memory component 3104 stacked on a package substrate. It should be noted that more memory components can be part of the stack, but for ease of description, the depicted embodiment is illustrated and described with respect to two memory components in the stack. The dual-ported stack 3100 is different from the stack 3200 in FIG. 32 in that it includes two ports per stack (or per package), instead of two ports per memory component as in FIG. 32. The dual-ported stack 3100 can handle a bypass operation. The data may be received on a second external interface 3106 by steering logic in the second memory component 3104. The second external interface 3106 is coupled to a second package interface on a package substrate. The steering logic can transfer the data through an internal data interface 3108, which may be TSVs that connect all the memory components in the dual-ported stack 3100. Steering logic in the first memory component 3102 receives the data from the internal data interface 3108 and transfers the data through a first external interface 3110. The first external interface 3110 is coupled to a first package interface on the package substrate. For comparison, the bypass operation using a stack with dual-ported memory components is described with respect to FIG. 32.

Figure 32:
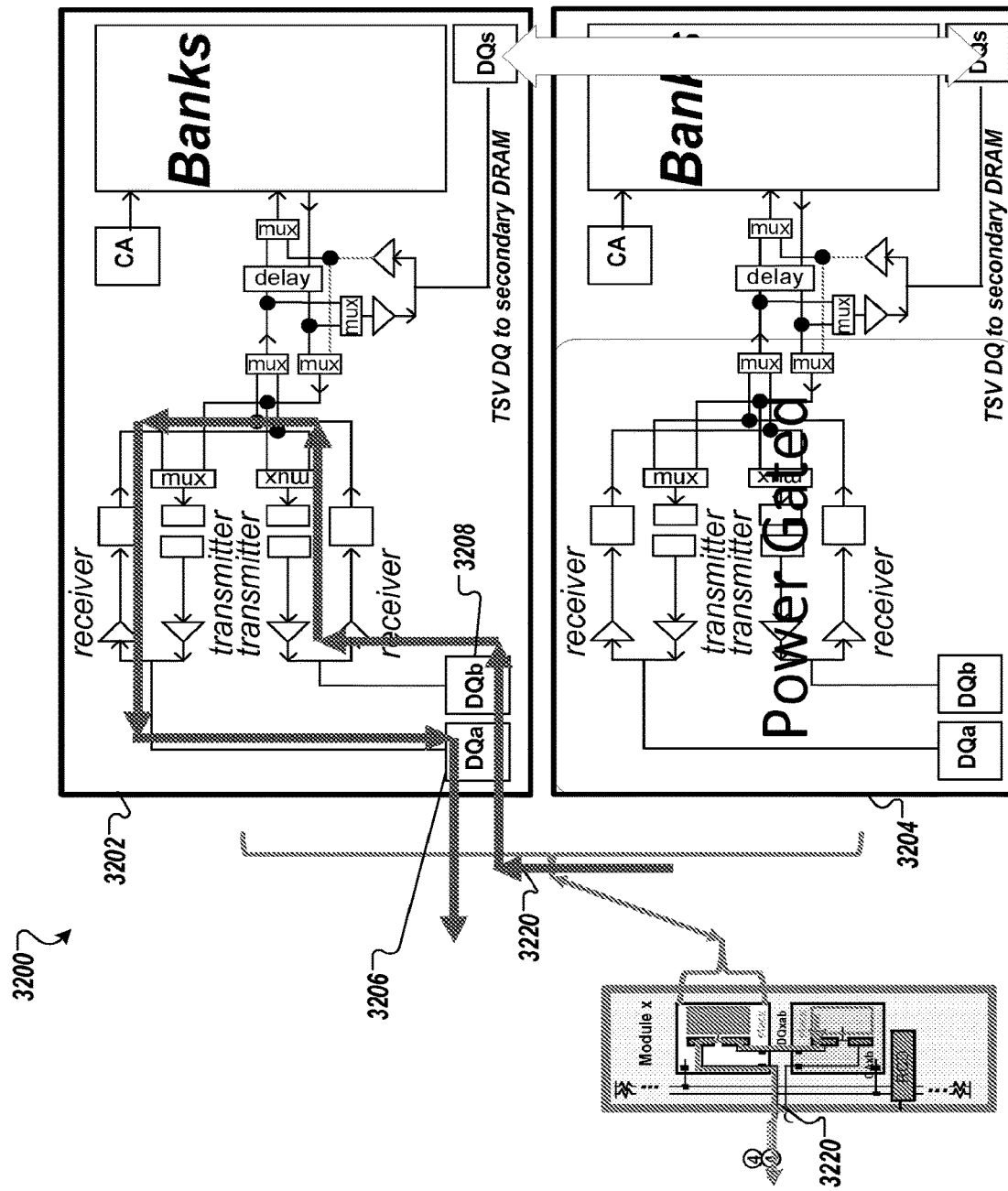
FIG. 32 illustrates a pass-through path through a stack with two data interfaces according to one implementation.

FIG. 32 illustrates a pass-through path 3220 through a stack 3200 with two data interfaces according to one implementation. The stack 3200 includes a first memory component 3202 and a second memory component 3204. The first memory component 3202 includes two data interfaces that are coupled to the package interfaces on the package substrate. Since the data interfaces of the second memory component 3204 are not used, these interfaces and corresponding steering logic are power gated. Data is received on the first data interface and the steering logic transfers the data out on the second data interface, or vice versa.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

The description above includes specific terminology and drawing symbols to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A memory package comprising:
    a package substrate comprising at least two data interfaces; and
    a stack of memory components stacked on the package substrate, wherein the memory components of the stack are homogeneous, wherein:
    a first memory component of the stack comprises:
        a first data interface that couples to one of the at least two data interfaces;
        a second data interface that couples to all other memory components of the stack; and
    a second memory component of the stack comprises:
        a third data interface that couples to all other memory components of the stack; and
        a fourth data interface that couples to a second stack.

2. The memory package of claim 1, wherein the first memory component further comprises:
    a set of memory cells;
    a command and address (CA) interface coupled to the set of memory cells; and
    steering logic coupled to the set of memory cells, wherein the steering logic comprises:
        the first data interface;
        the second data interface; and
        a set of multiplexers coupled between the first data interface, the second data interface, and the set of memory cells.

3. The memory package of claim 2, wherein the steering logic further comprises:
    a first receiver coupled to a first set of ports to couple to a first set of data lines arranged into a first nibble;
    a first transmitter coupled to the first set of ports;
    a second receiver coupled to a second set of ports to couple to a second set of data lines arranged into a second nibble;
    a second transmitter coupled to the second set of ports;
    a first multiplexer of the set of multiplexers, the first multiplexer comprising an output coupled to the first transmitter;
    a second multiplexer of the set of multiplexers, the second multiplexer comprising an output coupled to the second transmitter;
    a third multiplexer of the set of multiplexers;
    a fourth multiplexer of the set of multiplexers, the fourth multiplexer comprising an output coupled to an input of the first multiplexer and an input of the second multiplexer;
    a fifth multiplexer of the set of multiplexers, the fifth multiplexer comprising an output coupled to the set of memory cells; and
    a sixth multiplexer of the set of multiplexers, the sixth multiplexer comprising an output coupled to a set of through-silicon-via (TSV) links in the stack, wherein:
        the first receiver is coupled to an input of the second multiplexer and is coupled to an input of the third multiplexer;
        the second receiver is coupled to an input of the first multiplexer and is coupled to an input of the third multiplexer;
        an output of the third multiplexer is coupled to an input of the fifth multiplexer and is coupled to an input of the sixth multiplexer;
        the set of TSV links is coupled to an input of the fifth multiplexer and is coupled to an input of the fourth multiplexer; and
        the set of memory cells is coupled to an input of the fourth multiplexer and is coupled to an input of the sixth multiplexer.

4. The memory package of claim 2, wherein the set of memory cells are organized as a plurality of bank groups.

5. The memory package of claim 1, wherein the second memory component further comprises:
- a set of memory cells;
- a command and address (CA) interface coupled to the set of memory cells; and
- steering logic coupled to the set of memory cells, wherein the steering logic comprises:
  - the third data interface;
  - the fourth data interface; and
  - a set of multiplexers coupled between the third data interface, the fourth data interface, and the set of memory cells.

6. The memory package of claim 1, wherein the second data interface and the fourth data interface are coupled to a set of through-silicon-via (TSV) links in the stack.

7. The memory package of claim 1, wherein the first memory component and the second memory component are dynamic random access memory (DRAM) components.

8. The memory package of claim 1, wherein the fourth data interface is coupled to the second stack via wire bonding connections to another one of the at least two data interfaces.

9. The memory package of claim 1, wherein the fourth data interface is coupled to the second stack via a set of through-silicon-via (TSV) links between the first memory component and the second memory component and a fifth data interface of the first memory component that is coupled to another one of the at least two data interfaces.

10. The memory package of claim 1, wherein the first memory component comprises
- a set of memory cells organized into a first bank group and a second bank group, wherein the first data interface is configured to access at least one of the first bank group or the second bank group.

11. A method of operating a memory component of a stack of homogeneous memory components in a memory package, the method comprising:
- receiving, by steering logic of a first memory component, first data via a first data interface that is coupled to one of at least two data interfaces of the memory package; and
- sending, by the steering logic, the first data via a second data interface that is coupled to all other memory components of the stack;
- receiving, by steering logic of a second memory component, second data via a third data interface that is coupled to another one of the at least two data interfaces of the memory package; and
- sending, by the steering logic of the second memory component, the second data via a fourth data interface that is coupled to all other memory components of the stack.

12. The method of claim 11, wherein the first data is a first nibble further comprising:
- receiving, by the steering logic of the first memory component, third data via the second data interface; and
- sending, by the steering logic of the first memory component, the third data via the first data interface;
- receiving, by the steering logic of the second memory component, fourth data via the fourth data interface; and
- sending, by the steering logic of the second memory component, the fourth data via the third data interface.

13. A memory package comprising:
- a package substrate comprising at least two data interfaces; and
- a stack of memory components stacked on the package substrate, wherein the memory components of the stack are homogeneous, wherein:
- a first memory component of the stack comprises:
  - a first data interface that couples to one of the at least two data interfaces;
  - a second data interface that couples to another one of the at least two data interfaces;
  - a third data interface that couples to all other memory components of the stack; and
- a second memory component of the stack comprises a fourth data interface that couples to all other memory components of the stack.

14. The memory package of claim 13, wherein the first memory component further comprises:
- a set of memory cells;
- a command and address (CA) interface coupled to the set of memory cells; and
- steering logic coupled to the set of memory cells, wherein the steering logic comprises:
  - the first data interface;
  - the second data interface;
  - the third data interface; and
  - a set of multiplexers coupled between the first data interface, the second data interface, the third data interface, and the set of memory cells.

15. The memory package of claim 14, wherein the steering logic further comprises:
- a first receiver coupled to a first set of ports to couple to a first set of data lines arranged into a first nibble;
- a first transmitter coupled to the first set of ports;
- a second receiver coupled to a second set of ports to couple to a second set of data lines arranged into a second nibble;
- a second transmitter coupled to the second set of ports;
- a first multiplexer of the set of multiplexers, the first multiplexer comprising an output coupled to the first transmitter;
- a second multiplexer of the set of multiplexers, the second multiplexer comprising an output coupled to the second transmitter;
- a third multiplexer of the set of multiplexers;
- a fourth multiplexer of the set of multiplexers, the fourth multiplexer comprising an output coupled to an input of the first multiplexer and an input of the second multiplexer;
- a fifth multiplexer of the set of multiplexers, the fifth multiplexer comprising an output coupled to the set of memory cells; and
- a sixth multiplexer of the set of multiplexers, the sixth multiplexer comprising an output coupled to a set of through-silicon-via (TSV) links in the stack, wherein:
  - the first receiver is coupled to an input of the second multiplexer and is coupled to an input of the third multiplexer;
  - the second receiver is coupled to an input of the first multiplexer and is coupled to an input of the third multiplexer;
  - an output of the third multiplexer is coupled to an input of the fifth multiplexer and is coupled to an input of the sixth multiplexer;
  - the set of TSV links is coupled to an input of the fifth multiplexer and is coupled to an input of the fourth multiplexer; and
  - the set of memory cells is coupled to an input of the fourth multiplexer and is coupled to an input of the sixth multiplexer.

16. The memory package of claim 14, wherein the set of memory cells are organized as a plurality of bank groups.

17. The memory package of claim 13, wherein the third data interface and the fourth data interface are coupled to a set of through-silicon-via (TSV) links in the stack.

18. The memory package of claim 13, wherein the first memory component and the second memory component are dynamic random access memory (DRAM) components.

19. The memory package of claim 13, wherein the first memory component comprises
- a first set of memory cells organized into a first bank group and a second bank group, wherein the first data interface is configured to access at least one of the first bank group or the second bank group.

20. The memory package of claim 19, wherein the second memory component comprises
- a second set of memory cells organized into the first bank group and the second bank group, wherein the fourth data interface is configured to access at least one of the first bank group or the second bank group in the second set of memory cells.

\* \* \* \* \*